United States Patent
Kim et al.

(10) Patent No.: US 12,432,009 B2
(45) Date of Patent: Sep. 30, 2025

(54) METHOD AND APPARATUS FOR TRANSMITTING AND RECEIVING SIGNALS OF USER EQUIPMENT AND BASE STATION IN WIRELESS COMMUNICATION SYSTEM

(71) Applicant: LG ELECTRONICS INC., Seoul (KR)

(72) Inventors: Bonghoe Kim, Seoul (KR); Jongwoong Shin, Seoul (KR); Byoung Hoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 481 days.

(21) Appl. No.: 18/013,850

(22) PCT Filed: Jul. 1, 2020

(86) PCT No.: PCT/KR2020/008570
§ 371 (c)(1),
(2) Date: Dec. 29, 2022

(87) PCT Pub. No.: WO2022/004914
PCT Pub. Date: Jan. 6, 2022

(65) Prior Publication Data
US 2023/0179327 A1    Jun. 8, 2023

(51) Int. Cl.
*H04L 1/00* (2006.01)
*G06N 3/045* (2023.01)
*G06N 3/08* (2023.01)

(52) U.S. Cl.
CPC ........... *H04L 1/0033* (2013.01); *G06N 3/045* (2023.01); *G06N 3/08* (2013.01)

(58) Field of Classification Search
CPC ..... H04L 65/80; H04L 65/612; H04L 65/752; G06V 20/41; G06V 20/49
See application file for complete search history.

(56) References Cited

U.S. PATENT DOCUMENTS 10,979,176 B1 *   4/2021   Sudhakaran .......... H04L 1/0042
2009/0168913 A1   7/2009   Nakagiri
(Continued)

FOREIGN PATENT DOCUMENTS

JP    2018-147428 A    9/2018
KR   10-2004-0063899 A   7/2004
(Continued)

OTHER PUBLICATIONS

Lyu, "Performance Evaluation of Channel Decoding With Deep Neural Networks", arXiv:1711.00727v1, 2017.11, Mar. 3, 2021, <URL: https://arxiv.org/pdf/1711.00727v1.pdf>, See Sections 2-3.

*Primary Examiner* — Brian J. Gillis
*Assistant Examiner* — Thao D Duong
(74) *Attorney, Agent, or Firm* — BRYAN CAVE LEIGHTON PAISNER LLP

(57) ABSTRACT

A method of operating a user equipment (UE) and a base station in a wireless communication system and an apparatus supporting this are disclosed. The method of operating the UE may comprise encoding input data based on a neural network and transmitting the encoded input data to a base station. In this case, the neural network may be determined to be at least one of a real neural network or a complex neural network.

12 Claims, 34 Drawing Sheets

(56) References Cited

U.S. PATENT DOCUMENTS

| | | | | |
|---|---|---|---|---|
| 2014/0369444 A1* | 12/2014 | Park | ................ | H04L 27/06 |
| | | | | 375/302 |
| 2020/0234125 A1* | 7/2020 | Malach | ................ | G06N 3/08 |
| 2020/0244501 A1* | 7/2020 | Shattil | ................ | H04L 27/2627 |
| 2020/0304285 A1* | 9/2020 | Hess | ................ | G09C 1/00 |
| 2021/0111740 A1* | 4/2021 | Nammi | ................ | H03M 13/251 |
| 2021/0166128 A1* | 6/2021 | Daido | ................ | G06N 3/08 |

FOREIGN PATENT DOCUMENTS

| | | |
|---|---|---|
| KR | 10-2020-0062653 A | 6/2020 |
| KR | 10-2020-0067055 A | 6/2020 |

* cited by examiner (control plane)

(user plane)

(a)

(b)

METHOD AND APPARATUS FOR TRANSMITTING AND RECEIVING SIGNALS OF USER EQUIPMENT AND BASE STATION IN WIRELESS COMMUNICATION SYSTEM

CROSS-REFERENCE TO RELATED APPLICATIONS

This application is the National Stage filing under 35 U.S.C. 371 of International Application No. PCT/KR2020/008570, filed on Jul. 1, 2020, which is hereby incorporated by reference herein in its entirety

FIELD

The following description relates to a wireless communication system and, more particularly, to a method and apparatus for performing communication using a neural network in a wireless communication system.

In particular, it relates to a method and apparatus for performing communication using at least one of a real neural network or a complex neural network in a wireless communication system.

DESCRIPTION OF THE RELATED ART

Radio access systems have come into widespread in order to provide various types of communication services such as voice or data. In general, a radio access system is a multiple access system capable of supporting communication with multiple users by sharing available system resources (bandwidth, transmit power, etc.). Examples of the multiple access system include a code division multiple access (CDMA) system, a frequency division multiple access (FDMA) system, a time division multiple access (TDMA) system, a single carrier-frequency division multiple access (SC-FDMA) system, etc.

In particular, as many communication apparatuses require a large communication capacity, an enhanced mobile broadband (eMBB) communication technology has been proposed compared to radio access technology (RAT). In addition, not only massive machine type communications (MTC) for providing various services anytime anywhere by connecting a plurality of apparatuses and things but also communication systems considering services/user equipments (UEs) sensitive to reliability and latency have been proposed. To this end, various technical configurations have been proposed.

SUMMARY

The present disclosure may provide a method and apparatus for transmitting and receiving signals of a terminal and a base station in a wireless communication system.

The technical objects to be achieved in the present disclosure are not limited to the above-mentioned technical objects, and other technical objects that are not mentioned may be considered by those skilled in the art through the embodiments described below.

The present disclosure a method of operating a user equipment (UE) and base station in a wireless communication system, the method comprising: encoding input data based on a neural network; and transmitting the encoded input data to a base station, wherein the neural network is determined to be at least one of a real neural network or a complex neural network.

The present disclosure a user equipment (UE) operating in a wireless communication system, the UE comprising: at least one transmitter, at least one receiver, at least one processor, and at least one memory operably connected to the at least one processor and configured to store instructions which, when executed, cause the at least one processor to perform a specific operation, wherein the specific operation comprises: encoding input data based on a neural network, and transmitting the encoded input data to a base station, and wherein the neural network is determined to be at least one of a real neural network or a complex neural network.

The present disclosure the UE communicates with at least one of a mobile terminal, a network or an autonomous vehicle other than a vehicle including the UE.

The present disclosure a base station operating in a wireless communication system, the base station comprising: at least one transmitter, at least one receiver, at least one processor, and at least one memory operably connected to the at least one processor and configured to store instructions which, when executed, cause the at least one processor to perform a specific operation, wherein the specific operation comprises: receiving encoded input data from a user equipment (UE), and decoding the received input data based on a neural network, and wherein the neural network is determined to be at least one of a real neural network or a complex neural network.

In addition, the following items may be commonly applied to a terminal and a base station operating in a wireless communication system.

The present disclosure the neural network comprises a neural encoder and encoding of the input data is performed through the neural encoder.

The present disclosure comprising the UE determining an input value of the neural encoder composed of a real value in the real neural network, wherein the input data is grouped based on input bits and mapped to a plurality of input levels based on the real value, and wherein the plurality of mapped input levels is determined as the input value of the neural encoder.

The present disclosure input levels adjacent to each other among the plurality of input levels have a uniform spacing.

The present disclosure input levels adjacent to each other among the plurality of input levels have a non-uniform spacing.

The present disclosure comprising the UE determining an input value of the neural encoder in the complex neural network, wherein the complex neural network comprises a first real neural network and a second real neural network.

The present disclosure the input data is divided into a real part and an imaginary part, wherein the real part of the input data is grouped based on input bits of the real part and mapped to a plurality of input levels based on a real value, wherein the plurality of mapped input levels is determined as an input value of a neural encoder of the first real neural network, wherein the imaginary part of the input data is grouped based on input bits of the imaginary part and mapped to a plurality of input levels based on a real value, and wherein the plurality of mapped input levels is determined as an input value of a neural encoder of the second real neural network.

The present disclosure comprising the UE determining an input value of the neural encoder in the complex neural network, wherein the input value of the neural encoder is determined to be a complex value.

The present disclosure encoding of the input data is performed based on a real value through the neural network, wherein two symbols in the encoded input data are mapped to one complex symbol, wherein one of the two symbol is mapped to a real part, and wherein the other one of the two symbol is mapped to an imaginary part.

The present disclosure an odd-numbered symbol of the encoded input data is mapped to the real part, and wherein an even-numbered symbol of the encoded input data is mapped to the imaginary part.

The present disclosure the neural encoder is composed of a plurality of filter layers, wherein the plurality of filter layers is divided into a plurality of groups, and wherein an input value of the neural encoder is uniformly divided into the plurality of groups and input.

The above-described aspects of the present disclosure are only some of the preferred embodiments of the present disclosure, and various embodiments in which the technical features of the present disclosure are reflected are the detailed descriptions of the present disclosure to be detailed below by those of ordinary skill in the art. It can be derived and understood based on the description.

The following effects may be obtained by embodiments based on the present disclosure.

According to the present disclosure, a terminal (user equipment; UE) may perform encoding through a neural network.

According to the present disclosure, a terminal may determine input for performing encoding through a real neural network.

According to the present disclosure, it is possible to provide a method of, by a terminal, grouping input data to provide input of a neural encoder.

According to the present disclosure, it is possible to provide a method of, by a terminal, performing encoding through a complex neural network.

According to the present disclosure, it is possible to provide a method of, by a terminal, performing encoding through a complex neural network in which a real part and an imaginary part are independently processed.

According to the present disclosure, it is possible to provide a method of, by a terminal, mapping input to a complex value and processing it in a complex neural network.

Effects obtained in the present disclosure are not limited to the above-mentioned effects, and other effects not mentioned above may be clearly derived and understood by those skilled in the art, to which a technical configuration of the present disclosure is applied, from the following description of embodiments of the present disclosure. That is, effects, which are not intended when implementing a configuration described in the present disclosure, may also be derived by those skilled in the art from the embodiments of the present disclosure.

BRIEF DESCRIPTION OF THE DRAWINGS

The accompanying drawings are provided to help understanding of the present disclosure, and may provide embodiments of the present disclosure together with a detailed description. However, the technical features of the present disclosure are not limited to specific drawings, and the features disclosed in each drawing may be combined with each other to constitute a new embodiment. Reference numerals in each drawing may refer to structural elements.

DETAILED DESCRIPTION

Figure 1:
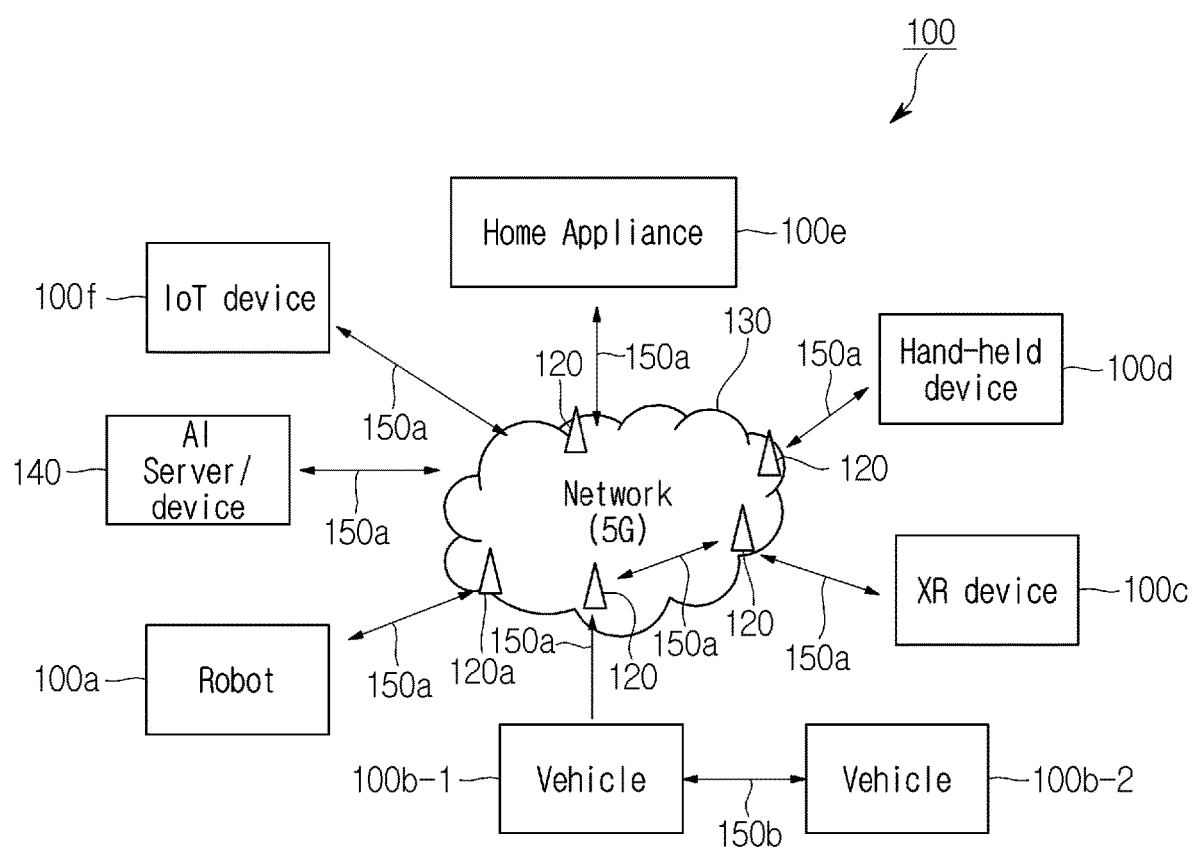
FIG. 1 is a view showing an example of a communication system applicable to the present disclosure.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the drawings, procedures or steps which render the scope of the present disclosure unnecessarily ambiguous will be omitted and procedures or steps which can be understood by those skilled in the art will be omitted.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present disclosure, a description is mainly made of a data transmission and reception relationship between a base station (BS) and a mobile station. A BS refers to a terminal node of a network, which directly communicates with a mobile station. A specific operation described as being performed by the BS may be performed by an upper node of the BS.

Namely, it is apparent that, in a network comprised of a plurality of network nodes including a BS, various operations performed for communication with a mobile station may be performed by the BS, or network nodes other than the BS. The term "BS" may be replaced with a fixed station, a Node B, an evolved Node B (eNode B or eNB), an advanced base station (ABS), an access point, etc.

In the embodiments of the present disclosure, the term terminal may be replaced with a UE, a mobile station (MS), a subscriber station (SS), a mobile subscriber station (MSS), a mobile terminal, an advanced mobile station (AMS), etc.

A transmitter is a fixed and/or mobile node that provides a data service or a voice service and a receiver is a fixed and/or mobile node that receives a data service or a voice service. Therefore, a mobile station may serve as a transmitter and a BS may serve as a receiver, on an uplink (UL). Likewise, the mobile station may serve as a receiver and the BS may serve as a transmitter, on a downlink (DL).

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, 3GPP 5th generation (5G) new radio (NR) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331.

In addition, the embodiments of the present disclosure are applicable to other radio access systems and are not limited to the above-described system. For example, the embodiments of the present disclosure are applicable to systems applied after a 3GPP 5G NR system and are not limited to a specific system.

That is, steps or parts that are not described to clarify the technical features of the present disclosure may be supported by those documents. Further, all terms as set forth herein may be explained by the standard documents.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the disclosure.

The following detailed description includes specific terms in order to provide a thorough understanding of the present disclosure. However, it will be apparent to those skilled in the art that the specific terms may be replaced with other terms without departing the technical spirit and scope of the present disclosure.

The embodiments of the present disclosure can be applied to various radio access systems such as code division multiple access (CDMA), frequency division multiple access (FDMA), time division multiple access (TDMA), orthogonal frequency division multiple access (OFDMA), single carrier frequency division multiple access (SC-FDMA), etc.

Hereinafter, in order to clarify the following description, a description is made based on a 3GPP communication system (e.g., LTE, NR, etc.), but the technical spirit of the present disclosure is not limited thereto. LTE may refer to technology after 3GPP TS 36.xxx Release 8. In detail, LTE technology after 3GPP TS 36.xxx Release 10 may be referred to as LTE-A, and LTE technology after 3GPP TS 36.xxx Release 13 may be referred to as LTE-A pro. 3GPP NR may refer to technology after TS 38.xxx Release 15. 3GPP 6G may refer to technology TS Release 17 and/or Release 18. "xxx" may refer to a detailed number of a standard document. LTE/NR/6G may be collectively referred to as a 3GPP system.

For background arts, terms, abbreviations, etc. used in the present disclosure, refer to matters described in the standard documents published prior to the present disclosure. For example, reference may be made to the standard documents 36.xxx and 38.xxx.

Communication System Applicable to the Present Disclosure

Without being limited thereto, various descriptions, functions, procedures, proposals, methods and/or operational flowcharts of the present disclosure disclosed herein are applicable to various fields requiring wireless communication/connection (e.g., 5G).

Hereinafter, a more detailed description will be given with reference to the drawings. In the following drawings/description, the same reference numerals may exemplify the same or corresponding hardware blocks, software blocks or functional blocks unless indicated otherwise.

FIG. 1 is a view showing an example of a communication system applicable to the present disclosure. Referring to FIG. 1, the communication system 100 applicable to the present disclosure includes a wireless device, a base station and a network. The wireless device refers to a device for performing communication using radio access technology (e.g., 5G NR or LTE) and may be referred to as a communication/wireless/5G device. Without being limited thereto, the wireless device may include a robot 100a, vehicles 100b-1 and 100b-2, an extended reality (XR) device 100c, a hand-held device 100d, a home appliance 100e, an Internet of Thing (IoT) device 100f, and an artificial intelligence (AI) device/server 100g. For example, the vehicles may include a vehicle having a wireless communication function, an autonomous vehicle, a vehicle capable of performing vehicle-to-vehicle communication, etc. The vehicles 100b-1 and 100b-2 may include an unmanned aerial vehicle (UAV) (e.g., a drone). The XR device 100c includes an augmented reality (AR)/virtual reality (VR)/mixed reality (MR) device and may be implemented in the form of a head-mounted device (HMD), a head-up display (HUD) provided in a vehicle, a television, a smartphone, a computer, a wearable device, a home appliance, a digital signage, a vehicle or a robot. The hand-held device 100d may include a smartphone, a smart pad, a wearable device (e.g., a smart watch or smart glasses), a computer (e.g., a laptop), etc. The home appliance 100e may include a TV, a refrigerator, a washing machine, etc. The IoT device 100f may include a sensor, a smart meter, etc. For example, the base station 120 and the network 130 may be implemented by a wireless device, and a specific wireless device 120a may operate as a base station/network node for another wireless device.

The wireless devices 100a to 100f may be connected to the network 130 through the base station 120. AI technology is applicable to the wireless devices 100a to 100f, and the wireless devices 100a to 100f may be connected to the AI server 100g through the network 130. The network 130 may be configured using a 3G network, a 4G (e.g., LTE) network or a 5G (e.g., NR) network, etc. The wireless devices 100a to 100f may communicate with each other through the base station 120/the network 130 or perform direct communication (e.g., sidelink communication) without through the base station 120/the network 130. For example, the vehicles 100b-1 and 100b-2 may perform direct communication (e.g., vehicle to vehicle (V2V)/vehicle to everything (V2X) communication). In addition, the IoT device 100f (e.g., a sensor) may perform direct communication with another IoT device (e.g., a sensor) or the other wireless devices 100a to 100f.

Wireless communications/connections 150a, 150b and 150c may be established between the wireless devices 100a to 100f/the base station 120 and the base station 120/the base station 120. Here, wireless communication/connection may be established through various radio access technologies (e.g., 5G NR) such as uplink/downlink communication 150a, sidelink communication 150b (or D2D communication) or communication 150c between base stations (e.g., relay, integrated access backhaul (IAB). The wireless device and the base station/wireless device or the base station and the base station may transmit/receive radio signals to/from each other through wireless communication/connection 150a, 150b and 150c. For example, wireless communication/connection 150a, 150b and 150c may enable signal transmission/reception through various physical channels. To this end, based on the various proposals of the present disclosure, at least some of various configuration information setting processes for transmission/reception of radio signals, various signal processing procedures (e.g., channel encoding/decoding, modulation/demodulation, resource mapping/demapping, etc.), resource allocation processes, etc. may be performed.

Communication System Applicable to the Present Disclosure

Figure 2:
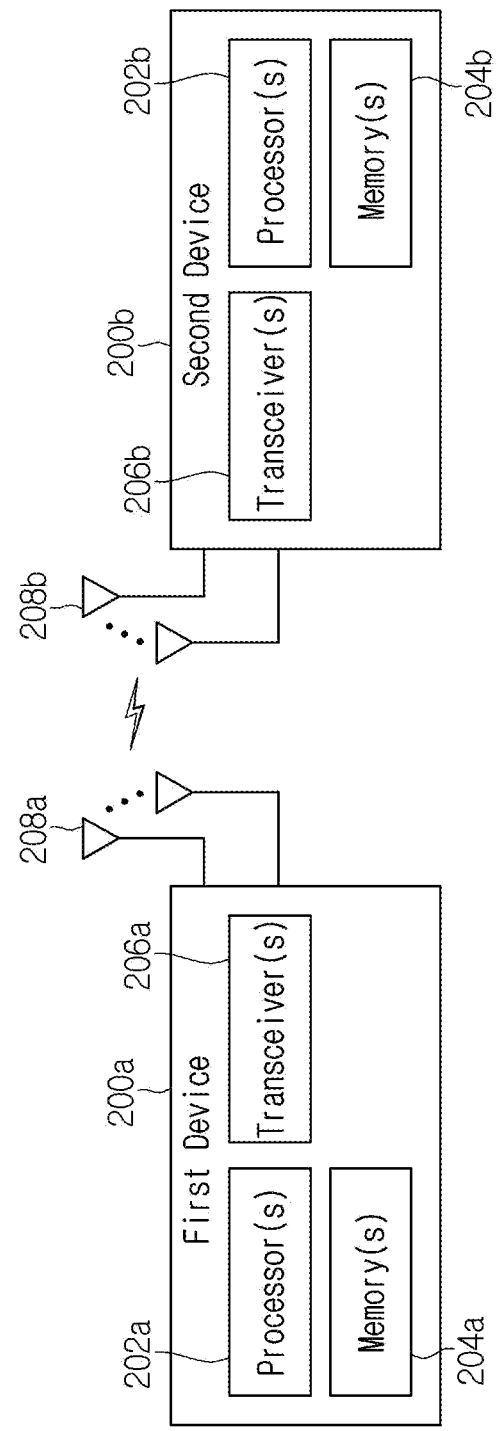
FIG. 2 is a view showing an example of a wireless apparatus applicable to the present disclosure.

FIG. 2 is a view showing an example of a wireless device applicable to the present disclosure.

Referring to FIG. 2, a first wireless device 200a and a second wireless device 200b may transmit and receive radio signals through various radio access technologies (e.g., LTE or NR). Here, {the first wireless device 200a, the second wireless device 200b} may correspond to {the wireless device 100x, the base station 120} and/or {the wireless device 100x, the wireless device 100x} of FIG. 1.

The first wireless device 200a may include one or more processors 202a and one or more memories 204a and may further include one or more transceivers 206a and/or one or more antennas 208a. The processor 202a may be configured to control the memory 204a and/or the transceiver 206a and to implement descriptions, functions, procedures, proposals, methods and/or operational flowcharts disclosed herein. For example, the processor 202a may process information in the memory 204a to generate first information/signal and then transmit a radio signal including the first information/signal through the transceiver 206a. In addition, the processor 202a may receive a radio signal including second information/signal through the transceiver 206a and then store information obtained from signal processing of the second information/signal in the memory 204a. The memory 204a may be coupled with the processor 202a, and store a variety of information related to operation of the processor 202a. For example, the memory 204a may store software code including instructions for performing all or some of the processes controlled by the processor 202a or performing the descriptions, functions, procedures, proposals, methods and/or operational flowcharts disclosed herein. Here, the processor 202a and the memory 204a may be part of a communication modem/circuit/chip designed to implement wireless communication technology (e.g., LTE or NR). The transceiver 206a may be coupled with the processor 202a to transmit and/or receive radio signals through one or more antennas 208a. The transceiver 206a may include a transmitter and/or a receiver. The transceiver 206a may be used interchangeably with a radio frequency (RF) unit. In the present disclosure, the wireless device may refer to a communication modem/circuit/chip.

The second wireless device 200b may include one or more processors 202b and one or more memories 204b and may further include one or more transceivers 206b and/or one or more antennas 208b. The processor 202b may be configured to control the memory 204b and/or the transceiver 206b and to implement the descriptions, functions, procedures, proposals, methods and/or operational flowcharts disclosed herein. For example, the processor 202b may process information in the memory 204b to generate third information/signal and then transmit the third information/signal through the transceiver 206b. In addition, the processor 202b may receive a radio signal including fourth information/signal through the transceiver 206b and then store information obtained from signal processing of the fourth information/signal in the memory 204b. The memory 204b may be coupled with the processor 202b to store a variety of information related to operation of the processor 202b. For example, the memory 204b may store software code including instructions for performing all or some of the processes controlled by the processor 202b or performing the descriptions, functions, procedures, proposals, methods and/or operational flowcharts disclosed herein. Herein, the processor 202b and the memory 204b may be part of a communication modem/circuit/chip designed to implement wireless communication technology (e.g., LTE or NR). The transceiver 206b may be coupled with the processor 202b to transmit and/or receive radio signals through one or more antennas 208b. The transceiver 206b may include a transmitter and/or a receiver. The transceiver 206b may be used interchangeably with a radio frequency (RF) unit. In the present disclosure, the wireless device may refer to a communication modem/circuit/chip.

Hereinafter, hardware elements of the wireless devices 200a and 200b will be described in greater detail. Without being limited thereto, one or more protocol layers may be implemented by one or more processors 202a and 202b. For example, one or more processors 202a and 202b may implement one or more layers (e.g., functional layers such as PHY (physical), MAC (media access control), RLC (radio link control), PDCP (packet data convergence protocol), RRC (radio resource control), SDAP (service data adaptation protocol)). One or more processors 202a and 202b may generate one or more protocol data units (PDUs) and/or one or more service data unit (SDU) according to the descriptions, functions, procedures, proposals, methods and/or operational flowcharts disclosed herein. One or more processors 202a and 202b may generate messages, control information, data or information according to the descriptions, functions, procedures, proposals, methods and/or operational flowcharts disclosed herein. One or more processors 202a and 202b may generate PDUs, SDUs, messages, control information, data or information according to the functions, procedures, proposals and/or methods disclosed herein and provide the PDUs, SDUs, messages, control information, data or information to one or more transceivers 206a and 206b. One or more processors 202a and 202b may receive signals (e.g., baseband signals) from one or more transceivers 206a and 206b and acquire PDUs, SDUs, messages, control information, data or information according to the descriptions, functions, procedures, proposals, methods and/or operational flowcharts disclosed herein.

One or more processors 202a and 202b may be referred to as controllers, microcontrollers, microprocessors or microcomputers. One or more processors 202a and 202b may be implemented by hardware, firmware, software or a combination thereof. For example, one or more application specific integrated circuits (ASICs), one or more digital signal processors (DSPs), one or more digital signal processing devices (DSPDs), programmable logic devices (PLDs) or one or more field programmable gate arrays (FPGAs) may be included in one or more processors 202a and 202b. The descriptions, functions, procedures, proposals, methods and/or operational flowcharts disclosed herein may be implemented using firmware or software, and firmware or software may be implemented to include modules, procedures, functions, etc. Firmware or software configured to perform the descriptions, functions, procedures, proposals, methods and/or operational flowcharts disclosed herein may be included in one or more processors 202a and 202b or stored in one or more memories 204a and 204b to be driven by one or more processors 202a and 202b. The descriptions, functions, procedures, proposals, methods and/or operational flowcharts disclosed herein implemented using firmware or software in the form of code, a command and/or a set of commands.

One or more memories 204a and 204b may be coupled with one or more processors 202a and 202b to store various types of data, signals, messages, information, programs, code, instructions and/or commands One or more memories 204a and 204b may be composed of read only memories (ROMs), random access memories (RAMs), erasable programmable read only memories (EPROMs), flash memories, hard drives, registers, cache memories, computer-readable storage mediums and/or combinations thereof. One or more memories 204a and 204b may be located inside and/or outside one or more processors 202a and 202b. In addition, one or more memories 204a and 204b may be coupled with one or more processors 202a and 202b through various technologies such as wired or wireless connection.

One or more transceivers 206a and 206b may transmit user data, control information, radio signals/channels, etc. described in the methods and/or operational flowcharts of the present disclosure to one or more other apparatuses. One or more transceivers 206a and 206b may receive user data, control information, radio signals/channels, etc. described in the methods and/or operational flowcharts of the present disclosure from one or more other apparatuses. For example, one or more transceivers 206a and 206b may be coupled with one or more processors 202a and 202b to transmit/receive radio signals. For example, one or more processors 202a and 202b may perform control such that one or more transceivers 206a and 206b transmit user data, control information or radio signals to one or more other apparatuses. In addition, one or more processors 202a and 202b may perform control such that one or more transceivers 206a and 206b receive user data, control information or radio signals from one or more other apparatuses. In addition, one or more transceivers 206a and 206b may be coupled with one or more antennas 208a and 208b, and one or more transceivers 206a and 206b may be configured to transmit/receive user data, control information, radio signals/channels, etc. described in the descriptions, functions, procedures, proposals, methods and/or operational flowcharts disclosed herein through one or more antennas 208a and 208b. In the present disclosure, one or more antennas may be a plurality of physical antennas or a plurality of logical antennas (e.g., antenna ports). One or more transceivers 206a and 206b may convert the received radio signals/channels, etc. from RF band signals to baseband signals, in order to process the received user data, control information, radio signals/channels, etc. using one or more processors 202a and 202b. One or more transceivers 206a and 206b may convert the user data, control information, radio signals/channels processed using one or more processors 202a and 202b from baseband signals into RF band signals. To this end, one or more transceivers 206a and 206b may include (analog) oscillator and/or filters.

Structure of Wireless Device Applicable to the Present Disclosure

Figure 3:
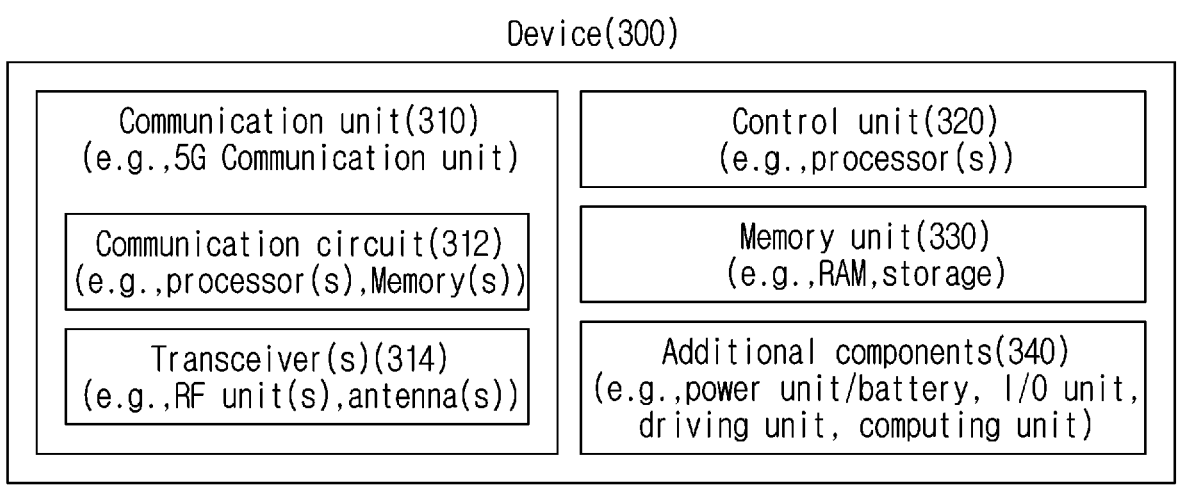
FIG. 3 is a view showing another example of a wireless device applicable to the present disclosure.

FIG. 3 is a view showing another example of a wireless device applicable to the present disclosure.

Referring to FIG. 3, a wireless device 300 may correspond to the wireless devices 200a and 200b of FIG. 2 and include various elements, components, units/portions and/or modules. For example, the wireless device 300 may include a communication unit 310, a control unit (controller) 320, a memory unit (memory) 330 and additional components 340. The communication unit may include a communication circuit 312 and a transceiver(s) 314. For example, the communication circuit 312 may include one or more processors 202a and 202b and/or one or more memories 204a and 204b of FIG. 2. For example, the transceiver(s) 314 may include one or more transceivers 206a and 206b and/or one or more antennas 208a and 208b of FIG. 2. The control unit 320 may be electrically coupled with the communication unit 310, the memory unit 330 and the additional components 340 to control overall operation of the wireless device. For example, the control unit 320 may control electrical/mechanical operation of the wireless device based on a program/code/instruction/information stored in the memory unit 330. In addition, the control unit 320 may transmit the information stored in the memory unit 330 to the outside (e.g., another communication device) through the wireless/wired interface using the communication unit 310 over a wireless/wired interface or store information received from the outside (e.g., another communication device) through the wireless/wired interface using the communication unit 310 in the memory unit 330.

The additional components 340 may be variously configured according to the types of the wireless devices. For example, the additional components 340 may include at least one of a power unit/battery, an input/output unit, a driving unit or a computing unit. Without being limited thereto, the wireless device 300 may be implemented in the form of the robot (FIG. 1, 100a), the vehicles (FIGS. 1, 100b-1 and 100b-2), the XR device (FIG. 1, 100c), the hand-held device (FIG. 1, 100d), the home appliance (FIG. 1, 100e), the IoT device (FIG. 1, 100f), a digital broadcast terminal, a hologram apparatus, a public safety apparatus, an MTC apparatus, a medical apparatus, a Fintech device (financial device), a security device, a climate/environment device, an AI server/device (FIG. 1, 140), the base station (FIG. 1, 120), a network node, etc. The wireless device may be movable or may be used at a fixed place according to use example/service.

In FIG. 3, various elements, components, units/portions and/or modules in the wireless device 300 may be coupled with each other through wired interfaces or at least some thereof may be wirelessly coupled through the communication unit 310. For example, in the wireless device 300, the control unit 320 and the communication unit 310 may be coupled by wire, and the control unit 320 and the first unit (e.g., 130 or 140) may be wirelessly coupled through the communication unit 310. In addition, each element, component, unit/portion and/or module of the wireless device 300 may further include one or more elements. For example, the control unit 320 may be composed of a set of one or more processors. For example, the control unit 320 may be composed of a set of a communication control processor, an application processor, an electronic control unit (ECU), a graphic processing processor, a memory control processor, etc. In another example, the memory unit 330 may be composed of a random access memory (RAM), a dynamic RAM (DRAM), a read only memory (ROM), a flash memory, a volatile memory, a non-volatile memory and/or a combination thereof.

Hand-Held Device Applicable to the Present Disclosure

Figure 4:
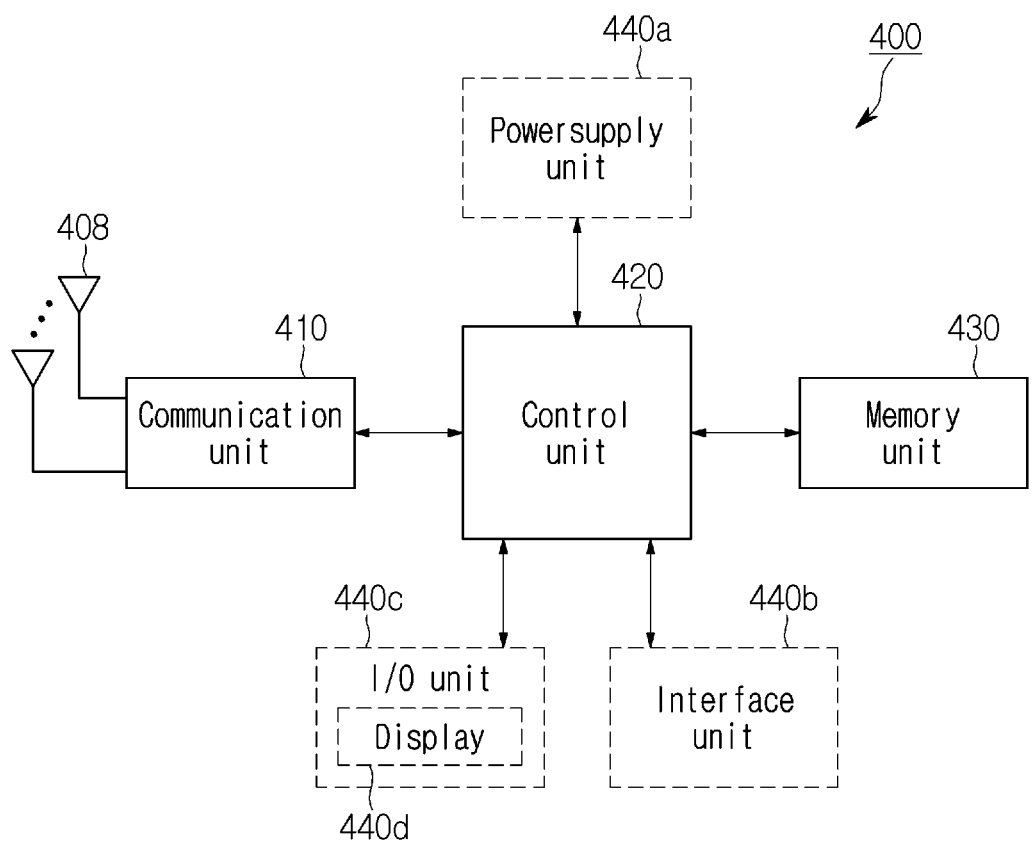
FIG. 4 is a view showing an example of a hand-held device applicable to the present disclosure.

FIG. 4 is a view showing an example of a hand-held device applicable to the present disclosure.

FIG. 4 shows a hand-held device applicable to the present disclosure. The hand-held device may include a smartphone, a smart pad, a wearable device (e.g., a smart watch or smart glasses), and a hand-held computer (e.g., a laptop, etc.). The hand-held device may be referred to as a mobile station (MS), a user terminal (UT), a mobile subscriber station (MSS), a subscriber station (SS), an advanced mobile station (AMS) or a wireless terminal (WT).

Referring to FIG. 4, the hand-held device 400 may include an antenna unit (antenna) 408, a communication unit (transceiver) 410, a control unit (controller) 420, a memory unit (memory) 430, a power supply unit (power supply) 440a, an interface unit (interface) 440b, and an input/output unit 440c. An antenna unit (antenna) 408 may be part of the communication unit 410. The blocks 410 to 430/440a to 440c may correspond to the blocks 310 to 330/340 of FIG. 3, respectively.

The communication unit 410 may transmit and receive signals (e.g., data, control signals, etc.) to and from other wireless devices or base stations. The control unit 420 may control the components of the hand-held device 400 to perform various operations. The control unit 420 may include an application processor (AP). The memory unit 430 may store data/parameters/program/code/instructions necessary to drive the hand-held device 400. In addition, the memory unit 430 may store input/output data/information, etc. The power supply unit 440a may supply power to the hand-held device 400 and include a wired/wireless charging circuit, a battery, etc. The interface unit 440b may support connection between the hand-held device 400 and another external device. The interface unit 440b may include various ports (e.g., an audio input/output port and a video input/output port) for connection with the external device. The input/output unit 440c may receive or output video information/signals, audio information/signals, data and/or user input information. The input/output unit 440c may include a camera, a microphone, a user input unit, a display 440d, a speaker and/or a haptic module.

For example, in case of data communication, the input/output unit 440c may acquire user input information/signal (e.g., touch, text, voice, image or video) from the user and store the user input information/signal in the memory unit 430. The communication unit 410 may convert the information/signal stored in the memory into a radio signal and transmit the converted radio signal to another wireless device directly or transmit the converted radio signal to a base station. In addition, the communication unit 410 may receive a radio signal from another wireless device or the base station and then restore the received radio signal into original information/signal. The restored information/signal may be stored in the memory unit 430 and then output through the input/output unit 440c in various forms (e.g., text, voice, image, video and haptic).

Type of Wireless Device Applicable to the Present Disclosure

Figure 5:
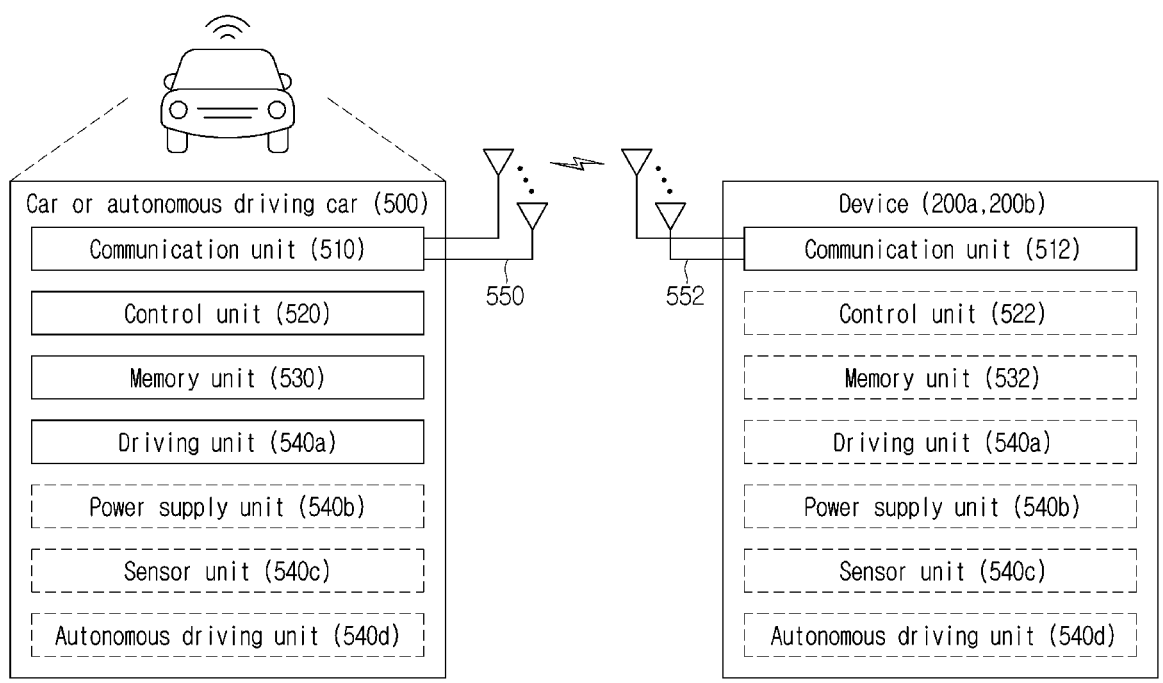
FIG. 5 is a view showing an example of a car or an autonomous driving car applicable to the present disclosure.

FIG. 5 is a view showing an example of a car or an autonomous driving car applicable to the present disclosure.

FIG. 5 shows a car or an autonomous driving vehicle applicable to the present disclosure. The car or the autonomous driving car may be implemented as a mobile robot, a vehicle, a train, a manned/unmanned aerial vehicle (AV), a ship, etc. and the type of the car is not limited.

Referring to FIG. 5, the car or autonomous driving car 500 may include an antenna unit (antenna) 508, a communication unit (transceiver) 510, a control unit (controller) 520, a driving unit 540a, a power supply unit (power supply) 540b, a sensor unit 540c, and an autonomous driving unit 540d. The antenna unit 550 may be configured as part of the communication unit 510. The blocks 510/530/540a to 540d correspond to the blocks 410/430/440 of FIG. 4.

The communication unit 510 may transmit and receive signals (e.g., data, control signals, etc.) to and from external devices such as another vehicle, a base station (e.g., a base station, a road side unit, etc.), and a server. The control unit 520 may control the elements of the car or autonomous driving car 500 to perform various operations. The control unit 520 may include an electronic control unit (ECU). The driving unit 540a may drive the car or autonomous driving car 500 on the ground. The driving unit 540a may include an engine, a motor, a power train, wheels, a brake, a steering device, etc. The power supply unit 540b may supply power to the car or autonomous driving car 500, and include a wired/wireless charging circuit, a battery, etc. The sensor unit 540c may obtain a vehicle state, surrounding environment information, user information, etc. The sensor unit 540c may include an inertial navigation unit (IMU) sensor, a collision sensor, a wheel sensor, a speed sensor, an inclination sensor, a weight sensor, a heading sensor, a position module, a vehicle forward/reverse sensor, a battery sensor, a fuel sensor, a tire sensor, a steering sensor, a temperature sensor, a humidity sensor, an ultrasonic sensor, an illumination sensor, a brake pedal position sensor, and so on. The autonomous driving sensor 540d may implement technology for maintaining a driving lane, technology for automatically controlling a speed such as adaptive cruise control, technology for automatically driving the car along a predetermined route, technology for automatically setting a route when a destination is set and driving the car, etc.

For example, the communication unit 510 may receive map data, traffic information data, etc. from an external server. The autonomous driving unit 540d may generate an autonomous driving route and a driving plan based on the acquired data. The control unit 520 may control the driving unit 540a (e.g., speed/direction control) such that the car or autonomous driving car 500 moves along the autonomous driving route according to the driving plane. During autonomous driving, the communication unit 510 may aperiodically/periodically acquire latest traffic information data from an external server and acquire surrounding traffic information data from neighboring cars. In addition, during autonomous driving, the sensor unit 540c may acquire a vehicle state and surrounding environment information. The autonomous driving unit 540d may update the autonomous driving route and the driving plan based on newly acquired data/information. The communication unit 510 may transmit information such as a vehicle location, an autonomous driving route, a driving plan, etc. to the external server. The external server may predict traffic information data using AI technology or the like based on the information collected from the cars or autonomous driving cars and provide the predicted traffic information data to the cars or autonomous driving cars.

Figure 6:
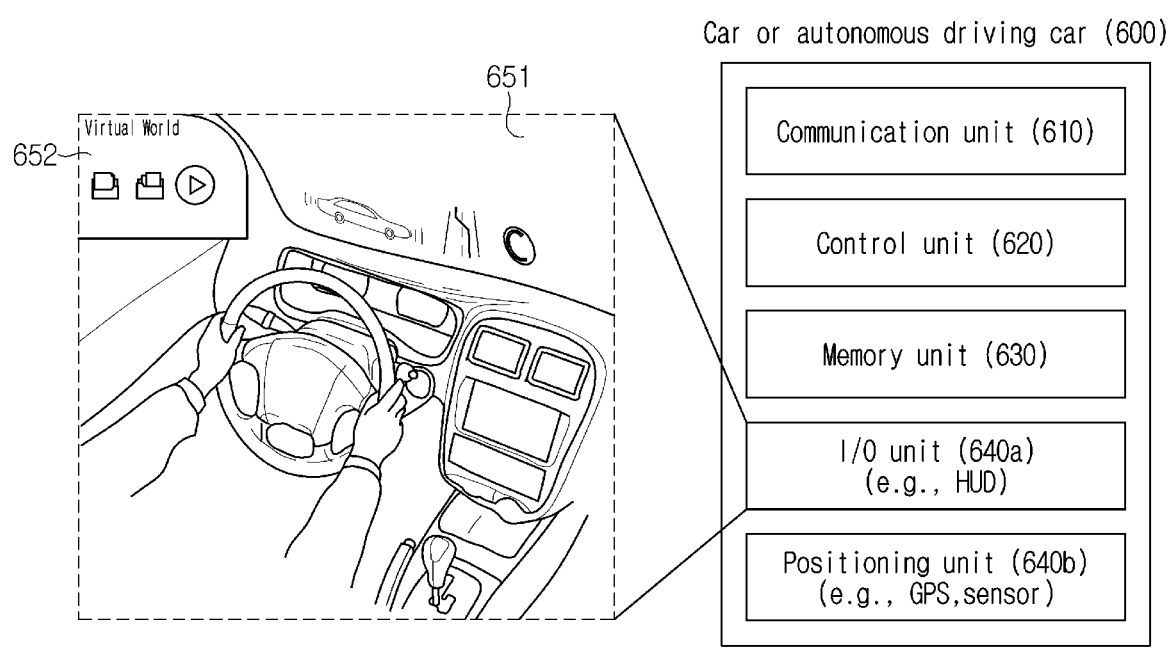
FIG. 6 is a view showing an example of a mobility applicable to the present disclosure.

FIG. 6 is a view showing an example of a mobility applicable to the present disclosure.

Referring to FIG. 6, the mobility applied to the present disclosure may be implemented as at least one of a transportation means, a train, an aerial vehicle or a ship. In addition, the mobility applied to the present disclosure may be implemented in the other forms and is not limited to the above-described embodiments.

At this time, referring to FIG. 6, the mobility 600 may include a communication unit (transceiver) 610, a control unit (controller) 620, a memory unit (memory) 630, an input/output unit 640a and a positioning unit 640b. Here, the blocks 610 to 630/640a to 640b may corresponding to the blocks 310 to 330/340 of FIG. 3.

The communication unit 610 may transmit and receive signals (e.g., data, control signals, etc.) to and from external devices such as another mobility or a base station. The control unit 620 may control the components of the mobility 600 to perform various operations. The memory unit 630 may store data/parameters/programs/code/instructions supporting the various functions of the mobility 600. The input/output unit 640a may output AR/VR objects based on information in the memory unit 630. The input/output unit 640a may include a HUD. The positioning unit 640b may acquire the position information of the mobility 600. The position information may include absolute position information of the mobility 600, position information in a driving line, acceleration information, position information of neighboring vehicles, etc. The positioning unit 640b may include a global positioning system (GPS) and various sensors.

For example, the communication unit 610 of the mobility 600 may receive map information, traffic information, etc. from an external server and store the map information, the traffic information, etc. in the memory unit 630. The positioning unit 640b may acquire mobility position information through the GPS and the various sensors and store the mobility position information in the memory unit 630. The control unit 620 may generate a virtual object based on the map information, the traffic information, the mobility position information, etc., and the input/output unit 640a may display the generated virtual object in a glass window (651 and 652). In addition, the control unit 620 may determine whether the mobility 600 is normally driven in the driving line based on the mobility position information. When the mobility 600 abnormally deviates from the driving line, the control unit 620 may display a warning on the glass window of the mobility through the input/output unit 640a. In addition, the control unit 620 may broadcast a warning message for driving abnormality to neighboring mobilities through the communication unit 610. Depending on situations, the control unit 620 may transmit the position information of the mobility and information on driving/mobility abnormality to a related institution through the communication unit 610.

Figure 7:
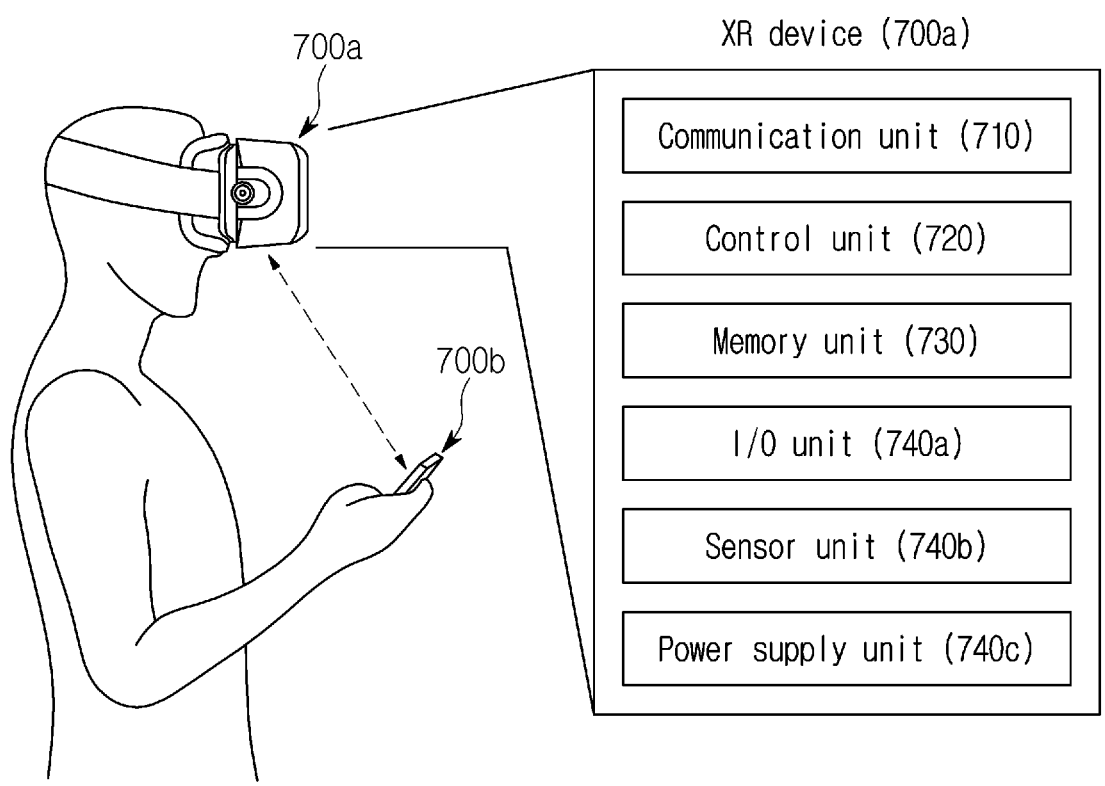
FIG. 7 is a view showing an example of an extended reality (XR) device applicable to the present disclosure.

FIG. 7 is a view showing an example of an XR device applicable to the present disclosure. The XR device may be implemented as a HMD, a head-up display (HUD) provided in a vehicle, a television, a smartphone, a computer, a wearable device, a home appliance, a digital signage, a vehicle, a robot, etc.

Referring to FIG. 7, the XR device 700a may include a communication unit (transceiver) 710, a control unit (controller) 720, a memory unit (memory) 730, an input/output unit 740a, a sensor unit 740b and a power supply unit (power supply) 740c. Here, the blocks 710 to 730/740a to 740c may correspond to the blocks 310 to 330/340 of FIG. 3, respectively.

The communication unit 710 may transmit and receive signals (e.g., media data, control signals, etc.) to and from external devices such as another wireless device, a handheld device or a media server. The media data may include video, image, sound, etc. The control unit 720 may control the components of the XR device 700a to perform various operations. For example, the control unit 720 may be configured to control and/or perform procedures such as video/image acquisition, (video/image) encoding, metadata generation and processing. The memory unit 730 may store data/parameters/programs/code/instructions necessary to drive the XR device 700a or generate an XR object.

The input/output unit 740a may acquire control information, data, etc. from the outside and output the generated XR object. The input/output unit 740a may include a camera, a microphone, a user input unit, a display, a speaker and/or a haptic module. The sensor unit 740b may obtain an XR device state, surrounding environment information, user information, etc. The sensor unit 740b may include a proximity sensor, an illumination sensor, an acceleration sensor, a magnetic sensor, a gyro sensor, an inertia sensor, a red green blue (RGB) sensor, an infrared (IR) sensor, a finger scan sensor, an ultrasonic sensor, an optical sensor, a microphone and/or a radar. The power supply unit 740c may supply power to the XR device 700a and include a wired/wireless charging circuit, a battery, etc.

For example, the memory unit 730 of the XR device 700a may include information (e.g., data, etc.) necessary to generate an XR object (e.g., AR/VR/MR object). The input/output unit 740a may acquire an instruction for manipulating the XR device 700a from a user, and the control unit 720 may drive the XR device 700a according to the driving instruction of the user. For example, when the user wants to watch a movie, news, etc. through the XR device 700a, the control unit 720 may transmit content request information to another device (e.g., a hand-held device 700b) or a media server through the communication unit 730. The communication unit 730 may download/stream content such as a movie or news from another device (e.g., the hand-held device 700b) or the media server to the memory unit 730. The control unit 720 may control and/or perform procedures such as video/image acquisition, (video/image) encoding, metadata generation/processing, etc. with respect to content, and generate/output an XR object based on information on a surrounding space or a real object acquired through the input/output unit 740a or the sensor unit 740b.

In addition, the XR device 700a may be wirelessly connected with the hand-held device 700b through the communication unit 710, and operation of the XR device 700a may be controlled by the hand-held device 700b. For example, the hand-held device 700b may operate as a controller for the XR device 700a. To this end, the XR device 700a may acquire three-dimensional position information of the hand-held device 700b and then generate and output an XR object corresponding to the hand-held device 700b.

Figure 8:
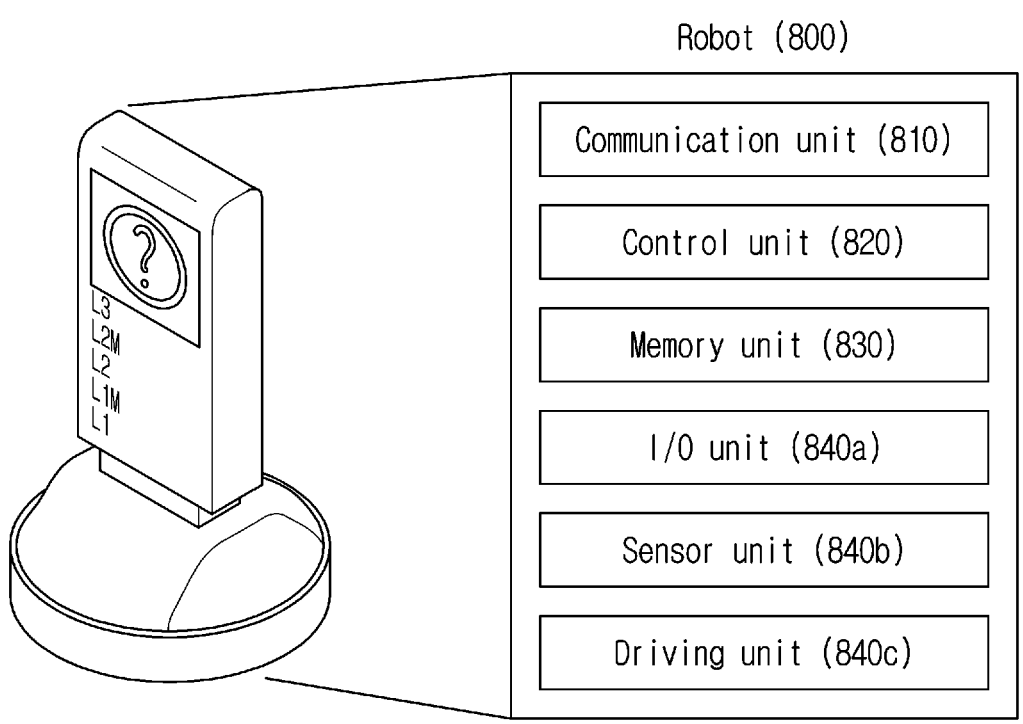
FIG. 8 is a view showing an example of a robot applicable to the present disclosure.

FIG. 8 is a view showing an example of a robot applicable to the present disclosure. For example, the robot may be classified into industrial, medical, household, military, etc. according to the purpose or field of use. At this time, referring to FIG. 8, the robot 800 may include a communication unit (transceiver) 810, a control unit (controller) 820, a memory unit (memory) 830, an input/output unit 840a, sensor unit 840b and a driving unit 840c. Here, blocks 810 to 830/840a to 840c may correspond to the blocks 310 to 330/340 of FIG. 3, respectively.

The communication unit 810 may transmit and receive signals (e.g., driving information, control signals, etc.) to and from external devices such as another wireless device, another robot or a control server. The control unit 820 may control the components of the robot 800 to perform various operations. The memory unit 830 may store data/parameters/programs/code/instructions supporting various functions of the robot 800. The input/output unit 840a may acquire information from the outside of the robot 800 and output information to the outside of the robot 800. The input/output unit 840a may include a camera, a microphone, a user input unit, a display, a speaker and/or a haptic module.

The sensor unit 840b may obtain internal information, surrounding environment information, user information, etc. of the robot 800. The sensor unit 840b may include a proximity sensor, an illumination sensor, an acceleration sensor, a magnetic sensor, a gyro sensor, an inertia sensor, an infrared (IR) sensor, a finger scan sensor, an ultrasonic sensor, an optical sensor, a microphone and/or a radar.

The driving unit 840c may perform various physical operations such as movement of robot joints. In addition, the driving unit 840c may cause the robot 800 to run on the ground or fly in the air. The driving unit 840c may include an actuator, a motor, wheels, a brake, a propeller, etc.

Figure 9:
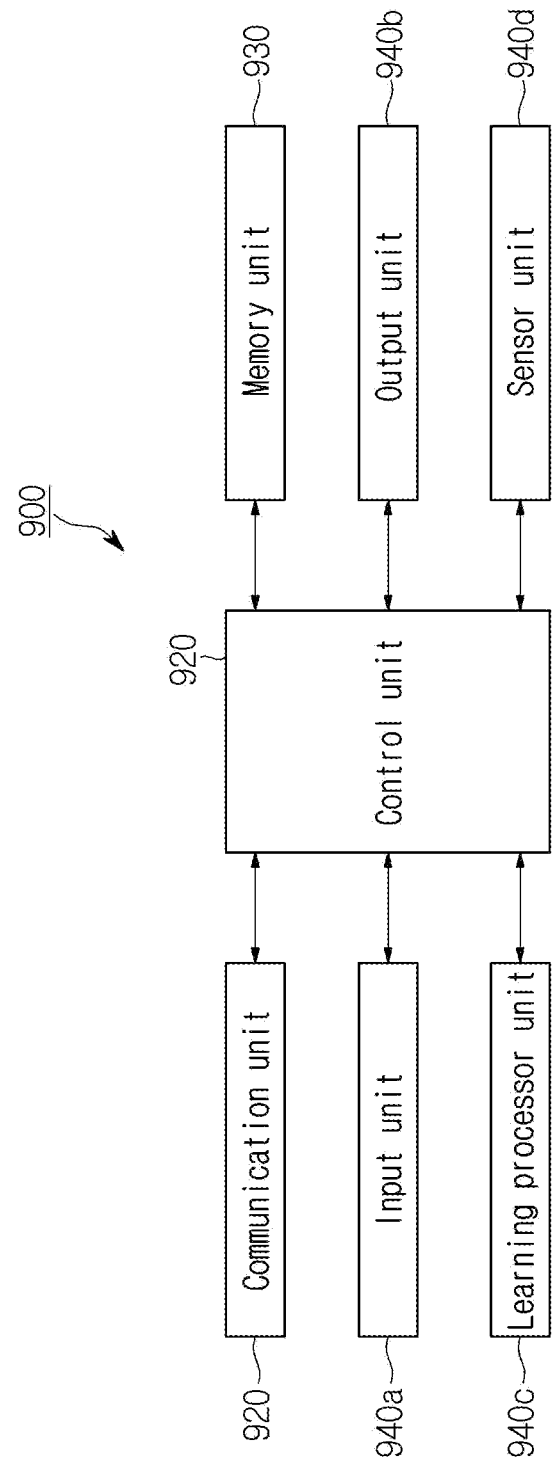
FIG. 9 is a view showing an example of artificial intelligence (AI) device applicable to the present disclosure.

FIG. 9 is a view showing an example of artificial intelligence (AI) device applicable to the present disclosure. For example, the AI device may be implemented as fixed or movable devices such as a TV, a projector, a smartphone, a PC, a laptop, a digital broadcast terminal, a tablet PC, a wearable device, a set-top box (STB), a radio, a washing machine, a refrigerator, a digital signage, a robot, a vehicle, or the like.

Referring to FIG. 9, the AI device 900 may include a communication unit (transceiver) 910, a control unit (controller) 920, a memory unit (memory) 930, an input/output unit 940a/940b, a leaning processor unit (learning processor) 940c and a sensor unit 940d. The blocks 910 to 930/940a to 940d may correspond to the blocks 310 to 330/340 of FIG. 3, respectively.

The communication unit 910 may transmit and receive wired/wireless signals (e.g., sensor information, user input, learning models, control signals, etc.) to and from external devices such as another AI device (e.g., FIG. 1, 100x, 120 or 140) or the AI server (FIG. 1, 140) using wired/wireless communication technology. To this end, the communication unit 910 may transmit information in the memory unit 930 to an external device or transfer a signal received from the external device to the memory unit 930.

The control unit 920 may determine at least one executable operation of the AI device 900 based on information determined or generated using a data analysis algorithm or a machine learning algorithm. In addition, the control unit 920 may control the components of the AI device 900 to perform the determined operation. For example, the control unit 920 may request, search for, receive or utilize the data of the learning processor unit 940c or the memory unit 930, and control the components of the AI device 900 to perform predicted operation or operation, which is determined to be desirable, of at least one executable operation. In addition, the control unit 920 may collect history information including operation of the AI device 900 or user's feedback on the operation and store the history information in the memory unit 930 or the learning processor unit 940c or transmit the history information to the AI server (FIG. 1, 140). The collected history information may be used to update a learning model.

The memory unit 930 may store data supporting various functions of the AI device 900. For example, the memory unit 930 may store data obtained from the input unit 940a, data obtained from the communication unit 910, output data of the learning processor unit 940c, and data obtained from the sensing unit 940. In addition, the memory unit 930 may store control information and/or software code necessary to operate/execute the control unit 920.

The input unit 940a may acquire various types of data from the outside of the AI device 900. For example, the input unit 940a may acquire learning data for model learning, input data, to which the learning model will be applied, etc. The input unit 940a may include a camera, a microphone and/or a user input unit. The output unit 940b may generate video, audio or tactile output. The output unit 940b may include a display, a speaker and/or a haptic module. The sensing unit 940 may obtain at least one of internal information of the AI device 900, the surrounding environment information of the AI device 900 and user information using various sensors. The sensing unit 940 may include a proximity sensor, an illumination sensor, an acceleration sensor, a magnetic sensor, a gyro sensor, an inertia sensor, a red green blue (RGB) sensor, an infrared (IR) sensor, a finger scan sensor, an ultrasonic sensor, an optical sensor, a microphone and/or a radar.

The learning processor unit 940c may train a model composed of an artificial neural network using training data. The learning processor unit 940c may perform AI processing along with the learning processor unit of the AI server (FIG. 1, 140). The learning processor unit 940c may process information received from an external device through the communication unit 910 and/or information stored in the memory unit 930. In addition, the output value of the learning processor unit 940c may be transmitted to the external device through the communication unit 910 and/or stored in the memory unit 930.

Physical Channels and General Signal Transmission

In a radio access system, a UE receives information from a base station on a DL and transmits information to the base station on a UL. The information transmitted and received between the UE and the base station includes general data information and a variety of control information. There are many physical channels according to the types/usages of information transmitted and received between the base station and the UE.

Figure 10:
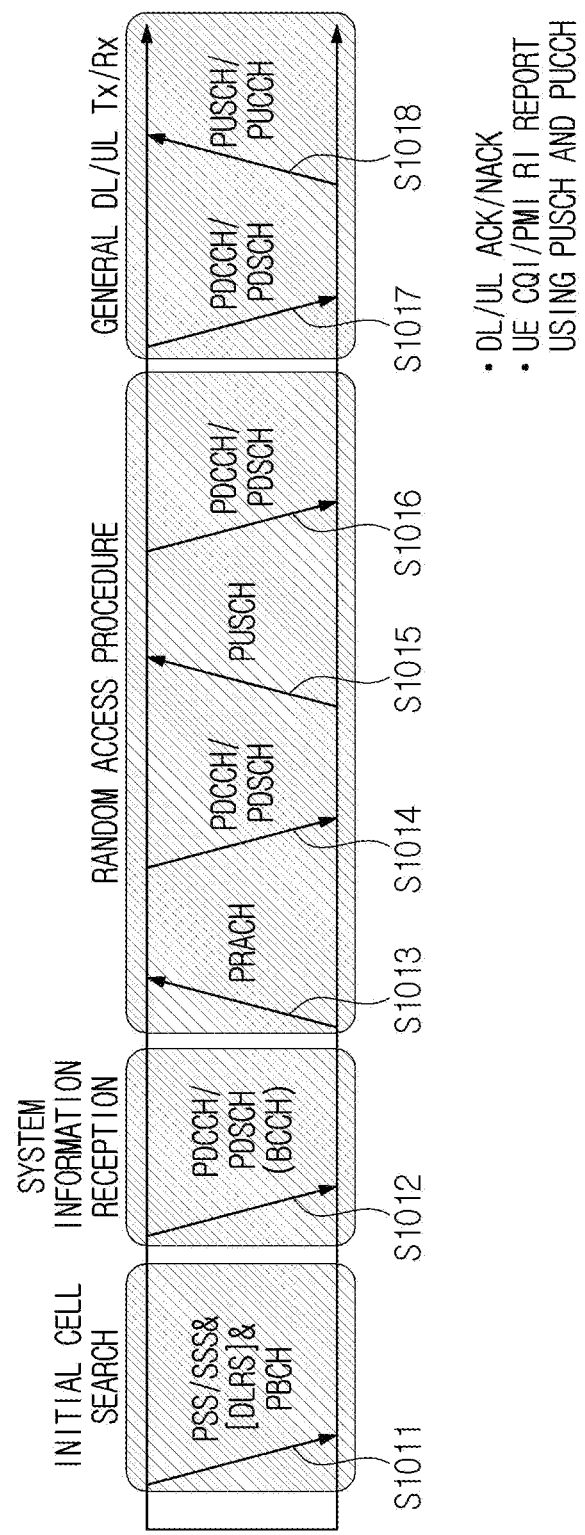
FIG. 10 is a view showing physical channels applicable to the present disclosure and a signal transmission method using the same.

FIG. 10 is a view showing physical channels applicable to the present disclosure and a signal transmission method using the same.

The UE which is turned on again in a state of being turned off or has newly entered a cell performs initial cell search operation in step S1011 such as acquisition of synchronization with a base station. Specifically, the UE performs synchronization with the base station, by receiving a Primary Synchronization Channel (P-SCH) and a Secondary Synchronization Channel (S-SCH) from the base station, and acquires information such as a cell Identifier (ID).

Thereafter, the UE may receive a physical broadcast channel (PBCH) signal from the base station and acquire intra-cell broadcast information. Meanwhile, the UE may receive a downlink reference signal (DL RS) in an initial cell search step and check a downlink channel state. The UE which has completed initial cell search may receive a physical downlink control channel (PDCCH) and a physical downlink control channel (PDSCH) according to physical downlink control channel information in step S1012, thereby acquiring more detailed system information.

Thereafter, the UE may perform a random access procedure such as steps S1013 to S1016 in order to complete access to the base station. To this end, the UE may transmit a preamble through a physical random access channel (PRACH) (S1013) and receive a random access response (RAR) to the preamble through a physical downlink control channel and a physical downlink shared channel corresponding thereto (S1014). The UE may transmit a physical uplink shared channel (PUSCH) using scheduling information in the RAR (S1015) and perform a contention resolution procedure such as reception of a physical downlink control channel signal and a physical downlink shared channel signal corresponding thereto (S1016).

The UE, which has performed the above-described procedures, may perform reception of a physical downlink control channel signal and/or a physical downlink shared channel signal (S1017) and transmission of a physical uplink shared channel (PUSCH) signal and/or a physical uplink control channel (PUCCH) signal (S1018) as general uplink/downlink signal transmission procedures.

The control information transmitted from the UE to the base station is collectively referred to as uplink control information (UCI). The UCI includes hybrid automatic repeat and request acknowledgement/negative-ACK (HARQ-ACK/NACK), scheduling request (SR), channel quality indication (CQI), preceding matrix indication (PMI), rank indication (RI), beam indication (BI) information, etc. At this time, the UCI is generally periodically transmitted through a PUCCH, but may be transmitted through a PUSCH in some embodiments (e.g., when control information and traffic data are simultaneously transmitted). In addition, the UE may aperiodically transmit UCI through a PUSCH according to a request/instruction of a network.

Figure 11:
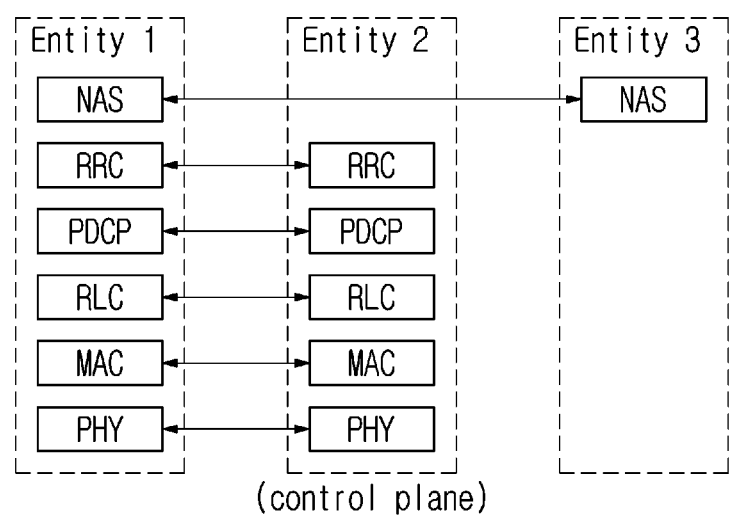
FIG. 11 is a view showing the structure of a control plane and a user plane of a radio interface protocol applicable to the present disclosure.
Figure 11:
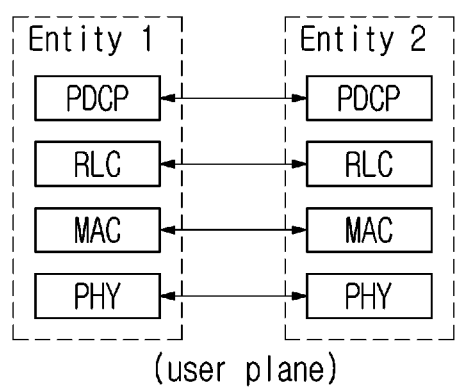

FIG. 11 is a view showing the structure of a control plane and a user plane of a radio interface protocol applicable to the present disclosure.

Referring to FIG. 11, Entity 1 may be a user equipment (UE). At this time, the UE may be at least one of a wireless device, a hand-held device, a vehicle, a mobility, an XR device, a robot or an AI device, to which the present disclosure is applicable in FIGS. 1 to 9. In addition, the UE refers to a device, to which the present disclosure is applicable, and is not limited to a specific apparatus or device.

Entity 2 may be a base station. At this time, the base station may be at least one of an eNB, a gNB or an ng-eNB. In addition, the base station may refer to a device for transmitting a downlink signal to a UE and is not limited to a specific apparatus or device. That is, the base station may be implemented in various forms or types and is not limited to a specific form.

Entity 3 may be a device for performing a network apparatus or a network function. At this time, the network apparatus may be a core network node (e.g., mobility management entity (MME) for managing mobility, an access and mobility management function (AMF), etc. In addition, the network function may mean a function implemented in order to perform a network function. Entity 3 may be a device, to which a function is applied. That is, Entity 3 may refer to a function or device for performing a network function and is not limited to a specific device.

A control plane refers to a path used for transmission of control messages, which are used by the UE and the network to manage a call. A user plane refers to a path in which data generated in an application layer, e.g., voice data or Internet packet data, is transmitted. At this time, a physical layer which is a first layer provides an information transfer service to a higher layer using a physical channel. The physical layer is connected to a media access control (MAC) layer of a higher layer via a transmission channel. At this time, data is transmitted between the MAC layer and the physical layer via the transmission channel. Data is also transmitted between a physical layer of a transmitter and a physical layer of a receiver via a physical channel. The physical channel uses time and frequency as radio resources.

The MAC layer which is a second layer provides a service to a radio link control (RLC) layer of a higher layer via a logical channel. The RLC layer of the second layer supports reliable data transmission. The function of the RLC layer may be implemented by a functional block within the MAC layer. A packet data convergence protocol (PDCP) layer which is the second layer performs a header compression function to reduce unnecessary control information for efficient transmission of an Internet protocol (IP) packet such as an IPv4 or IPv6 packet in a radio interface having relatively narrow bandwidth. A radio resource control (RRC) layer located at the bottommost portion of a third layer is defined only in the control plane. The RRC layer serves to control logical channels, transmission channels, and physical channels in relation to configuration, re-configuration, and release of radio bearers. A radio bearer (RB) refers to a service provided by the second layer to transmit data between the UE and the network. To this end, the RRC layer of the UE and the RRC layer of the network exchange RRC messages. A non-access stratum (NAS) layer located at a higher level of the RRC layer performs functions such as session management and mobility management. One cell configuring a base station may be set to one of various bandwidths to provide a downlink or uplink transmission service to several UEs. Different cells may be set to provide different bandwidths. Downlink transmission channels for transmitting data from a network to a UE may include a broadcast channel (BCH) for transmitting system information, a paging channel (PCH) for transmitting paging messages, and a DL shared channel (SCH) for transmitting user traffic or control messages. Traffic or control messages of a DL multicast or broadcast service may be transmitted through the DL SCH or may be transmitted through an additional DL multicast channel (MCH). Meanwhile, UL transmission channels for data transmission from the UE to the network include a random access channel (RACH) for transmitting initial control messages and a UL SCH for transmitting user traffic or control messages. Logical channels, which are located at a higher level of the transmission channels and are mapped to the transmission channels, include a broadcast control channel (BCCH), a paging control channel (PCCH), a common control channel (CCCH), a multicast control channel (MCCH), and a multicast traffic channel (MTCH).

Figure 12:
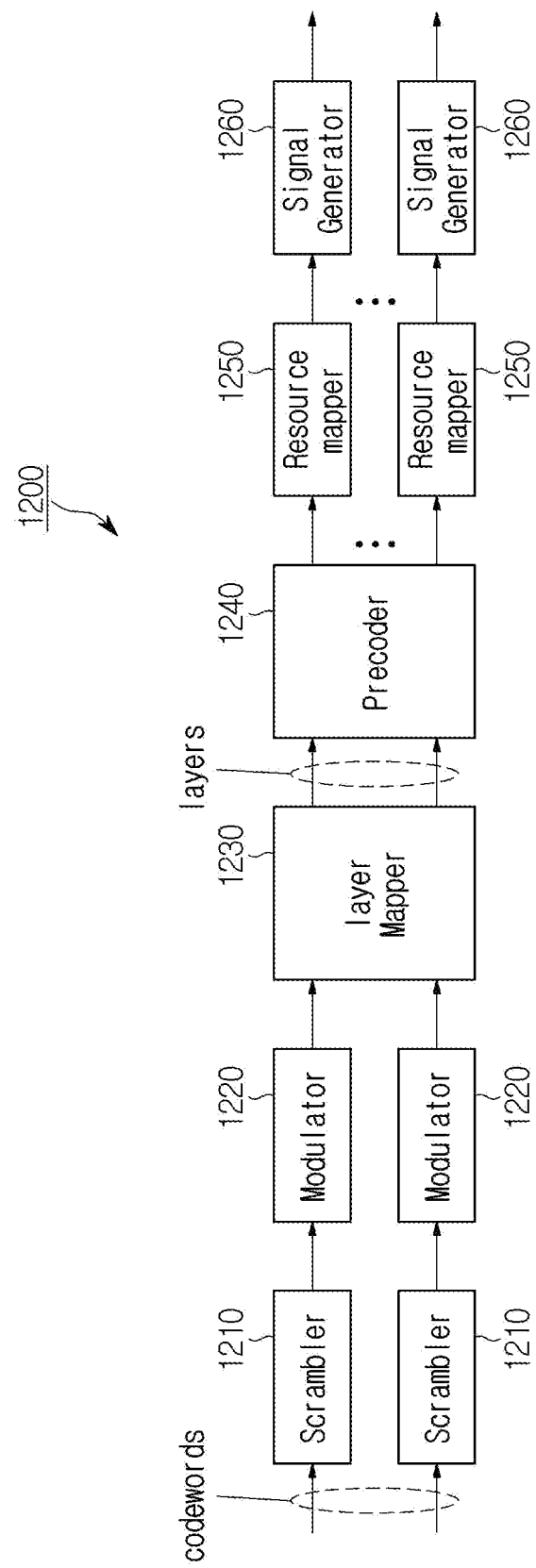
FIG. 12 is a view showing a method of processing a transmitted signal applicable to the present disclosure.

FIG. 12 is a view showing a method of processing a transmitted signal applicable to the present disclosure. For example, the transmitted signal may be processed by a signal processing circuit. At this time, a signal processing circuit 1200 may include a scrambler 1210, a modulator 1220, a layer mapper 1230, a precoder 1240, a resource mapper 1250, and a signal generator 1260. At this time, for example, the operation/function of FIG. 12 may be performed by the processors 202a and 202b and/or the transceiver 206a and 206b of FIG. 2. In addition, for example, the hardware element of FIG. 12 may be implemented in the processors 202a and 202b of FIG. 2 and/or the transceivers 206a and 206b of FIG. 2. For example, blocks 1010 to 1060 may be implemented in the processors 202a and 202b of FIG. 2. In addition, blocks 1210 to 1250 may be implemented in the processors 202a and 202b of FIG. 2 and a block 1260 may be implemented in the transceivers 206a and 206b of FIG. 2, without being limited to the above-described embodiments.

A codeword may be converted into a radio signal through the signal processing circuit 1200 of FIG. 12. Here, the codeword is a coded bit sequence of an information block. The information block may include a transport block (e.g., a UL-SCH transport block or a DL-SCH transport block). The radio signal may be transmitted through various physical channels (e.g., a PUSCH and a PDSCH) of FIG. 10. Specifically, the codeword may be converted into a bit sequence scrambled by the scrambler 1210. The scramble sequence used for scramble is generated based in an initial value and the initial value may include ID information of a wireless device, etc. The scrambled bit sequence may be modulated into a modulated symbol sequence by the modulator 1220. The modulation method may include pi/2-binary phase shift keying (pi/2-BPSK), m-phase shift keying (m-PSK), m-quadrature amplitude modulation (m-QAM), etc.

A complex modulation symbol sequence may be mapped to one or more transport layer by the layer mapper 1230. Modulation symbols of each transport layer may be mapped to corresponding antenna port(s) by the precoder 1240 (precoding). The output z of the precoder 1240 may be obtained by multiplying the output y of the layer mapper 1230 by an N*M precoding matrix W. Here, N may be the number of antenna ports and M may be the number of transport layers. Here, the precoder 1240 may perform precoding after transform precoding (e.g., discrete Fourier transform (DFT)) for complex modulation symbols. In addition, the precoder 1240 may perform precoding without performing transform precoding.

The resource mapper 1250 may map modulation symbols of each antenna port to time-frequency resources. The time-frequency resources may include a plurality of symbols (e.g., a CP-OFDMA symbol and a DFT-s-OFDMA symbol) in the time domain and include a plurality of subcarriers in the frequency domain. The signal generator 1260 may generate a radio signal from the mapped modulation symbols, and the generated radio signal may be transmitted to another device through each antenna. To this end, the signal generator 1260 may include an inverse fast Fourier transform (IFFT) module, a cyclic prefix (CP) insertor, a digital-to-analog converter (DAC), a frequency uplink converter, etc.

A signal processing procedure for a received signal in the wireless device may be configured as the inverse of the signal processing procedures 1210 to 1260 of FIG. 12. For example, the wireless device (e.g., 200a or 200b of FIG. 2) may receive a radio signal from the outside through an antenna port/transceiver. The received radio signal may be converted into a baseband signal through a signal restorer. To this end, the signal restorer may include a frequency downlink converter, an analog-to-digital converter (ADC), a CP remover, and a fast Fourier transform (FFT) module. Thereafter, the baseband signal may be restored to a codeword through a resource de-mapper process, a postcoding process, a demodulation process and a de-scrambling process. The codeword may be restored to an original information block through decoding. Accordingly, a signal processing circuit (not shown) for a received signal may include a signal restorer, a resource de-mapper, a postcoder, a demodulator, a de-scrambler and a decoder.

Figure 13:
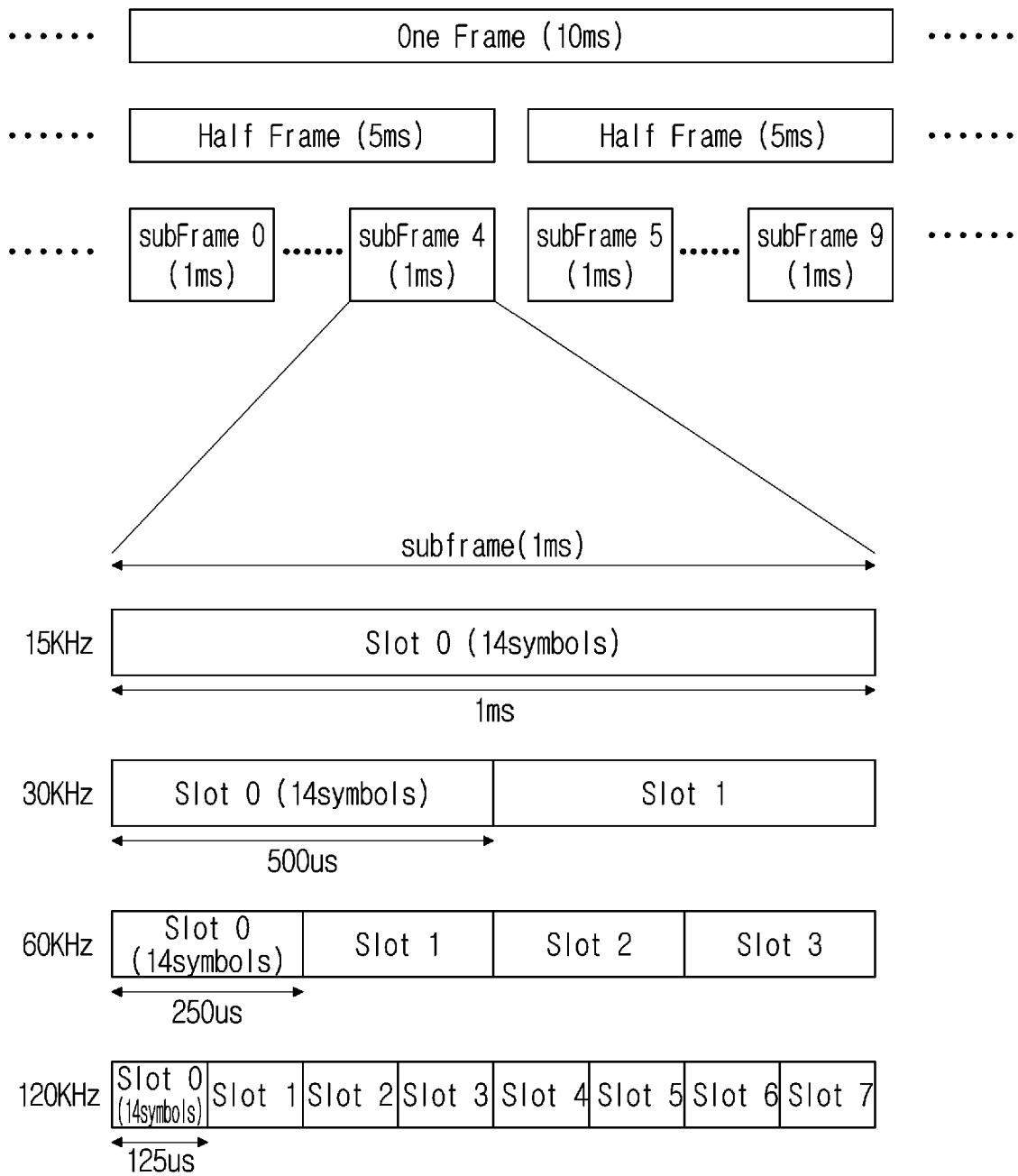
FIG. 13 is a view showing the structure of a radio frame applicable to the present disclosure.

FIG. 13 is a view showing the structure of a radio frame applicable to the present disclosure.

UL and DL transmission based on an NR system may be based on the frame shown in FIG. 13. At this time, one radio frame has a length of 10 ms and may be defined as two 5-ms half-frames (HFs). One half-frame may be defined as five 1-ms subframes (SFs). One subframe may be divided into one or more slots and the number of slots in the subframe may depend on subscriber spacing (SCS). At this time, each slot may include 12 or 14 OFDM(A) symbols according to cyclic prefix (CP). If normal CP is used, each slot may include 14 symbols. If an extended CP is used, each slot may include 12 symbols. Here, the symbol may include an OFDM symbol (or a CP-OFDM symbol) and an SC-FDMA symbol (or a DFT-s-OFDM symbol).

Table 1 shows the number of symbols per slot according to SCS, the number of slots per frame and the number of slots per subframe when normal CP is used, and Table 2 shows the number of symbols per slot according to SCS, the number of slots per frame and the number of slots per subframe when extended CP is used.

TABLE 1

| μ | $N_{symb}^{slot}$ | $N_{slot}^{frame, \mu}$ | $N_{slot}^{subframe, \mu}$ |
|---|---|---|---|
| 0 | 14 | 10 | 1 |
| 1 | 14 | 20 | 2 |
| 2 | 14 | 40 | 4 |

TABLE 1-continued

| µ | $N_{symb}^{slot}$ | $N_{slot}^{frame, \mu}$ | $N_{slot}^{subframe, \mu}$ |
|---|---|---|---|
| 3 | 14 | 80 | 8 |
| 4 | 14 | 160 | 16 |
| 5 | 14 | 320 | 32 |

TABLE 2

| µ | $N_{symb}^{slot}$ | $N_{slot}^{frame, \mu}$ | $N_{slot}^{subframe, \mu}$ |
|---|---|---|---|
| 2 | 12 | 40 | 4 |

In Tables 1 and 2 above, $N^{slot}_{symb}$ may indicate the number of symbols in a slot, $N^{frame,\mu}_{slot}$ may indicate the number of slots in a frame, and $N^{subframe,\mu}_{slot}$ may indicate the number of slots in a subframe.

In addition, in a system, to which the present disclosure is applicable, OFDM(A) numerology (e.g., SCS, CP length, etc.) may be differently set among a plurality of cells merged to one UE. Accordingly, an (absolute time) period of a time resource (e.g., an SF, a slot or a TTI) (for convenience, collectively referred to as a time unit (TU)) composed of the same number of symbols may be differently set between merged cells.

NR may support a plurality of numerologies (or subscriber spacings (SCSs)) supporting various 5G services. For example, a wide area in traditional cellular bands is supported when the SCS is 15 kHz, dense-urban, lower latency and wider carrier bandwidth are supported when the SCS is 30 kHz/60 kHz, and bandwidth greater than 24.25 GHz may be supported to overcome phase noise when the SCS is 60 kHz or higher.

An NR frequency band is defined as two types (FR1 and FR2) of frequency ranges. FR1 and FR2 may be configured as shown in the following table. In addition, FR2 may mean millimeter wave (mmW).

TABLE 3

| Frequency Range designation | Corresponding frequency range | Subcarrier Spacing |
|---|---|---|
| FR1 | 410 MHz-7125 MHz | 15, 30, 60 kHz |
| FR2 | 24250 MHz-52600 MHz | 60, 120, 240 kHz |

A 6G (wireless communication) system has purposes such as (i) very high data rate per device, (ii) a very large number of connected devices, (iii) global connectivity, (iv) very low latency, (v) decrease in energy consumption of battery-free IoT devices, (vi) ultra-reliable connectivity, and (vii) connected intelligence with machine learning capacity. The vision of the 6G system may include four aspects such as "intelligent connectivity", "deep connectivity", "holographic connectivity" and "ubiquitous connectivity", and the 6G system may satisfy the requirements shown in Table 4 below. That is, Table 4 shows the requirements of the 6G system.

TABLE 4

| Per device peak data rate | 1 Tbps |
| E2E latency | 1 ms |
| Maximum spectral efficiency | 100 bps/Hz |
| Mobility support | Up to 1000 km/hr |
| Satellite integration | Fully |
| AI | Fully |

TABLE 4-continued

| Autonomous vehicle | Fully |
| XR | Fully |
| Haptic Communication | Fully |

In addition, for example, in a communication system, to which the present disclosure is applicable, the above-described numerology may be differently set. For example, a terahertz wave (THz) band may be used as a frequency band higher than FR2. In the THz band, the SCS may be set greater than that of the NR system, and the number of slots may be differently set, without being limited to the above-described embodiments. The THz band will be described below.

Figure 14:
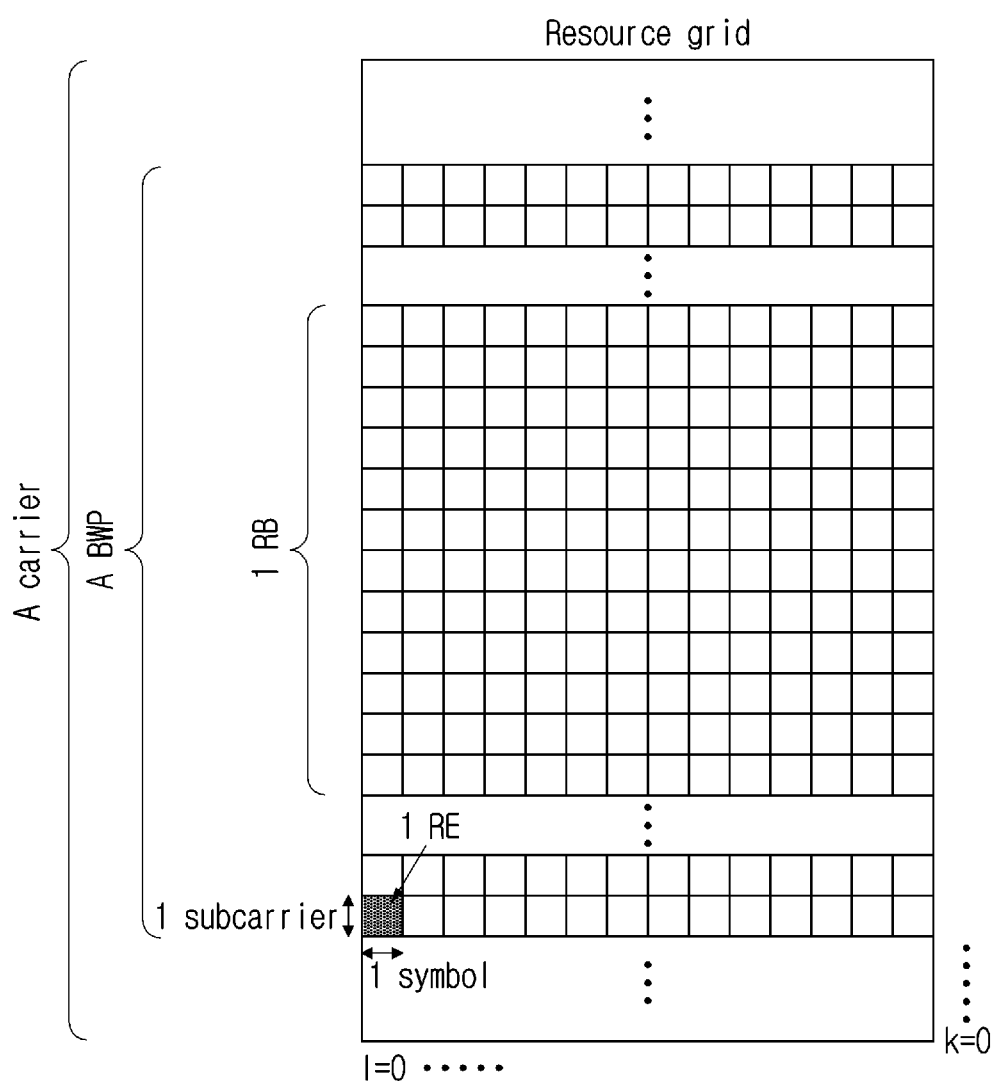
FIG. 14 is a view showing a slot structure applicable to the present disclosure.

FIG. 14 is a view showing a slot structure applicable to the present disclosure.

One slot includes a plurality of symbols in the time domain. For example, one slot includes seven symbols in case of normal CP and one slot includes six symbols in case of extended CP. A carrier includes a plurality of subcarriers in the frequency domain. A resource block (RB) may be defined as a plurality (e.g., 12) of consecutive subcarriers in the frequency domain.

In addition, a bandwidth part (BWP) is defined as a plurality of consecutive (P)RBs in the frequency domain and may correspond to one numerology (e.g., SCS, CP length, etc.).

The carrier may include a maximum of N (e.g., five) BWPs. Data communication is performed through an activated BWP and only one BWP may be activated for one UE. In resource grid, each element is referred to as a resource element (RE) and one complex symbol may be mapped.

6G Communication System

At this time, the 6G system may have key factors such as enhanced mobile broadband (eMBB), ultra-reliable low latency communications (URLLC), massive machine type communications (mMTC 24), AI integrated communication, tactile internet, high throughput, high network capacity, high energy efficiency, low backhaul and access network congestion, and enhanced data security.

Figure 15:
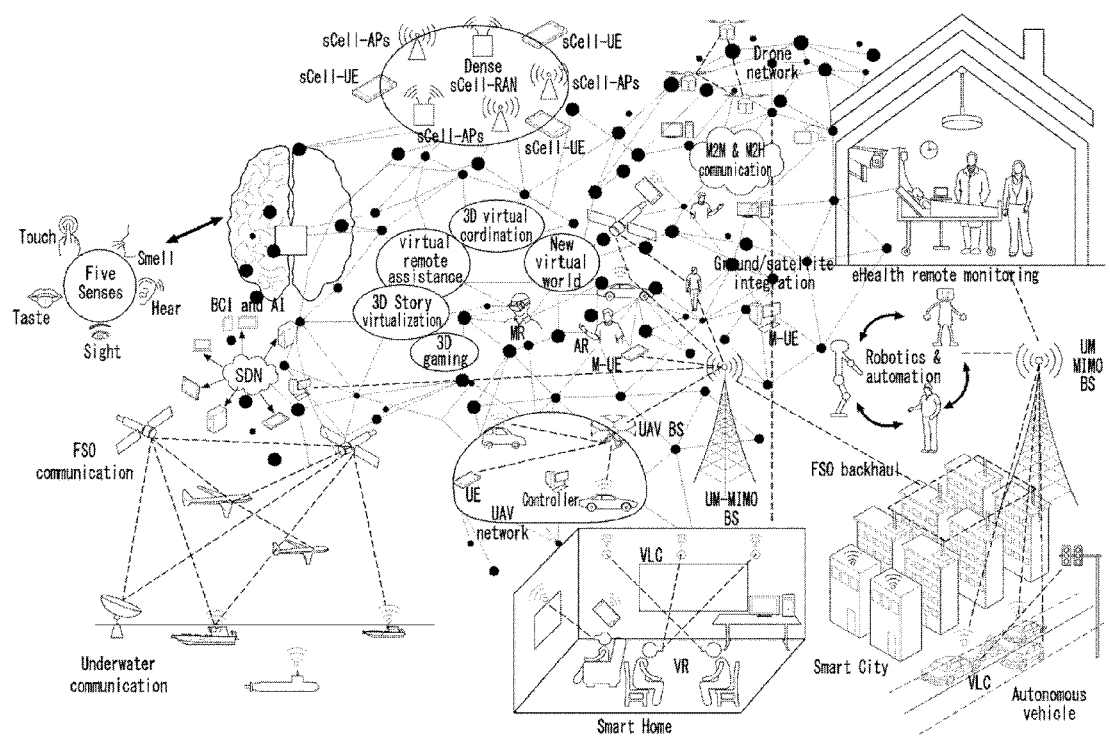
FIG. 15 is a view showing an example of a communication structure providable in a 6th generation (6G) system applicable to the present disclosure.

FIG. 15 is a view showing an example of a communication structure providable in a 6G system applicable to the present disclosure.

Referring to FIG. 15, the 6G system will have 50 times higher simultaneous wireless communication connectivity than a 5G wireless communication system. URLLC, which is the key feature of 5G, will become more important technology by providing end-to-end latency less than 1 ms in 6G communication. At this time, the 6G system may have much better volumetric spectrum efficiency unlike frequently used domain spectrum efficiency. The 6G system may provide advanced battery technology for energy harvesting and very long battery life and thus mobile devices may not need to be separately charged in the 6G system. In addition, in 6G, new network characteristics may be as follows.

Satellites integrated network: To provide a global mobile group, 6G will be integrated with satellite. Integrating terrestrial waves, satellites and public networks as one wireless communication system may be very important for 6G.

Connected intelligence: Unlike the wireless communication systems of previous generations, 6G is innovative and wireless evolution may be updated from "connected things" to "connected intelligence". AI may be applied in each step (or each signal processing procedure which will be described below) of a communication procedure.

Seamless integration of wireless information and energy transfer: A 6G wireless network may transfer power in order to charge the batteries of devices such as smartphones and sensors. Therefore, wireless information and energy transfer (WIET) will be integrated.

Ubiquitous super 3-dimension connectivity: Access to networks and core network functions of drones and very low earth orbit satellites will establish super 3D connection in 6G ubiquitous.

In the new network characteristics of 6G, several general requirements may be as follows.

Small cell networks: The idea of a small cell network was introduced in order to improve received signal quality as a result of throughput, energy efficiency and spectrum efficiency improvement in a cellular system. As a result, the small cell network is an essential feature for 5G and beyond 5G (5 GB) communication systems. Accordingly, the 6G communication system also employs the characteristics of the small cell network.

Ultra-dense heterogeneous network: Ultra-dense heterogeneous networks will be another important characteristic of the 6G communication system. A multi-tier network composed of heterogeneous networks improves overall QoS and reduces costs.

High-capacity backhaul: Backhaul connection is characterized by a high-capacity backhaul network in order to support high-capacity traffic. A high-speed optical fiber and free space optical (FSO) system may be a possible solution for this problem.

Radar technology integrated with mobile technology: High-precision localization (or location-based service) through communication is one of the functions of the 6G wireless communication system. Accordingly, the radar system will be integrated with the 6G network.

Softwarization and virtualization: Softwarization and virtualization are two important functions which are the bases of a design process in a 5 GB network in order to ensure flexibility, reconfigurability and programmability.

Core Implementation Technology of 6G System
Artificial Intelligence (AI)

Technology which is most important in the 6G system and will be newly introduced is AI. AI was not involved in the 4G system. A 5G system will support partial or very limited AI. However, the 6G system will support AI for full automation. Advance in machine learning will create a more intelligent network for real-time communication in 6G. When AI is introduced to communication, real-time data transmission may be simplified and improved. AI may determine a method of performing complicated target tasks using countless analysis. That is, AI may increase efficiency and reduce processing delay.

Time-consuming tasks such as handover, network selection or resource scheduling may be immediately performed by using AI. AI may play an important role even in M2M, machine-to-human and human-to-machine communication. In addition, AI may be rapid communication in a brain computer interface (BCI). An AI based communication system may be supported by meta materials, intelligent structures, intelligent networks, intelligent devices, intelligent recognition radios, self-maintaining wireless networks and machine learning.

Recently, attempts have been made to integrate AI with a wireless communication system in the application layer or the network layer, but deep learning have been focused on the wireless resource management and allocation field. However, such studies are gradually developed to the MAC layer and the physical layer, and, particularly, attempts to combine deep learning in the physical layer with wireless transmission are emerging. AI-based physical layer transmission means applying a signal processing and communication mechanism based on an AI driver rather than a traditional communication framework in a fundamental signal processing and communication mechanism. For example, channel coding and decoding based on deep learning, signal estimation and detection based on deep learning, multiple input multiple output (MIMO) mechanisms based on deep learning, resource scheduling and allocation based on AI, etc. may be included.

Machine learning may be used for channel estimation and channel tracking and may be used for power allocation, interference cancellation, etc. in the physical layer of DL. In addition, machine learning may be used for antenna selection, power control, symbol detection, etc. in the MIMO system.

However, application of a deep neutral network (DNN) for transmission in the physical layer may have the following problems.

Deep learning-based AI algorithms require a lot of training data in order to optimize training parameters. However, due to limitations in acquiring data in a specific channel environment as training data, a lot of training data is used offline. Static training for training data in a specific channel environment may cause a contradiction between the diversity and dynamic characteristics of a radio channel.

In addition, currently, deep learning mainly targets real signals. However, the signals of the physical layer of wireless communication are complex signals. For matching of the characteristics of a wireless communication signal, studies on a neural network for detecting a complex domain signal are further required.

Hereinafter, machine learning will be described in greater detail.

Machine learning refers to a series of operations to train a machine in order to build a machine which can perform tasks which cannot be performed or are difficult to be performed by people. Machine learning requires data and learning models. In machine learning, data learning methods may be roughly divided into three methods, that is, supervised learning, unsupervised learning and reinforcement learning.

Neural network learning is to minimize output error. Neural network learning refers to a process of repeatedly inputting training data to a neural network, calculating the error of the output and target of the neural network for the training data, backpropagating the error of the neural network from the output layer of the neural network to an input layer in order to reduce the error and updating the weight of each node of the neural network.

Supervised learning may use training data labeled with a correct answer and the unsupervised learning may use training data which is not labeled with a correct answer. That is, for example, in case of supervised learning for data classification, training data may be labeled with a category. The labeled training data may be input to the neural network, and the output (category) of the neural network may be compared with the label of the training data, thereby calculating the error. The calculated error is backpropagated from the neural network backward (that is, from the output layer to the input layer), and the connection weight of each node of each layer of the neural network may be updated according to backpropagation. Change in updated connection weight of each node may be determined according to the learning rate. Calculation of the neural network for input data and backpropagation of the error may configure a learning cycle (epoch). The learning data is differently applicable according to the number of repetitions of the learning cycle of the neural network. For example, in the early phase of learning of the neural network, a high learning rate may be used to increase efficiency such that the neural network rapidly ensures a certain level of performance and, in the late phase of learning, a low learning rate may be used to increase accuracy.

The learning method may vary according to the feature of data. For example, for the purpose of accurately predicting data transmitted from a transmitter in a receiver in a communication system, learning may be performed using supervised learning rather than unsupervised learning or reinforcement learning.

The learning model corresponds to the human brain and may be regarded as the most basic linear model. However, a paradigm of machine learning using a neural network structure having high complexity, such as artificial neural networks, as a learning model is referred to as deep learning.

Neural network cores used as a learning method may roughly include a deep neural network (DNN) method, a convolutional deep neural network (CNN) method and a recurrent Boltzmman machine (RNN) method. Such a learning model is applicable.

Terahertz (THz) Communication

THz communication is applicable to the 6G system. For example, a data rate may increase by increasing bandwidth. This may be performed by using sub-THz communication with wide bandwidth and applying advanced massive MIMO technology.

Figure 16:
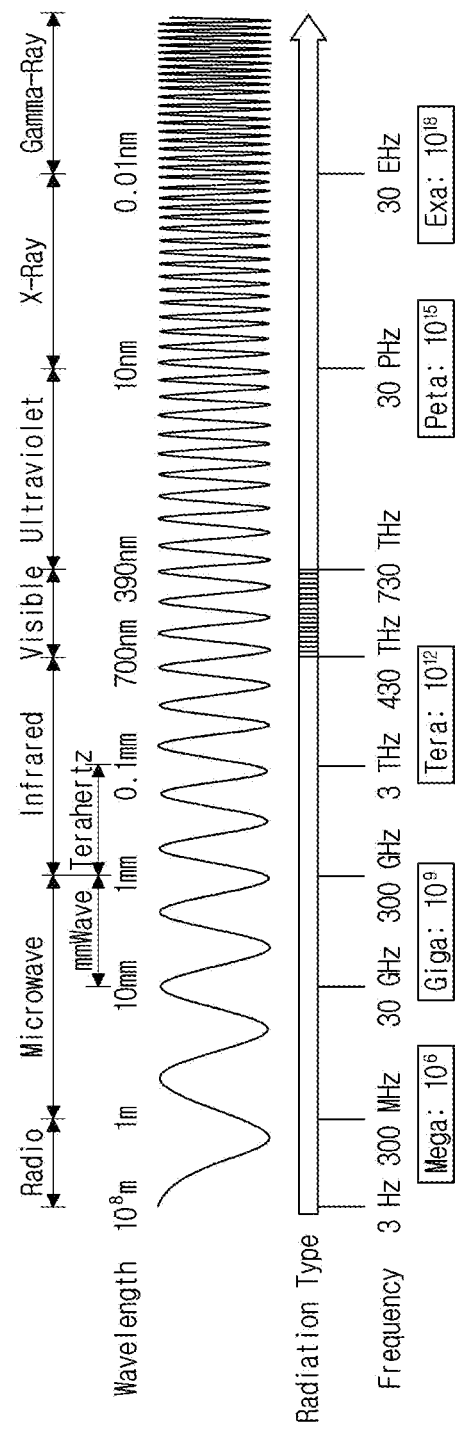
FIG. 16 is a view showing an electromagnetic spectrum applicable to the present disclosure.

FIG. 16 is a view showing an electromagnetic spectrum applicable to the present disclosure. For example, referring to FIG. 16, THz waves which are known as sub-millimeter radiation, generally indicates a frequency band between 0.1 THz and 10 THz with a corresponding wavelength in a range of 0.03 mm to 3 mm A band range of 100 GHz to 300 GHz (sub THz band) is regarded as a main part of the THz band for cellular communication. When the sub-THz band is added to the mmWave band, the 6G cellular communication capacity increases. 300 GHz to 3 THz of the defined THz band is in a far infrared (IR) frequency band. A band of 300 GHz to 3 THz is a part of an optical band but is at the border of the optical band and is just behind an RF band. Accordingly, the band of 300 GHz to 3 THz has similarity with RF.

The main characteristics of THz communication include (i) bandwidth widely available to support a very high data rate and (ii) high path loss occurring at a high frequency (a high directional antenna is indispensable). A narrow beam width generated by the high directional antenna reduces interference. The small wavelength of a THz signal allows a larger number of antenna elements to be integrated with a device and BS operating in this band. Therefore, an advanced adaptive arrangement technology capable of overcoming a range limitation may be used.

Optical Wireless Technology

Optical wireless communication (OWC) technology is planned for 6G communication in addition to RF based communication for all possible device-to-access networks. This network is connected to a network-to-backhaul/fronthaul network connection. OWC technology has already been used since 4G communication systems but will be more widely used to satisfy the requirements of the 6G communication system. OWC technologies such as light fidelity/visible light communication, optical camera communication and free space optical (FSO) communication based on wide band are well-known technologies. Communication based on optical wireless technology may provide a very high data rate, low latency and safe communication. Light detection and ranging (LiDAR) may also be used for ultra high resolution 3D mapping in 6G communication based on wide band.

FSO Backhaul Network

The characteristics of the transmitter and receiver of the FSO system are similar to those of an optical fiber network. Accordingly, data transmission of the FSO system similar to that of the optical fiber system. Accordingly, FSO may be a good technology for providing backhaul connection in the 6G system along with the optical fiber network. When FSO is used, very long-distance communication is possible even at a distance of 10,000 km or more. FSO supports mass backhaul connections for remote and non-remote areas such as sea, space, underwater and isolated islands. FSO also supports cellular base station connections.

Massive MIMO Technology

One of core technologies for improving spectrum efficiency is MIMO technology. When MIMO technology is improved, spectrum efficiency is also improved. Accordingly, massive MIMO technology will be important in the 6G system. Since MIMO technology uses multiple paths, multiplexing technology and beam generation and management technology suitable for the THz band should be significantly considered such that data signals are transmitted through one or more paths.

Blockchain

A blockchain will be important technology for managing large amounts of data in future communication systems. The blockchain is a form of distributed ledger technology, and distributed ledger is a database distributed across numerous nodes or computing devices. Each node duplicates and stores the same copy of the ledger. The blockchain is managed through a peer-to-peer (P2P) network. This may exist without being managed by a centralized institution or server. Blockchain data is collected together and organized into blocks. The blocks are connected to each other and protected using encryption. The blockchain completely complements large-scale IoT through improved interoperability, security, privacy, stability and scalability. Accordingly, the blockchain technology provides several functions such as interoperability between devices, high-capacity data traceability, autonomous interaction of different IoT systems, and large-scale connection stability of 6G communication systems.

3D Networking

The 6G system integrates terrestrial and public networks to support vertical expansion of user communication. A 3D BS will be provided through low-orbit satellites and UAVs. Adding new dimensions in terms of altitude and related degrees of freedom makes 3D connections significantly different from existing 2D networks.

Quantum Communication

In the context of the 6G network, unsupervised reinforcement learning of the network is promising. The supervised learning method cannot label the vast amount of data generated in 6G. Labeling is not required for unsupervised learning. Thus, this technique can be used to autonomously build a representation of a complex network. Combining reinforcement learning with unsupervised learning may enable the network to operate in a truly autonomous way.

Unmanned Aerial Vehicle

An unmanned aerial vehicle (UAV) or drone will be an important factor in 6G wireless communication. In most cases, a high-speed data wireless connection is provided using UAV technology. A base station entity is installed in the UAV to provide cellular connectivity. UAVs have certain features, which are not found in fixed base station infrastructures, such as easy deployment, strong line-of-sight links, and mobility-controlled degrees of freedom. During emergencies such as natural disasters, the deployment of terrestrial telecommunications infrastructure is not economically feasible and sometimes services cannot be provided in volatile environments. The UAV can easily handle this situation. The UAV will be a new paradigm in the field of wireless communications. This technology facilitates the three basic requirements of wireless networks, such as eMBB, URLLC and mMTC. The UAV can also serve a number of purposes, such as network connectivity improvement, fire detection, disaster emergency services, security and surveillance, pollution monitoring, parking monitoring, and accident monitoring. Therefore, UAV technology is recognized as one of the most important technologies for 6G communication.

Cell-Free Communication

The tight integration of multiple frequencies and heterogeneous communication technologies is very important in the 6G system. As a result, a user can seamlessly move from network to network without having to make any manual configuration in the device. The best network is automatically selected from the available communication technologies. This will break the limitations of the cell concept in wireless communication. Currently, user movement from one cell to another cell causes too many handovers in a high-density network, and causes handover failure, handover delay, data loss and ping-pong effects. 6G cell-free communication will overcome all of them and provide better QoS. Cell-free communication will be achieved through multi-connectivity and multi-tier hybrid technologies and different heterogeneous radios in the device.

Wireless Information and Energy Transfer (WIET)

WIET uses the same field and wave as a wireless communication system. In particular, a sensor and a smartphone will be charged using wireless power transfer during communication. WIET is a promising technology for extending the life of battery charging wireless systems. Therefore, devices without batteries will be supported in 6G communication.

Integration of Sensing and Communication

An autonomous wireless network is a function for continuously detecting a dynamically changing environment state and exchanging information between different nodes. In 6G, sensing will be tightly integrated with communication to support autonomous systems.

Integration of Access Backhaul Network

In 6G, the density of access networks will be enormous. Each access network is connected by optical fiber and backhaul connection such as FSO network. To cope with a very large number of access networks, there will be a tight integration between the access and backhaul networks.

Hologram Beamforming

Beamforming is a signal processing procedure that adjusts an antenna array to transmit radio signals in a specific direction. This is a subset of smart antennas or advanced antenna systems. Beamforming technology has several advantages, such as high signal-to-noise ratio, interference prevention and rejection, and high network efficiency. Hologram beamforming (HBF) is a new beamforming method that differs significantly from MIMO systems because this uses a software-defined antenna. HBF will be a very effective approach for efficient and flexible transmission and reception of signals in multi-antenna communication devices in 6G.

Big Data Analysis

Big Data Analysis is a Complex Process for Analyzing Various Large Data Sets or Big Data. This process finds information such as hidden data, unknown correlations, and customer disposition to ensure complete data management. Big data is collected from various sources such as video, social networks, images and sensors. This technology is widely used for processing massive data in the 6G system.

Large Intelligent Surface (LIS)

In the case of the THz band signal, since the straightness is strong, there may be many shaded areas due to obstacles. By installing the LIS near these shaded areas, LIS technology that expands a communication area, enhances communication stability, and enables additional optional services becomes important. The LIS is an artificial surface made of electromagnetic materials, and can change propagation of incoming and outgoing radio waves. The LIS can be viewed as an extension of massive MIMO, but differs from the massive MIMO in array structures and operating mechanisms. In addition, the LIS has an advantage such as low power consumption, because this operates as a reconfigurable reflector with passive elements, that is, signals are only passively reflected without using active RF chains. In addition, since each of the passive reflectors of the LIS must independently adjust the phase shift of an incident signal, this may be advantageous for wireless communication channels. By properly adjusting the phase shift through an LIS controller, the reflected signal can be collected at a target receiver to boost the received signal power.

THz Wireless Communication

Figure 17:
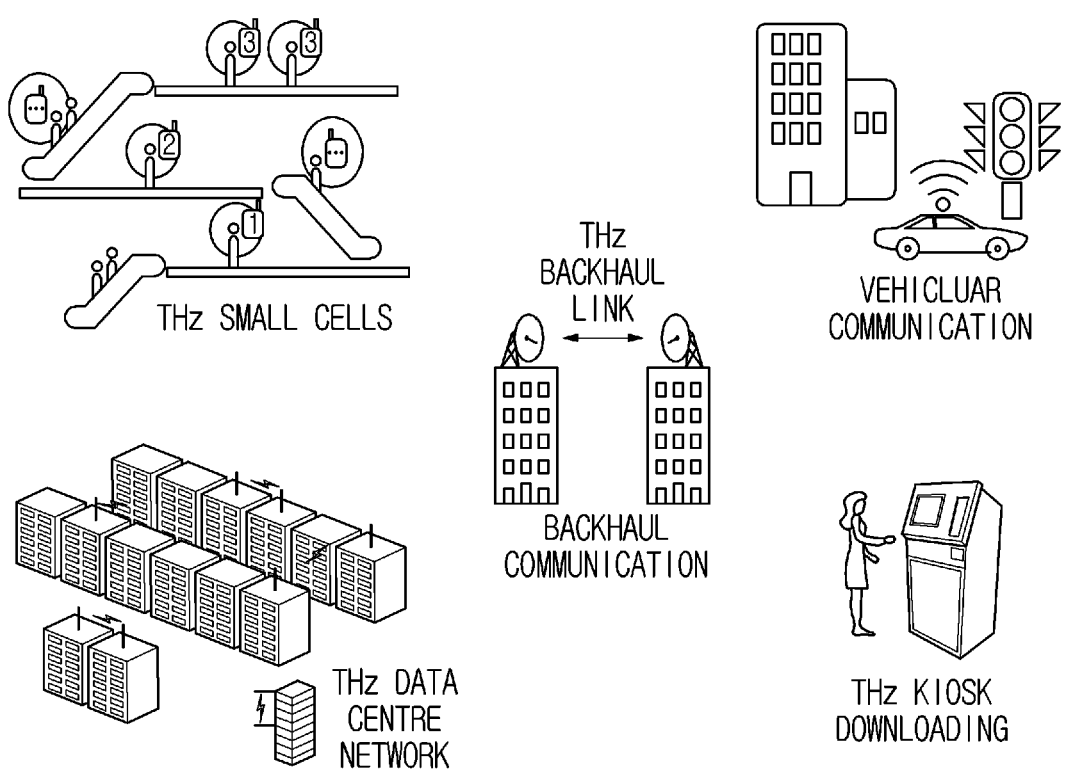
FIG. 17 is a view showing a THz communication method applicable to the present disclosure.

FIG. 17 is a view showing a THz communication method applicable to the present disclosure.

Referring to FIG. 17, THz wireless communication uses a THz wave having a frequency of approximately 0.1 to 10 THz (1 THz=1012 Hz), and may mean terahertz (THz) band wireless communication using a very high carrier frequency of 100 GHz or more. The THz wave is located between radio frequency (RF)/millimeter (mm) and infrared bands, and (i) transmits non-metallic/non-polarizable materials better than visible/infrared rays and has a shorter wavelength than the RF/millimeter wave and thus high straightness and is capable of beam convergence.

In addition, the photon energy of the THz wave is only a few meV and thus is harmless to the human body. A frequency band which will be used for THz wireless communication may be a D-band (110 GHz to 170 GHz) or a H-band (220 GHz to 325 GHz) band with low propagation loss due to molecular absorption in air. Standardization discussion on THz wireless communication is being discussed mainly in IEEE 802.15 THz working group (WG), in addition to 3GPP, and standard documents issued by a task group (TG) of IEEE 802.15 (e.g., TG3d, TG3e) specify and supplement the description of this disclosure. The THz wireless communication may be applied to wireless cognition, sensing, imaging, wireless communication, and THz navigation.

Specifically, referring to FIG. 17, a THz wireless communication scenario may be classified into a macro network, a micro network, and a nanoscale network. In the macro network, THz wireless communication may be applied to vehicle-to-vehicle (V2V) connection and backhaul/fronthaul connection. In the micro network, THz wireless communication may be applied to near-field communication such as indoor small cells, fixed point-to-point or multi-point connection such as wireless connection in a data center or kiosk downloading. Table 5 below shows an example of technology which may be used in the THz wave.

TABLE 5

| | |
|---|---|
| Transceivers Device | Available immature: UTC-PD, RTD and SBD |
| Modulation and coding | Low order modulation techniques (OOK, QPSK), LDPC, Reed Soloman, Hamming, Polar, Turbo |
| Antenna | Omni and Directional, phased array with low number of antenna elements |
| Bandwidth | 69 GHz (or 23 GHz) at 300 GHz |
| Channel models | Partially |
| Data rate | 100 Gbps |
| Outdoor deployment | No |
| Free space loss | High |
| Coverage | Low |
| Radio Measurements | 300 GHz indoor |
| Device size | Few micrometers |

Figure 18:
FIG. 18 is a view showing a THz wireless communication transceiver applicable to the present disclosure.

FIG. 18 is a view showing a THz wireless communication transceiver applicable to the present disclosure.

Referring to FIG. 18, THz wireless communication may be classified based on the method of generating and receiving THz. The THz generation method may be classified as an optical component or electronic component based technology.

At this time, the method of generating THz using an electronic component includes a method using a semiconductor component such as a resonance tunneling diode (RTD), a method using a local oscillator and a multiplier, a monolithic microwave integrated circuit (MMIC) method using a compound semiconductor high electron mobility transistor (HEMT) based integrated circuit, and a method using a Si-CMOS-based integrated circuit. In the case of FIG. 18, a multiplier (doubler, tripler, multiplier) is applied to increase the frequency, and radiation is performed by an antenna through a subharmonic mixer. Since the THz band forms a high frequency, a multiplier is essential. Here, the multiplier is a circuit having an output frequency which is N times an input frequency, and matches a desired harmonic frequency, and filters out all other frequencies. In addition, beamforming may be implemented by applying an array antenna or the like to the antenna of FIG. 18. In FIG. 18, IF represents an intermediate frequency, a tripler and a multiplier represents a multiplier, PA represents a power amplifier, and LNA represents a low noise amplifier, and PLL represents a phase-locked loop.

Figure 19:
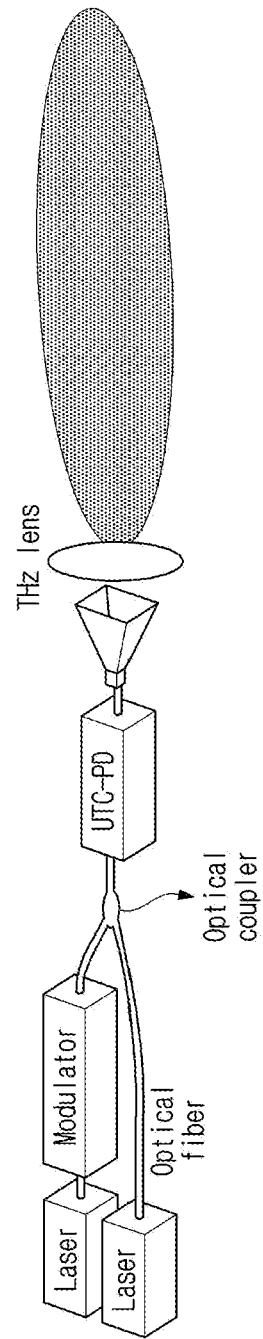
FIG. 19 is a view showing a THz signal generation method applicable to the present disclosure.
Figure 20:
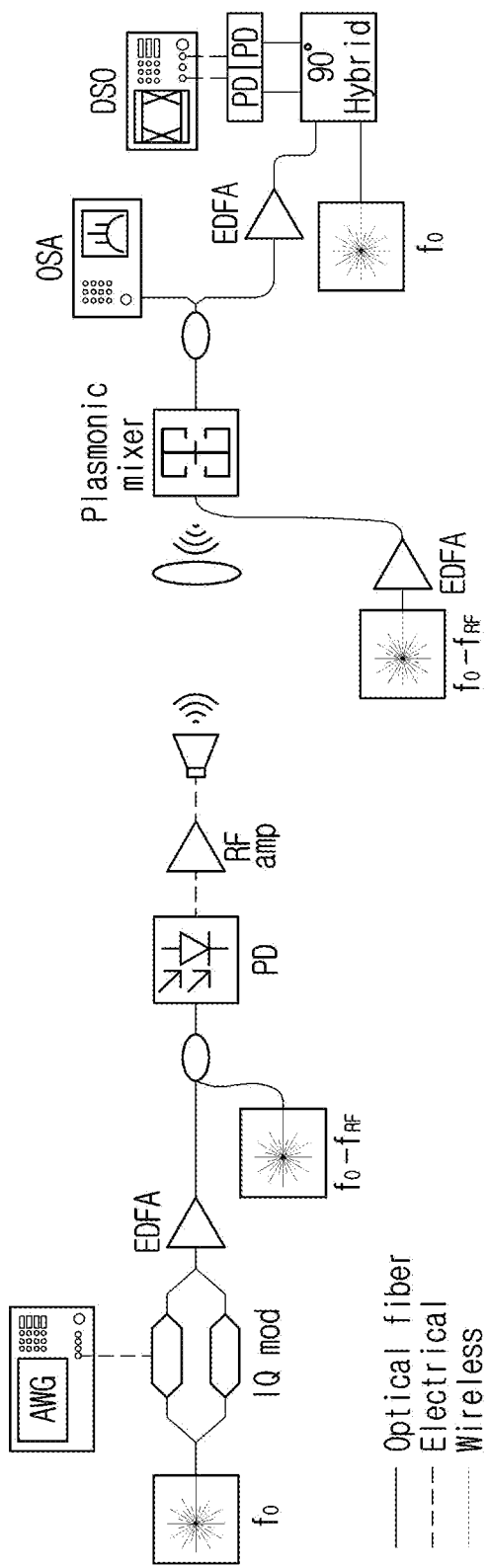
FIG. 20 is a view showing a wireless communication transceiver applicable to the present disclosure.

FIG. 19 is a view showing a THz signal generation method applicable to the present disclosure. FIG. 20 is a view showing a wireless communication transceiver applicable to the present disclosure.

Referring to FIGS. 19 and 20, the optical component-based THz wireless communication technology means a method of generating and modulating a THz signal using an optical component. The optical component-based THz signal generation technology refers to a technology that generates an ultrahigh-speed optical signal using a laser and an optical modulator, and converts it into a THz signal using an ultrahigh-speed photodetector. This technology is easy to increase the frequency compared to the technology using only the electronic component, can generate a high-power signal, and can obtain a flat response characteristic in a wide frequency band. In order to generate the THz signal based on the optical component, as shown in FIG. 19, a laser diode, a broadband optical modulator, and an ultrahigh-speed photodetector are required. In the case of FIG. 19, the light signals of two lasers having different wavelengths are combined to generate a THz signal corresponding to a wavelength difference between the lasers. In FIG. 19, an optical coupler refers to a semiconductor component that transmits an electrical signal using light waves to provide coupling with electrical isolation between circuits or systems, and a uni-travelling carrier photo-detector (UTC-PD) is one of photodetectors, which uses electrons as an active carrier and reduces the travel time of electrons by bandgap grading. The UTC-PD is capable of photodetection at 150 GHz or more. In FIG. 20, an erbium-doped fiber amplifier (EDFA) represents an optical fiber amplifier to which erbium is added, a photo detector (PD) represents a semiconductor component capable of converting an optical signal into an electrical signal, and OSA represents an optical sub assembly in which various optical communication functions (e.g., photoelectric conversion, electrophotic conversion, etc.) are modularized as one component, and DSO represents a digital storage oscilloscope.

Figure 21:
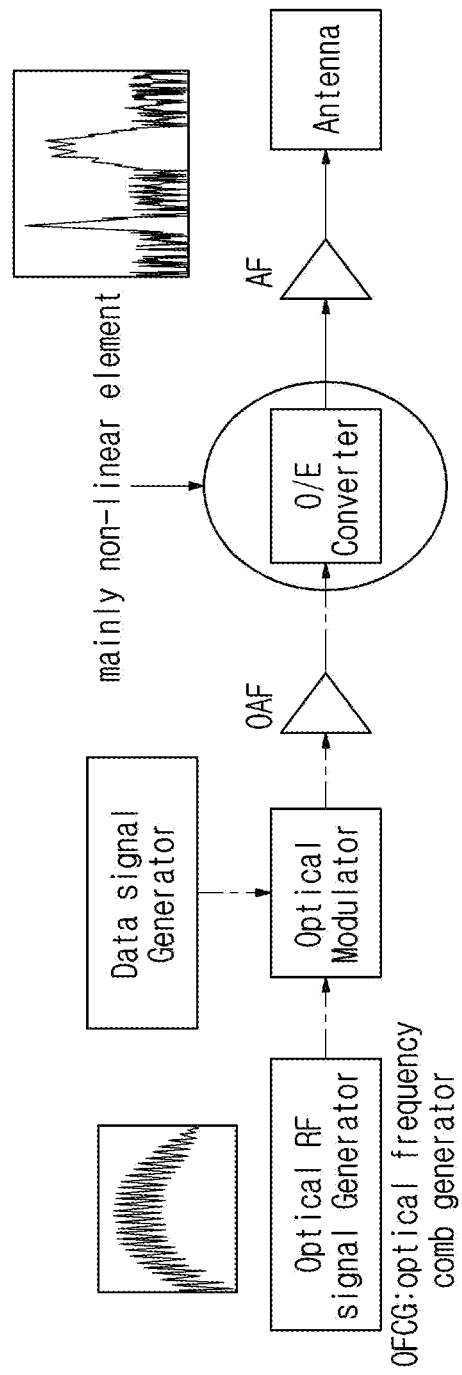
FIG. 21 is a view showing a transmitter structure applicable to the present disclosure.
Figure 22:
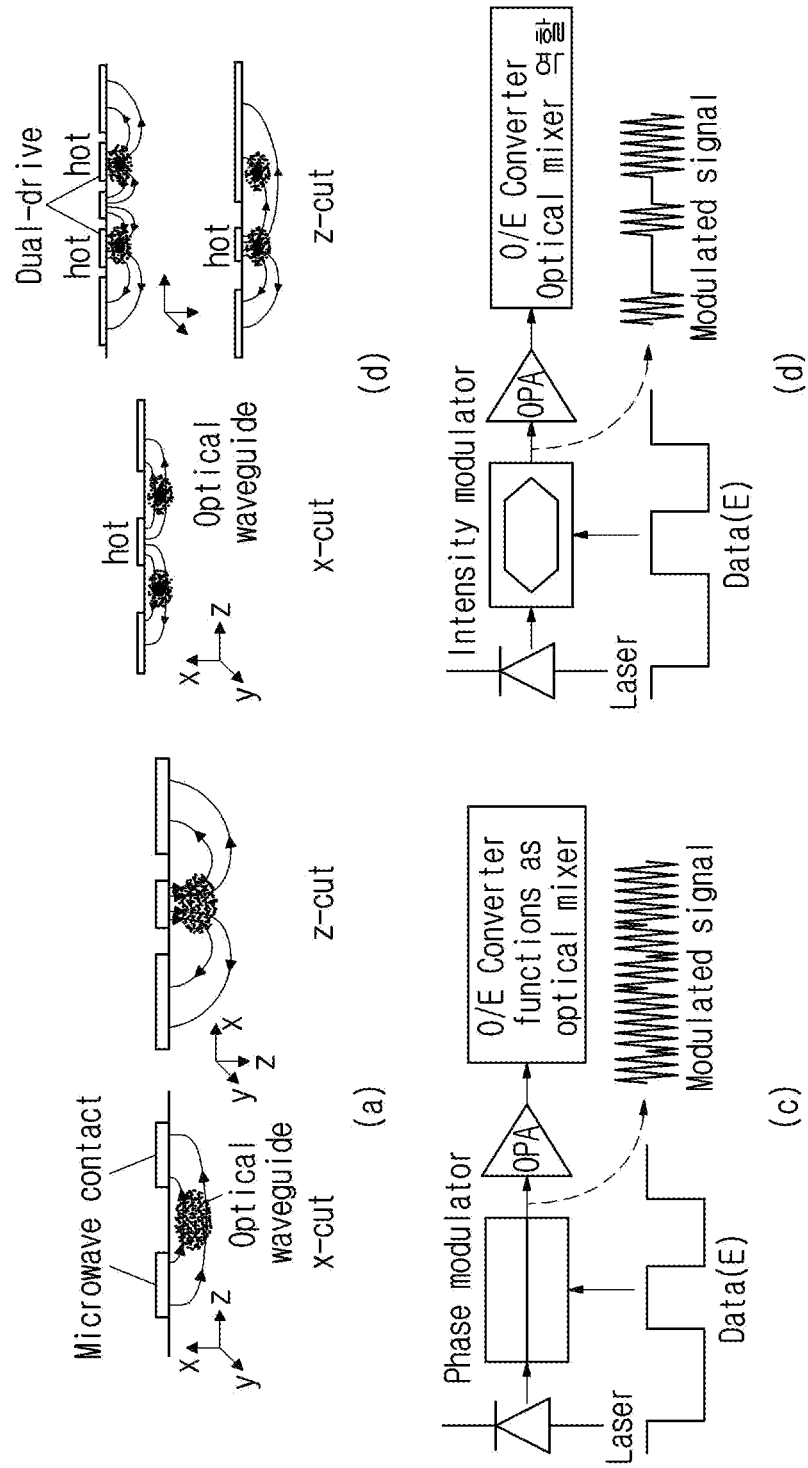
FIG. 22 is a view showing a modulator structure applicable to the present disclosure.

FIG. 21 is a view showing a transmitter structure applicable to the present disclosure. FIG. 22 is a view showing a modulator structure applicable to the present disclosure.

Referring to FIGS. 21 and 22, generally, the optical source of the laser may change the phase of a signal by passing through the optical wave guide. At this time, data is carried by changing electrical characteristics through microwave contact or the like. Thus, the optical modulator output is formed in the form of a modulated waveform. A photoelectric modulator (O/E converter) may generate THz pulses according to optical rectification operation by a nonlinear crystal, photoelectric conversion (O/E conversion) by a photoconductive antenna, and emission from a bunch of relativistic electrons. The terahertz pulse (THz pulse) generated in the above manner may have a length of a unit from femto second to pico second. The photoelectric converter (O/E converter) performs down conversion using non-linearity of the component.

Given THz spectrum usage, multiple contiguous GHz bands are likely to be used as fixed or mobile service usage for the terahertz system. According to the outdoor scenario criteria, available bandwidth may be classified based on oxygen attenuation $10^2$ dB/km in the spectrum of up to 1 THz. Accordingly, a framework in which the available bandwidth is composed of several band chunks may be considered. As an example of the framework, if the length of the terahertz pulse (THz pulse) for one carrier (carrier) is set to 50 ps, the bandwidth (BW) is about 20 GHz.

Effective down conversion from the infrared band to the terahertz band depends on how to utilize the nonlinearity of the O/E converter. That is, for down-conversion into a desired terahertz band (THz band), design of the photoelectric converter (O/E converter) having the most ideal nonlinearity to move to the corresponding terahertz band (THz band) is required. If a photoelectric converter (O/E converter) which is not suitable for a target frequency band is used, there is a high possibility that an error occurs with respect to the amplitude and phase of the corresponding pulse.

In a single carrier system, a terahertz transmission/reception system may be implemented using one photoelectric converter. In a multi-carrier system, as many photoelectric converters as the number of carriers may be required, which may vary depending on the channel environment. Particularly, in the case of a multi-carrier system using multiple broadbands according to the plan related to the above-described spectrum usage, the phenomenon will be prominent. In this regard, a frame structure for the multi-carrier system can be considered. The down-frequency-converted signal based on the photoelectric converter may be transmitted in a specific resource region (e.g., a specific frame). The frequency domain of the specific resource region may include a plurality of chunks. Each chunk may be composed of at least one component carrier (CC).

Figure 23:
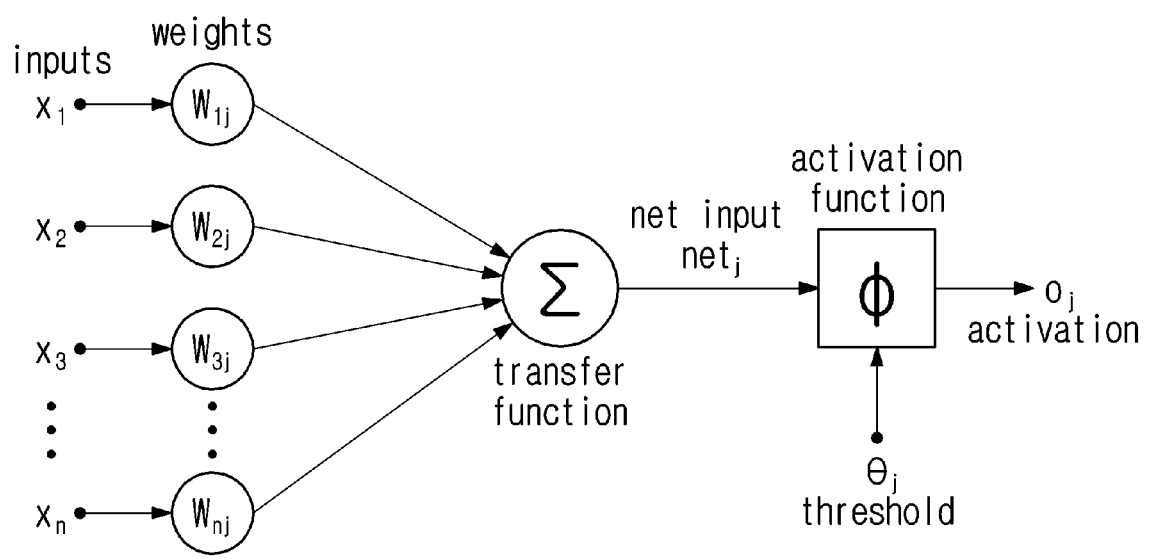
FIG. 23 is a view showing a neural network applicable to the present disclosure.

FIG. 23 is a view showing a neural network applicable to the present disclosure.

As described above, artificial intelligence technology may be introduced in a new communication system (e.g., 6G system). At this time, artificial intelligence may utilize a neural network as a machine learning model modeled after the human brain.

Specifically, a device may process four fundamental arithmetic operations consisting of 0 and 1, and perform operation and communication based on this. At this time, with the development of technology, the device may process many four fundamental arithmetic operations within a faster time and using less power than before. On the other hand, humans cannot perform four fundamental arithmetic operations as fast as devices. The human brain may not have been built solely to process the four fundamental arithmetic operations quickly. However, humans can perform operations such as recognition and natural language processing. At this time, the above-described operation is an operation for processing something beyond the four fundamental arithmetic operations, and the current device cannot perform processing at a level that the human brain can do it. Therefore, it may be considered to create a system so that the device can obtain performance similar to that of a human in areas such as natural language processing and computer vision. Considering the above points, a neural network may be a model made based on the idea of imitating the human brain.

At this time, the neural network may be a simple mathematical model made by the above-described motivation. Here, the human brain may be composed of an enormous number of neurons and synapses that connect them. In addition, depending on how each neuron is activated, an action may be taken by selecting whether other neurons are also activated. The neural network may define a mathematical model based on the above facts.

For example, neurons are nodes, and a synapse connecting neurons may create a network as an edge. At this time, the importance of each synapse may be different. That is, it is necessary to separately define a weight for each edge.

For example, referring to FIG. 23, a neural network may be a directed graph. That is, information propagation may be fixed in one direction. For example, when an undirected edge is given or when the same directed edge is given in both directions, information propagation may occur recursively. Therefore, the results by the neural network may be complicated. For example, the neural network as described above may be a recurrent neural network (RNN). At this time, since RNN has an effect of storing past data, it is recently used a lot when processing sequential data such as voice recognition. Also, a multi-layer perceptron (MLP) structure may be a directed simple graph.

Here, there is no connection between the same layers. That is, there is no self-loop and parallel edge, and there may be an edge only between layers. In addition, there may be an edge only between layers adjacent to each other. That is, in FIG. 23, there is no edge directly connecting a first layer and a fourth layer. For example, if there is no special mention of the layer below, it may be the above-described MLP, but is not limited thereto. In the above case, information propagation may occur only in a forward direction. Accordingly, the aforementioned network may be a feed-forward network, but is not limited thereto.

Also, for example, different neurons may be activated in an actual brain, and the result may be transmitted to the next neuron. In the above-described manner, the resulting value may be activated by a neuron that makes a final decision, and through this, information is processed. At this time, if the above method is changed to a mathematical model, it may be possible to express activation conditions for input data as a function. In this case, the above-described function may be referred to as an activation function.

For example, the simplest activation function may be a function that sums all input data and then compares it with a threshold. For example, when the sum of all input data exceeds a specific value, the device may process information as activation. On the other hand, when the sum of all input data does not exceed the specific value, the device may process information as inactivation.

As another example, the activation function may have various forms. For example, Equation 1 may be defined for convenience of description. At this time, in Equation 1, it is necessary to consider not only the weight w but also the bias, and considering this, it may be expressed as Equation 2 below. However, since the bias b and the weight w are almost the same, only the weight will be considered and described below. However, it is not limited thereto. For example, if $x_0$ with a value of 1 is always added, since $w_0$ becomes a bias, virtual input is assumed, and the weight and the bias may be equally treated through this, and are not limited to the above-described embodiment.

$$t = \Sigma_i w_i x_i \qquad \text{[Equation 1]}$$

$$t = \Sigma_i w_i x_i + b_i \qquad \text{[Equation 2]}$$

The model described above may initially define the shape of a network composed of nodes and edges. Thereafter, the model may define an activation function for each node. In addition, a parameter controlling the model serves as the weight of the edge, and finding the most appropriate weight may be a training goal of the mathematical model. For example, Equations 3 to 6 below may be one form of the above-described activation function, and are not limited to a specific form.

$$\text{Sigmoid function: } f(t) = \frac{1}{1+e^{-t}} \qquad \text{[Equation 3]}$$

$$\text{Tanh function: } f(t) = \frac{1-e^{-t}}{1+e^{-t}} \qquad \text{[Equation 4]}$$

$$\text{Absolute function: } f(t) = \|t\| \qquad \text{[Equation 5]}$$

$$\text{ReLu function: } f(t) = \max(0, t) \qquad \text{[Equation 6]}$$

In addition, for example, when training a mathematical model, it is necessary to assume that all parameters have been determined and check how a neural network interfaces a result. In this case, the neural network may first determine activation of a next layer for given input and determine activation of the next layer according to the determined activation. Based on the above method, the interface may be determined by checking the result of the last decision layer.

Figure 24:
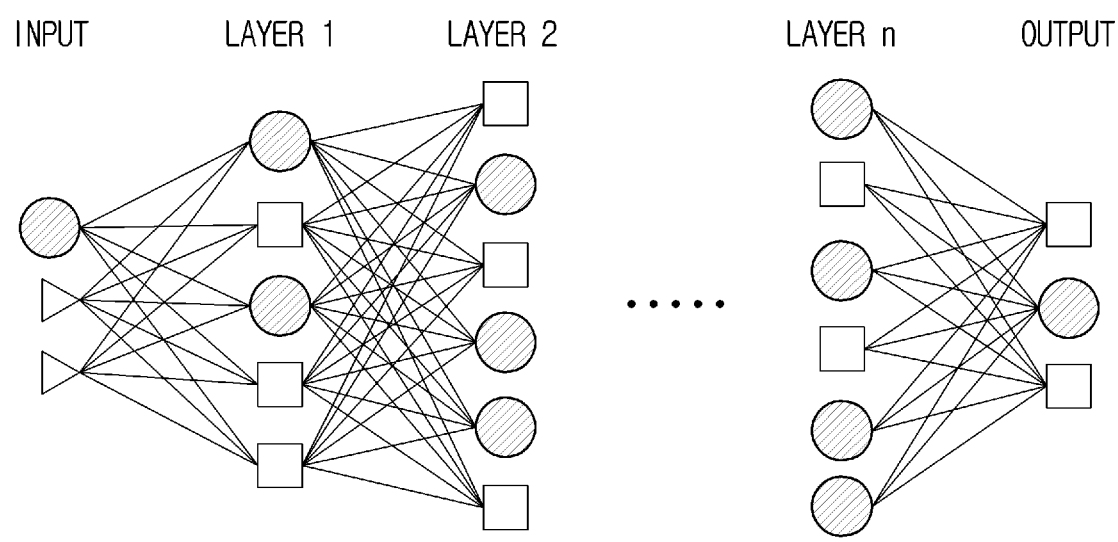
FIG. 24 is a diagram illustrating an activation node in a neural network applicable to the present disclosure.

As an example, FIG. 24 is a diagram illustrating an activation node in a neural network applicable to the present disclosure. Referring to FIG. 24, when classification is performed, as many decision nodes as the number of classes to be classified are created in the last layer, and then one of them is activated to select a value.

Also, as an example, a case in which the activation functions of the neural network are non-linear and the functions are complexly configured while forming layers may be considered. In this case, weight optimization of the neural network may be non-convex optimization. Thus, it may be impossible to find global optimum of the parameters of the neural network. Considering the above points, a method of converging to an appropriate value using a gradient descent method may be used. For example, all optimization problems can be solved only when a target function is defined.

In the neural network, in the last decision layer, a method of minimizing the value by calculating a loss function between actually desired target output and estimated output generated by a current network may be taken. For example, the loss function may be as shown in Equations 7 to 9 below, but is not limited thereto.

Here, a case where d-dimensional target output is defined as "t=[t_1, . . . , t_d]" and estimated output is defined as "x= [x_1, . . . , x_d]" may be considered. In this case, Equations 7 to 9 nifty be loss functions for optimization.

$$\text{Sum of Euclidean loss: } \sum_{i=1}^{d} (t_i - x_i)^2 \quad \text{[Equation 7]}$$

$$\text{Softmax loss: } -\sum_{i=1}^{d} t_i \log \frac{e^{x_j}}{\sum_{j=1}^{d} e^{x_j}} + \quad \text{[Equation 8]}$$

$$(1 - t_i) \log \left(1 - \frac{e^{x_j}}{\sum_{j=1}^{d} e^{x_j}}\right)$$

$$\text{Cross-entropy loss: } -\sum_{i=1}^{d} t_i \log x_i + (1 - t_i) \log(1 - x_i) \quad \text{[Equation 9]}$$

When the above-described loss function is given, a gradient for parameters given with the values may be obtained, and then parameters may be updated using the values.

For example, a back propagation algorithm may be an algorithm that may simply perform gradient calculation using a chain rule. Parallelization may also be facilitated when the gradient of each parameter is calculated based on the above-described algorithm. In addition, memory may be saved through algorithmic design. Thus, the neural network update may use a back propagation algorithm. Also, as an example, there is a need to calculate a gradient for a current parameter in order to use a gradient descent method. At this time, when the network becomes complex, calculation of the value may become complicated. On the other hand, in the back propagation algorithm, a loss is first calculated using the current parameters, and how much each parameter affects the loss may be calculated through a chain rule. Update may be performed based on the calculated value. For example, the back propagation algorithm may be divided into two phases. One may be a propagation phase and the other one may be a weight update phase. At this time, in the propagation phase, an error or a change amount of each neuron may be calculated from a training input pattern. Also, for example, in the weight update phase, the weight may be updated using the previously calculated value. For example, specific phases may be as shown in Table 6 below.

TABLE 6

Phase 1: Propagation
Forward propagation: Output from input training data is calculated, and error in each output neuron is calculated. At this time, since information flows from input —> hidden —> output, it is called 'forward' propagation.
Back propagation: How much the neurons in the previous layer affected the error is calculated by using the weight of each edge for the error calculated in the output neuron. At this time, since the information flows from output —> hidden, it is called 'back' propagation.
Phase 2: Weight update
Gradients of the parameters are calculated using a chain rule. At this time, using the chain rule means that a current gradient value is updated using the previously calculated gradient, as shown in FIG. 25.

Figure 25:
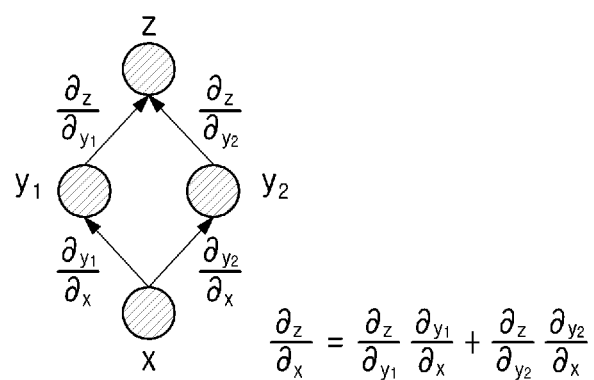
FIG. 25 is a diagram illustrating a method of calculating a gradient using a chain rule applicable to the present disclosure.
Figure 25:
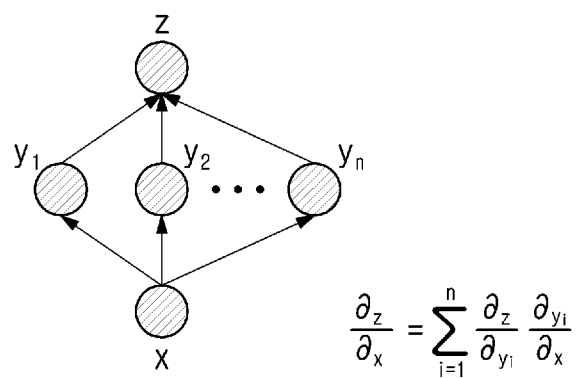

As an example, FIG. 25 is a diagram illustrating a method of calculating a gradient using a chain rule applicable to the present disclosure. Referring to FIG. 25, a method of obtaining $$\frac{\partial z}{\partial x}$$

may be disclosed. At this time, instead of calculating the value, a desired value may be calculated by using $$\frac{\partial z}{\partial y},$$

which is a derivative already calculated in a y-layer, and $$\frac{\partial y}{\partial x},$$

which is related only to the y-layer and x. If a parameter called x' is present under x, $$\frac{\partial z}{\partial x'}$$

may be calculated using $$\frac{\partial z}{\partial x} \text{ and } \frac{\partial x'}{\partial x}.$$

Therefore, what is needed in the back propagation algorithm may be only two values, that is, a derivative of the variable immediately before the parameter to be currently updated and a value obtained by differentiating the immediately previous variable with the current parameter.

The above-described process may be repeated sequentially descending from the output layer. That is, the weight may be continuously updated through the process of "output→hidden k, hidden k→hidden k−1, . . . hidden 2→hidden 1, hidden 1→input". After calculating the gradient, only a parameter may be updated using gradient descent.

However, since the number of input data of the neural network is extremely large, it is necessary to calculate all gradients for all training data in order to calculate accurate gradients. At this time, the values may be averaged to obtain an accurate gradient, and then the update may be performed 'once'. However, since the above method is inefficient, a stochastic gradient descent (SDG) method may be used. At this time, in SGD, instead of performing gradient update by averaging the gradients of all data (this is called a 'full batch'), a 'mini batch' may be formed with some data and only a gradient for one batch may be calculated, thereby updating all parameters. In the case of convex optimization, it may be proven that SOD and GD converge to the same global optimum when certain conditions are satisfied. However, since the neural network is not convex, convergence conditions may change depending on a method of setting a batch.

Complex Valued Neural Networks

A neural network that processes complex numbers may have a number of advantages, such as neural network description or parameter expression. However, in order to use a complex value neural network, there may be points to be considered compared to a real neural network. For example, in the process of updating weights through back propagation, it is necessary to consider constraints on an activation function. As an example, for example, in the case of "sigmoid function $$f(t) = \frac{1}{1+e^{-t}}"$$

in Equation 3, when t is a complex number, in the case of $t=e^{j(2n+1)\pi}$ (n: integer), f(t) becomes 0 and thus is not differentiable. Therefore, activation functions generally used in the real neural network cannot be applied to complex neural networks without restrictions. Moreover, according to "Liouville's theorem", a function which may be differentiated in the complex domain and satisfy a bounded property may be only a constant function, and "Liouville's theorem" may be as shown in Table 7 below.

TABLE 7

Liouville's theorem: every bounded entire function must be constant. That is, every holomorphic function f for which there exists a positive number M such that |f(z)| ≤ M for all z in C is constant Proof) If f is an entire function, it can be represented by Taylor series about 0: f(z) =

$\Sigma_{k=0}^{\infty} \alpha_k z^k$ where $\alpha_k = \frac{f^{(k)}(0)}{k!} = \frac{1}{2\pi j} \oint_{C_r} \frac{f(\zeta)}{\zeta^{k+1}} d\zeta$ and Cr is circle about 0 of radius r > 0. Suppose f is bounded: i.e. there exists a constant M such that |f(z)| ≤ M for all z.

For example, based on Table 7, Equation 10 below may be derived by "Liouville's theorem.

$$|a_k| \leq \frac{1}{2\pi} \oint_{C_r} \frac{|f(\zeta)|}{|\zeta|^{k+1}} |d\zeta| \leq \frac{1}{2\pi} \oint_{C_r} \frac{M}{r^{k+1}} |d\zeta| = \qquad \text{[Equation 10]}$$

$$\frac{M}{2\pi r^{k+1}} \oint_{C_r} |d\zeta| = \frac{M}{2\pi r^{k+1}} 2\pi r = \frac{M}{r^k}$$

Here, if r is set to infinity, it may be "$a_k$=0 for k≥1". Therefore, f(z)=$a_0$. However, it may be meaningless to use a constant function as an activation function of a neural network. Therefore, the characteristics required for the complex activation function f(z) that enables back propagation may be shown in Table 8 below.

TABLE 8

Complex activation function, f(z) = u(x, y) + jv(x, y), properties for backpropagation
f(z) is non-linear in x and y
f(z) is bounded
The partial derivatives, $u_x$, $u_y$, $v_x$ and $v_y$ exist and are bounded
f(z) is not entire
$u_x v_y \neq u_y v_x$ When the above-described characteristics of Table 8 are satisfied, the form of the plurality of the activation function may be as shown in Equation 11 below.

$$f_{C \to C}(z) = f_R(\text{Re}(z)) + j f_I(\text{Im}(z)) \qquad \text{[Equation 11]}$$

where, $f_R$ and $f_I$ may be activation functions such as "sigmoid function", "hyperbolic tangent function" used in the real neural network.

Neural Network Type

Convolution Neural Network (CNN)

CNN may be a type of neural network mainly used in voice recognition or image recognition, but is not limited thereto. CNN is configured to process multi-dimensional array data, and is specialized in processing multi-dimensional arrays such as color images. Therefore, most techniques using deep learning in the field of image recognition may be performed based on CNN. For example, in the case of a general neural network, image data is processed without change. That is, since the entire image is considered as one piece of data and accepted as input, correct performance may not be obtained if the image's location is slightly changed or distorted as above without finding the characteristics of the image.

However, CNN may process an image by dividing it into several pieces rather than one piece of data. Through the above, the CNN may extract the partial features of the image even if the image is distorted, thereby obtaining correct performance. CNN may be defined in terms such as Table 9 below.

TABLE 9

Convolution:
Convolution means that one of two functions f and g is reversed and shifted, and then a result of multiplying it with the other function is integrated. In the discrete domain, summation is used instead of integration.
Channel:
When performing convolution, it means the number of data columns constituting input or output.

TABLE 9-continued

Filter/kernel:
It means a function that performs convolution on input data, and is also called a kernel.
Dilation:
It means a spacing between data when performing convolution with data. In the case of Dilation = 2, one is extracted every two pieces of input data and convolution with the kernel is performed.
Stride:
When performing convolution, it means a spacing to shift the filter/kernel.
Padding:
When performing convolution, it means operation of padding a specific value to the input data, and 0 is usually used.
Feature map:
It means a result output by performing convolution.

Recurrent Neural Network (RNN)

Figure 26:
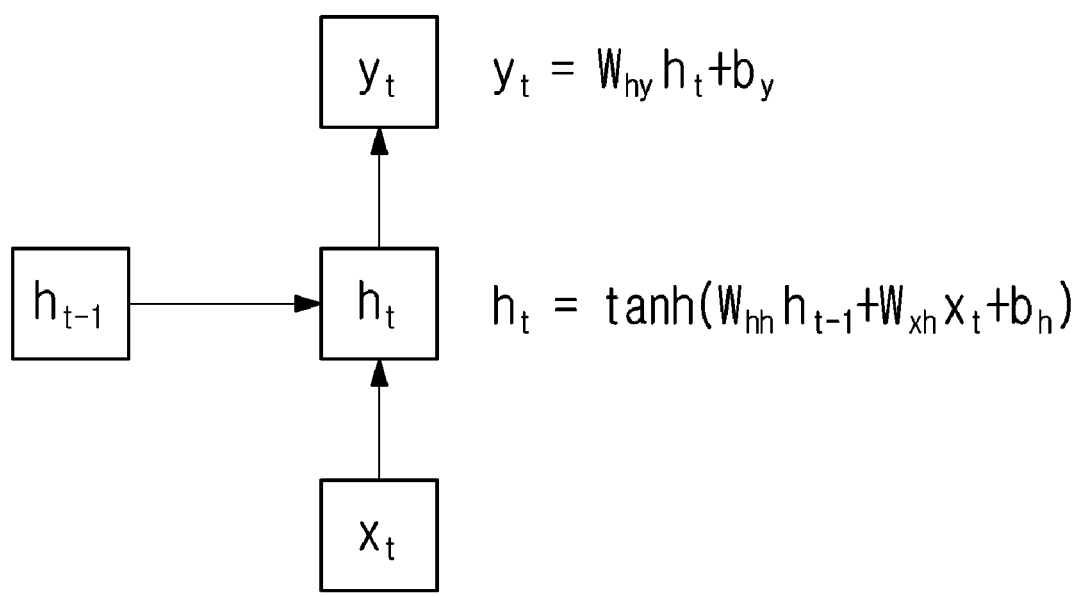
FIG. 26 is a diagram illustrating a learning model based on an RNN applicable to the present disclosure.

FIG. 26 is a diagram illustrating a learning model based on an RNN applicable to the present disclosure. Referring to FIG. 26, RNN may be a type of artificial neural network in which hidden nodes are connected to directed edges to form a directed cycle. For example, RNN may be a model suitable for processing sequentially appearing data such as voice and text. Since RNN is a network structure that may accept inputs and outputs regardless of sequence length, it has the advantage of being able to create various and flexible structures as needed. For example, in FIG. 26, $h_t$ (t=1, 2, . . . ) may be a hidden layer, x may indicate input, and y may indicate output. In RNN, if a distance between relevant information and a point where the information is used is long, the gradient gradually decreases when backpropagation is performed, deteriorating learning ability, which is called a "vanishing gradient" problem. For example, structures proposed to solve the "vanishing gradient" problem may be a long-short term memory (LSTM) and a gated recurrent unit (GRU). That is, RNN may have a structure in which feedback exists compared to CNN.

Autoencoder

Figure 27:
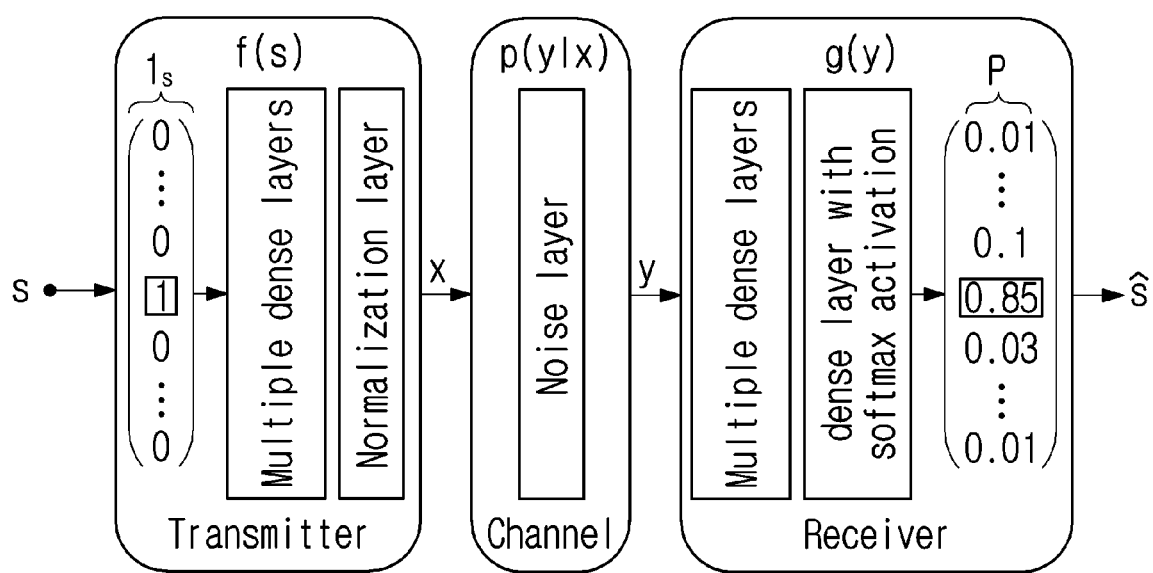
FIG. 27 is a diagram showing an autoencoder applicable to the present disclosure.
Figure 28:
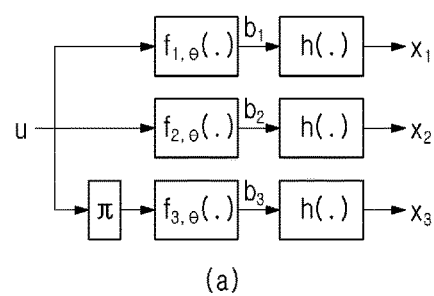
FIG. 28 is a diagram showing a turbo autoencoder applicable to the present disclosure.
Figure 28:
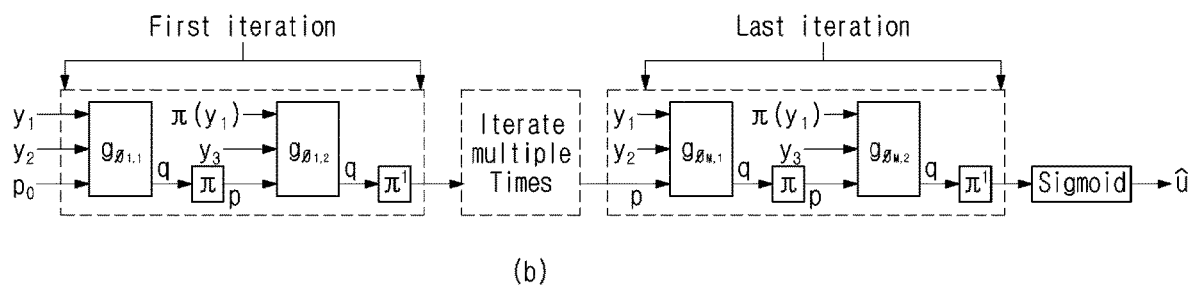
Figure 29:
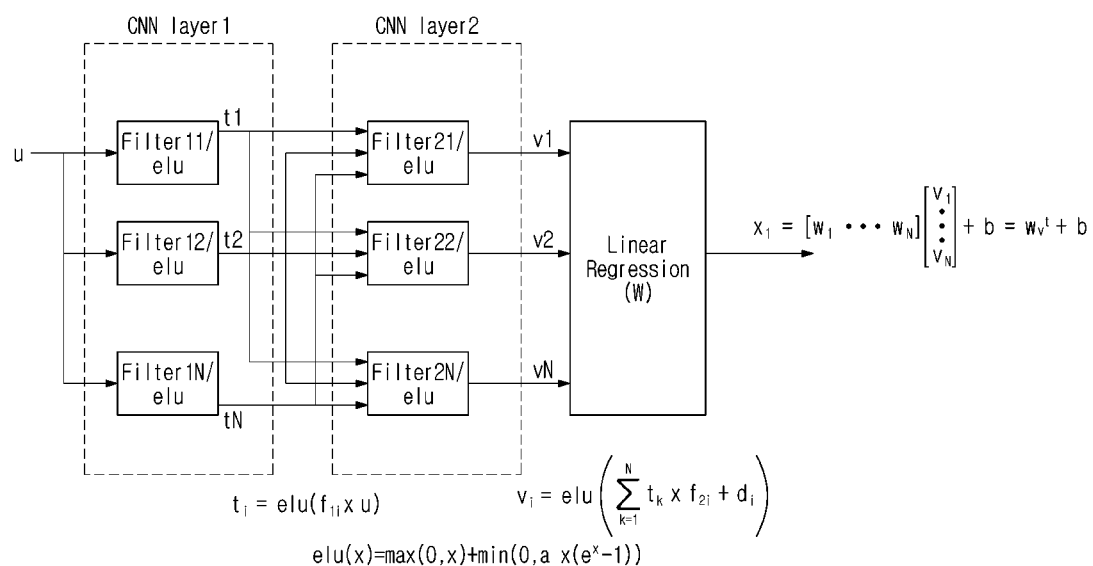
FIG. 29 is a diagram showing a turbo autoencoder applicable to the present disclosure.
Figure 30:
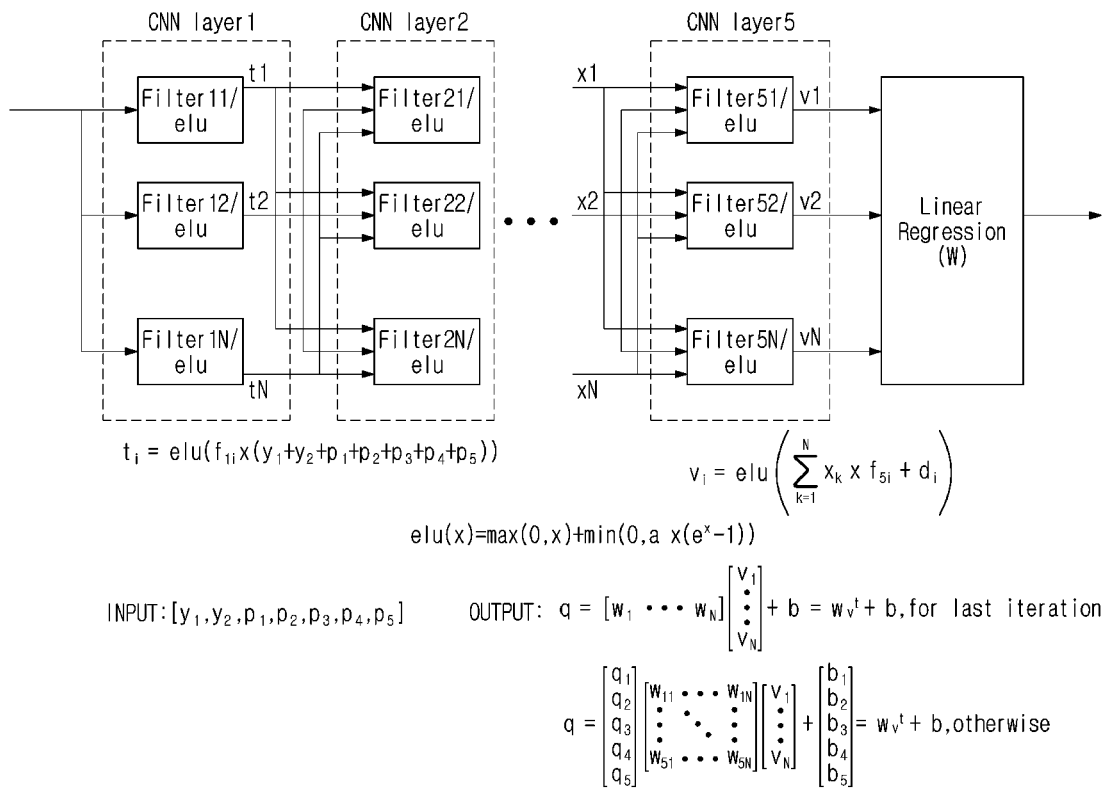
FIG. 30 is a diagram showing a turbo autoencoder applicable to the present disclosure.

FIG. 27 is a diagram showing an autoencoder applicable to the present disclosure. FIGS. 28 to 30 are diagrams illustrating turbo autoencoders applicable to the present disclosure. Referring to FIG. 27, various attempts have been made to apply a neural network to a communication system. At this time, as an example, an attempt to apply a neural network to a physical layer may focus mainly on optimizing a specific function of a receiver. As a specific example, when a channel decoder is configured with a neural network, performance of the channel decoder can be improved. As another example, when a MIMO detector is implemented by a neural network in a MIMO system having a plurality of transmit/receive antennas, the performance of the MIMO system can be improved.

As another example, an autoencoder method may be applied. At this time, the autoencoder may be a method of improving performance by configuring both a transmitter and a receiver with a neural network and performing optimization from an end-to-end perspective and may be configured as shown in FIG. 27.

At this time, as an example, referring to FIG. 27, the complexity of the autoencoder structure may increase exponentially as an input data block size K increases. This may be a "curse of dimensionality" problem. In the case of designing a transmitter as described above, a problem may occur due to complexity. Considering the above problems, a turbo autoencoder (turbo AE) may be used, and encoders and decoders of the turbo AE may be as shown in FIGS. 28 to 30 below.

Specifically, FIG. 28(a) may show a neural encoder, and FIG. 28(b) may show a neural decoder. In this case, FIG. 28(a) may show an encoder structure with a code rate of 1/3. Also, $f_{i,\theta}$ may represent a neural network, and h( ) may represent a power constraint. At this time, in FIG. 28(a), data input (u) may be copied and processed based on $f_{1,\theta}$, $f_{2,\theta}$ and $f_{3,\theta}$, respectively. At this time, input to $f_{3,\theta}$ may be interleaved and applied. After that, the neural encoder may derive each encoded value after performing power constraint. That is, FIG. 28(a) may show an encoder structure with a code rate of 1/3. In this case, input itself is input to $f_{1,\theta}$ and $f_{2,\theta}$ and is input to $f_{3,\theta}$ after being interleaved, which may be similar to a turbo code. Considering the above points, FIG. 28(a) may show a turbo autoencoder (turbo AE).

Next, as an example, FIG. 28(b) may show a neural decoder structure. Here, referring to FIG. 28(b), a method similar to an iterative decoding method of a turbo decoder may be applied to the neural decoder. That is, the neural decoder may perform iterative decoding. In this case, each iterative decoding may be composed of two sub-decoders. Here, $g_{0_{i,j}}$ may mean a j-th sub-decoder in i-th iterative decoding. For example, since the neural decoder processes binary data, a dimension problem may not occur. Therefore, transmission can be performed even if an input size is large.

Also, as an example, FIG. 29 may be a diagram illustrating a neural encoder using a CNN. For example, referring to FIG. 29, the neural encoder is composed of two CNN layers, and an activation function may be implemented as an "elu function", but this is only one example and may be implemented in other ways.

Also, as an example, FIG. 30 is a diagram illustrating a neural decoder using a CNN. Referring to FIG. 30, the neural decoder may be composed of five CNN layers. In addition, an activation function may be implemented as an "elu function" in the same way as the neural encoder, but this is only one example and may be implemented in other ways.

In the above-described FIGS. 28 to 30, the autoencoder is a neural encoder and "{1, −1}" may be assumed as input. For example, a binary value (u in FIG. 29) may be converted into "{1, −1}" when input to an autoencoder. After that, the neural network may continuously perform learning, and an optimization value may be found while $f_{i,\theta}$ and $g_{0_{i,j}}$ are updated. After that, the neural network may extract $x_1$, $x_2$ and $x_3$ from the binary values with the derived $f_{i,\theta}$ and transmit them through the channel After that, the neural network may perform decoding through the derived $g_{0_{i,j}}$.

Here, as an example, considering that modulation is performed on $x_1$, $x_2$ and $x_3$ described above, it may be considered that $x_1$, $x_2$ and $x_3$ are grouped, mapped to one constellation point, and transmitted. However, as described above, since neural network input may be "{1, −1}", the values of $x_1$, $x_2$ and $x_3$ may be real values rather than binary values. In addition, as described above, since the neural network performs learning, even when $x_1$, $x_2$ and $x_3$ are grouped and mapped to one constellation point, the weight in the neural network may be affected, which may be undesirable.

Here, for example, when a channel condition is good, in the existing communication system, a plurality of bits may be mapped to one modulation symbol and transmitted, such as in higher order modulation. Through this, the existing communication system could be able to increase spectral efficiency. However, as described above, the weight value of the neural network may be a real number, and the output value of the neural encoder may also be a real number. Therefore, it may be difficult to apply higher order modulation of the existing communication system.

For example, when expressing a symbol in an existing communication system (e.g., LTE, NR), it could be expressed as a complex number. (e.g., QPSK, 16QAM) That is, one symbol may be implemented in the complex plane, and transmission based on this may be performed. In this case, as described above, when an activation function is applied based on a neural network, there are cases in which the activation function is not differentiable, and back propagation may not be performed because the activation function is not differentiable, so that weight values may not be updated. Therefore, since there may be limitations in applying the above-described neural network in a communication system using symbols represented by complex numbers, a method for applying the neural network may be required, which will be described below.

The matters disclosed below may be equally applied to at least one or more of a terminal (user equipment; UE) and a base station. In addition, as an example, the matters disclosed below may be applied to the devices disclosed in FIGS. 4 to 9, and are not limited to specific embodiments. However, in the following, the present disclosure is described based on the terminal for convenience of description, but may not be limited thereto.

As a specific example, the output terminals (e.g., $x_1$, $x_2$ and $x_3$) of the neural encoder may have limitations considering the case where learning is performed as described above. To this end, the terminal may perform encoding using one real neural network and perform transmission. More specifically, higher order modulation has limitations in applying to the neural encoder output, as described above. Therefore, as a step before inputting information to the neural encoder, the terminal may perform a mapping process considering a higher order modulation method with respect to the input of the neural encoder. For example, the terminal may group a plurality of input bits and perform mapping based on a method of mapping to a plurality of amplitude levels.

As a specific example, a case of grouping two input bits may be considered. At this time, an input pattern of {00, 01, 11, 10} may occur with respect to two input bits. At this time, the terminal may map the above-described input pattern of {00, 01, 11, 10} to {−1, −1/3, 1/3, 1} and use it as input of the neural encoder. That is, the input of the neural encoder may be {−1, −1/3, 1/3, 1} instead of the aforementioned {−1, 1}. Through this, there may be four inputs and two bits may be expressed.

When the terminal groups n input bits, the input pattern may be $\{a_1, a_2, \ldots, a_{2^n}\}$. In this case, $a_k \in [-A, A]$, $a_k \leq a_{k+1}$. Here, A may be a real number. That is, since the real neural network should be used as described above, A may be set to a real number.

In this case, for example, when grouping input bits, an input bit string may differ by only 1 bit like gray encoding. For example, gray encoding may be an encoding method in which consecutive numbers differ by only one bit. That is, an input bit string corresponding to $a_k$ and $a_{k+1}$ may differ by only 1 bit. Also, as an example, the input level $a_k$ of the neural encoder may be set in a uniform spacing manner. Also, as an example, the input level $a_k$ of the neural encoder may be set in a non-uniform spacing manner, which may be shown in Table 10 below.

Here, as an example, Table 11 below may show a case where the A value is 1 at uniform spacings when the input bits are 2 bits or 3 bits. At this time, the input levels between $a_k$ and $a_{k+1}$ may be set at uniform spacings as shown in Table 11 below. However, this is just one example, and the input bits may be set differently, and is not limited to the above-described embodiment.

As another example, in the case of having a method having a non-uniform spacing, the input level may be determined based on a prime value divisible only by 1 and itself. For example, in the case of n=4, considering prime numbers 1, 2, 3, 5, 7, 11, 13, and 17, input level may be determined to be "−17/17, −13/17, −11/17 . . . −2/17, −1/17, 1/17, 2/17 . . . 11/17, 13/17, 17/17". That is, input levels may be discriminated at non-uniform spacings, and computational efficiency can be increased in a neural encoder based on the above. However, the above is only one example, and may not be limited thereto.

TABLE 10

Uniform spacing:
$a_{k+1} - a_k = c$, c is a constant
Non-uniform spacing :
How the value of $a_{k+1} - a_k$ is not equal depending on the value of k

TABLE 11

| Input bit grouping (n) | n = 2 | n = 3 |
|---|---|---|
| Uniform mapping | 00: −1, | 000: −1 |
| | 01: −1/3 | 001: −5/7 |
| | 11: 1/3, | 011: −3/7 |
| | 10: 1 | 010: −1/7 |
| | | 110: 1/7 |
| | | 111: 3/7 |
| | | 101: 5/7 |
| | | 100: 1 |

When the neural encoder is implemented by a CNN, the number of CNN input channels of the first layer among the CNNs composed of a plurality of layers may be set as the number of input bit groupings. In this case, it may be preferable to use softmax as the activation function of the neural decoder output layer.

Also, as an example, a case where the terminal performs retransmission may be considered. Here, a case in which the number of input bit groupings transmitted by the terminal is changed for each transmission may be considered. More specifically, in an existing communication system, a channel decoder input terminal as a receiver performed decoding by applying a method of combining existing transmission and retransmission. At this time, as an example, as described above, when the terminal performs transmission based on the neural encoder, it may be difficult for the channel decoder input terminal as the receiver to properly perform decoding because the number of input bit groupings is changed for each transmission. As a specific example, the terminal may perform transmission using only one bit because the channel condition is not good in the first transmission. On the other hand, in the second transmission, the channel condition is improved, so that two bits may be grouped and transmitted. However, this is only one example and is not limited to the above-described embodiment.

In this case, when the number of input bit groupings is changed for each transmission, the neural decoders may be configured in different ways. Therefore, a method of performing combining on decoded bits by a channel decoder input terminal as a receiver may be required.

For example, if the number n of input bit groupings is 2 or more, the neural decoder may generate output through a soft max activation function that allows one of $2^n$ activation functions to be selected. At this time, when the neural decoder uses the soft max activation function, the neural decoder may extract an LLR (Log Likelihood Ratio) value for the bits from a symbol containing n bits and perform bit-level combining. At this time, since the soft max activation function expresses the probability of output, the method for extracting the LLR value may be as shown in Equation 12 below.

$$z_i = \max_{m \in S_i} z_m - \max_{m \in \overline{S}_i} z_m \qquad \text{[Equation 12]}$$

Here, $z_m$ may be output of a soft max activation function. In addition, $S_i$, $\overline{S}_i$ may mean an output set in which an i-th bit is 0 and 1. As a specific example, when n=2, if $z_1$, $z_2$, $z_3$, and $z_4$ are soft max outputs for 00, 01, 11, and 10, LLR for the first bit may be calculated using $S_1=\{z_1, z_2\}$ and $\overline{S}_1=\{z_3, z_4\}$. In addition, LLR for the second bit may be calculated using $S_2=\{z_1, z_4\}$ and $\overline{S}_2=\{z_2, z_3\}$.

At this time, the value for the previous transmission received by the neural decoder may also be an LLR value for the bit, and when this is combined with the retransmission value, an LLR value considering the retransmission value may be derived, and combining may be performed.

Here, in the case of transmission in which the number of input bit groupings is the same, a channel decoder input terminal as a receiver may combine signals. That is, since the number of input bit groupings is the same, combining may be performed at the channel decoder input terminal before performing decoding for the neural decoder as described above. As another example, a soft max activation function input terminal as a receiver may perform combining. That is, when the number n of bit groupings is the same, the input terminal of the neural decoder or the input terminal of the activation function may perform combining, and decoding performance may be improved through this.

On the other hand, when the number n of bit groupings is different, as described above, an LLR value may be derived based on a value output from an output terminal of a neural decoder, and it may be compared with an existing transmission value and combined.

For example, in consideration of the above-described operation, the terminal and the base station may determine whether to change the number n of bit groupings. As an example, it is described based on a terminal, but this may be equally applied to a base station. Here, the terminal may perform transmission to the base station based on the case where the number n of bit grouping is applied. At this time, the base station may detect a failure of the transmitted data and transmit information on retransmission to the terminal. For example, the terminal may dynamically change the number n of bit groupings based on information on retransmission transmitted by the base station and perform retransmission. As another example, when the terminal performs retransmission based on a transmission failure from the base station, the terminal may perform retransmission by setting the number n of bit groupings to be the same regardless of retransmission information. As another example, the base station may transmit information on whether the number n of bit groupings is changed to the terminal through retransmission information. For example, the base station may instruct to change the number n of bit groupings based on retransmission information. As another example, the base station may set the number n of bit groupings to be the same through retransmission information, but is not limited to the above-described embodiment.

Figure 31:
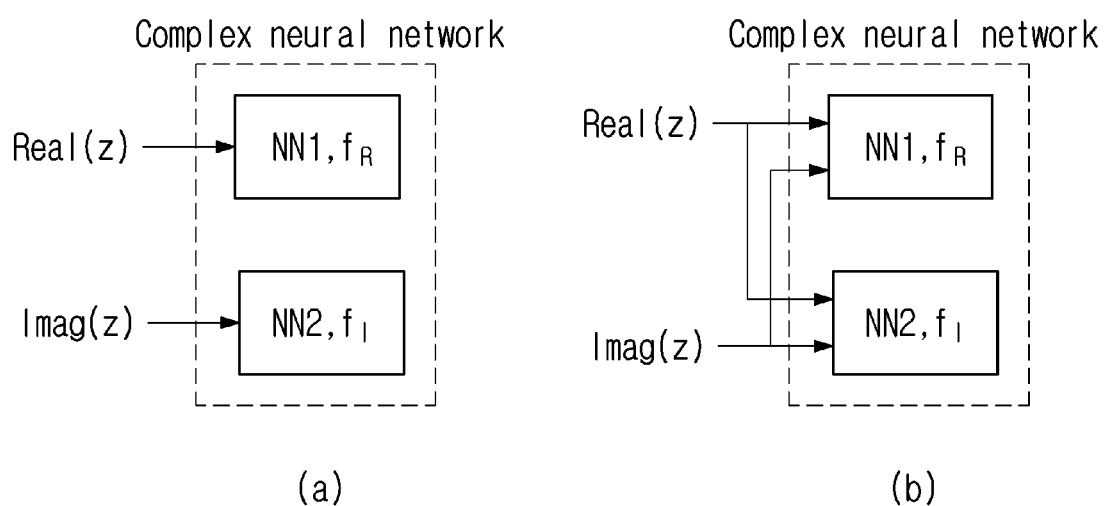
FIG. 31 is a diagram illustrating a complex neural network applicable to the present disclosure.

FIG. 31 is a diagram illustrating a complex neural network applicable to which the present disclosure. As another example, a case where the neural network is a complex neural network may be considered. At this time, referring to FIG. 31, in case of using multiple neural networks, NN1 and NN2 may be real neural networks constituting the multiple neural networks, and $f_R$ and $f_I$ may refer to activation functions of NN1 and NN2.

At this time, as an example, the activation function may independently process the real part and the imaginary part of an input signal. Also, activation may be performed based on Equation 13 below.

More specifically, when the activation function independently processes the real part and the imaginary part of the input signal z, the neural encoder may group n input bits. Then, the neural encoder may allocate n/2 input bits to the real part and n/2 input bits to the imaginary part. Then, each of the n/2 input bits may be mapped so that it is $a_k \in [-A, A]$, $a_k \leq a_{k+1}$ based on Table 11 described above. At this time, as an example, considering the above point, n may be an even number, but is not limited thereto.

$$f_{C \to C}(z) = f_R(\text{Re}(z)) + jf_I(\text{Im}(z)) \qquad \text{[Equation 13]}$$

That is, when the neural network operates based on the above, the size of the real neural network may be doubled. That is, it may be equivalent to processing input data through a real neural network whose size is doubled. That is, as shown in FIG. 31(a), the complex neural network may operate independently by separating the real part and the imaginary part and allocating n/2 input bits to each part. For example, when mapping is performed on bits allocated to the real part and the imaginary part, the neural network may determine the level of the neural encoder input at uniform spacings or non-uniform spacings as described above, which is shown in Table 11.

As another example, an input level method for the real part and a level input method for the imaginary part may be determined differently. For example, the input level method for the real part may be set at uniform spacings, and the input level for the imaginary part may be set at non-uniform spacings. Also, as an example, the input level method for the real part may be set at non-uniform spacings, and the input level for the imaginary part may be set at uniform spacings. Also, both the real part and the imaginary part may be set at uniform spacings. Also, the real part and the imaginary part may be set at non-uniform spacings, and are not limited to the above-described embodiment.

As another example, the A values for the real part and the imaginary part may also be set differently, and is not limited to the above-described embodiment.

At this time, as an example, gray encoding may be applied to the real part and the imaginary part so that a difference of 1 bit may be made between adjacent levels, but is not limited to the above-described embodiment.

Also, as an example, Table 12 below may show an input level of a neural encoder for input bit grouping. For example, when n=2, input based on 1-bit grouping may be performed independently for the real part and the imaginary part, and operation of the neural encoder is as described above.

As another example, when n=4, 2-bit grouping may be performed independently the real part and the imaginary part, respectively, and the operation of the neural encoder is as described above.

TABLE 12

| Input bit grouping (n) | n = 2 | | n = 4 | |
| --- | --- | --- | --- | --- |
| | Real | Imaginary | Real | Imaginary |
| Uniform mapping | 0: −1<br>1: 1 | 0: −1<br>1: 1 | 00: −1,<br>01: −1/3<br>11: 1/3,<br>10: 1 | 00: −1,<br>01: −1/3<br>11: 1/3,<br>10: 1 |

As another example, in the case of using a complex neural network, the activation function may be processed by separating the real part and the imaginary part of the input signal, and activation may be performed based on Equation 13 described above.

Specifically, input of the neural encoder may be mapped to a complex number and processed by a complex neural network. For example, when n=2, the input pattern may be {00, 01, 11, 10}. At this time, the input pattern {00, 01, 11, 10} may be mapped to the complex plane as {−1−j, −1+j, 1+j, 1−j}, and Table 13 below shows input mapping of the neural encoder when n=2 and n=4.

Here, referring to FIG. 31(*b*), when the input signal of the neural encoder is z and the weight is w, input of the activation function $f_R(\text{Re}(z))$ is Re(z)*Re(w)−Im(z)*Im(w). On the other hand, input of $f_I(\text{Im}(z))$ may be Re(z)*Im(w)+Im(z)*Re(w).

TABLE 13

| Input bit grouping (n) | n = 2 | n = 4 | |
| --- | --- | --- | --- |
| Uniform mapping | 00: −1 − j<br>01: −1 + 1<br>11: 1 + 1<br>10: 1 − j | 0000: −1 − j<br>0001: −1 − 1/3j<br>0011: −1 + 1/3j<br>0010: −1 + j<br>0100: −1/3 − j<br>0101: −1/3 − 1/3j<br>0111: −1/3 + 1/3j<br>0110: −1/3 + j | 1100: 1/3 − j<br>1101: 1/3 − 1/3j<br>1111: 1/3 + 1/3j<br>1110: 1/3 + j<br>1000: 1 − j<br>1001: 1 − 1/3j<br>1011: 1 + 1/3j<br>1010: 1 + j |

Based on the foregoing, FIG. 31(*a*) may show a method of independently processing the real part and the imaginary part in the complex neural network, and each processing method may be the same as the real neural network method. That is, a double-sized real neural network method may be applied. On the other hand, in FIG. 31(*b*), actual complex values may be allocated to each activation function as input values in the complex neural network, and this may be a method of actually processing them.

As another example, an existing autoencoder may have a structure that transmits output of a neural encoder over a channel That is, an autoencoder may be designed to transmit real values over a channel. In this case, for example, when 2 symbols of neural encoder output are mapped to 1 symbol having a complex value, spectral efficiency can be increased. For example, output of an encoder output as a real value may be sequentially grouped into 2 symbols and mapped to 1 symbol. As a more specific example, all odd values of output of the encoder may correspond to the real part, and all even values may correspond to the imaginary part. Also, for example, it may be possible for all odd values of output of the encoder to correspond to the imaginary part and all even values to correspond to the real part, which is not limited to the above-described embodiment.

In the above case, the complex value may be transmitted in an I branch, which is the real part of the symbol, and the imaginary part may be mapped to a Q branch and transmitted. At this time, the neural decoder may perform neural network decoding in the same way as the method using the activation functions described above after separating the I/Q. That is, the neural network may input the I branch signal and the Q branch signal to the neural decoder as shown in FIG. 31(*a*) described above. In addition, the neural network may input both the I branch signal and the Q branch signal to a real neural network and apply them separately from activation input. Also, as an example, the neural network may input the I branch signal and the Q branch signal to the neural decoder as shown in FIG. 31(*b*) described above. That is, the neural network may configure the I branch signal and the Q branch signal as inputs to the complex domain and process them through the complex neural network, but is not limited to the above-described embodiment.

Also, as an example, referring to FIG. 28(*a*), a case where a code rate of turbo AE is 1/2 and an input size is 3 may be considered. At this time, the case where the filter size of the CNN constituting the turbo AE is 2 and the interleaving pattern is as shown in Equation 14 below may be considered.

$$\text{INT}[v1, v2, v3] = [v3, v1, v2] \quad \text{[Equation 14]}$$

At this time, when considering a neural encoder implemented by a 2-layer CNN as shown in FIG. 29 as a case of constructing a constellation of the complex domain, output of the first layer and output of the second layer to obtain xi (i=1, 2) of codeword [x1, x2] may be as shown in Table 14 below. Also, Table 15 may show possible outputs of neural encoders according to combinations of input data. For example, one padding '0' may be added before and after the input data block, but is not limited thereto.

TABLE 14

| First layer | (0, 0): fi1 |
| --- | --- |
| | (0, 1): fi2 |
| | (1, 0): fi3 |
| | (1, 1): fi4 |
| Second layer | (fi1, fi1): gi1 |
| | (fi1, fi2): gi2 |
| | (fi2, fi3): gi3 |
| | (fi2, fi4): gi4 |
| | (fi3, fi1): gi5 |
| | (fi3, fi2): gi6 |
| | (fi4, fi3): gi7 |
| | (fi4, fi4): gi8 |

TABLE 15

| Input data | Layer 1 output | Layer 2 output | Interleaved input | Layer 2 output |
|---|---|---|---|---|
| 00000 | (fi1, fi1, fi1, fi1) | (gi1, gi1, gi1) | 00000 | (gi1, gi1, gi1) |
| 00010 | (fi1, fi1, fi2, fi3) | (gi1, gi2, gi3) | 01000 | (gi3, gi5, gi1) |
| 00100 | (fi1, fi2, fi3, fi1) | (gi2, gi3, gi5) | 00010 | (gi1, gi2, gi3) |
| 00110 | (fi1, fi2, fi4, fi3) | (gi2, gi4, gi7) | 01010 | (gi3, gi6, gi3) |
| 01000 | (fi2, fi3, fi1, fi1) | (gi3, gi5, gi1) | 00100 | (gi2, gi3, gi5) |
| 01010 | (fi2, fi3, fi2, fi3) | (gi3, gi6, gi3) | 01100 | (gi4, gi7, gi5) |
| 01100 | (fi2, fi4, fi3, fi1) | (gi4, gi7, gi5) | 00110 | (gi2, gi4, gi7) |
| 01110 | (fi2, fi4, fi4, fi3) | (gi4, gi8, gi7) | 01110 | (gi4, gi8, gi7) |

In addition, as an example, based on Table 15, codewords [x1 (1), x2 (1), x1 (2), x2 (2), x1 (3), x2 (3)] may be expressed as shown in Table 16 below. In this case, xi(k) (i=1, 2, k=1,2,3) may represent the i-th codeword element for k-th input data.

TABLE 16

| Input data | Codeword [x1(1), x2(1), x1(2), x2(2), x1(3), x2(3)] | Complex domain symbol |
|---|---|---|
| 00000 | [g11, g21, g11, g21, g11, g21] | [g11 + g21j, g11 + g21j, g11 + g21j] |
| 00010 | [g11, g23, g12, g24, g13, g21] | [g11 + g23j, g12 + g24j, g13 + g21j] |
| 00100 | [g12, g21, g13, g22, g15, g23] | [g12 + g21j, g13 + g22j, g15 + g23j] |
| 00110 | [g12, g23, g14, g26, g17, g23] | [g12 + g23j, g14 + g26j, g17 + g23j] |
| 01000 | [g13, g22, g15, g23, g11, g25] | [g13 + g22j, g15 + g23j, g11 + g25j] |
| 01010 | [g13, g24, g16, g27, g13, g25] | [g13 + g24j, g16 + g27j, g13 + g25j] |
| 01100 | [g14, g22, g17, g24, g15, g27] | [g14 + g22j, g17 + g24j, g15 + g27j] |
| 01110 | [g14, g24, g18, g28, g17, g27] | [g14 + g24j, g18 + g28j, g17 + g27j] |

FIG. 31 is a diagram illustrating a method of mapping a plurality of input bits to a filter, which is applicable to the present disclosure.

Referring to FIG. 29 described above, the neural encoder may be composed of a CNN composed of a plurality of filters. In this case, the multiplexed inputs may be filter inputs. Here, the neural encoder may encode a plurality of input data bits into codeword elements [x1, x2, x3]. Accordingly, spectral efficiency may be increased based on the foregoing. Here, as an example, a case where a plurality of bits is used as inputs of N filters in k groups may be considered.

Figure 32:
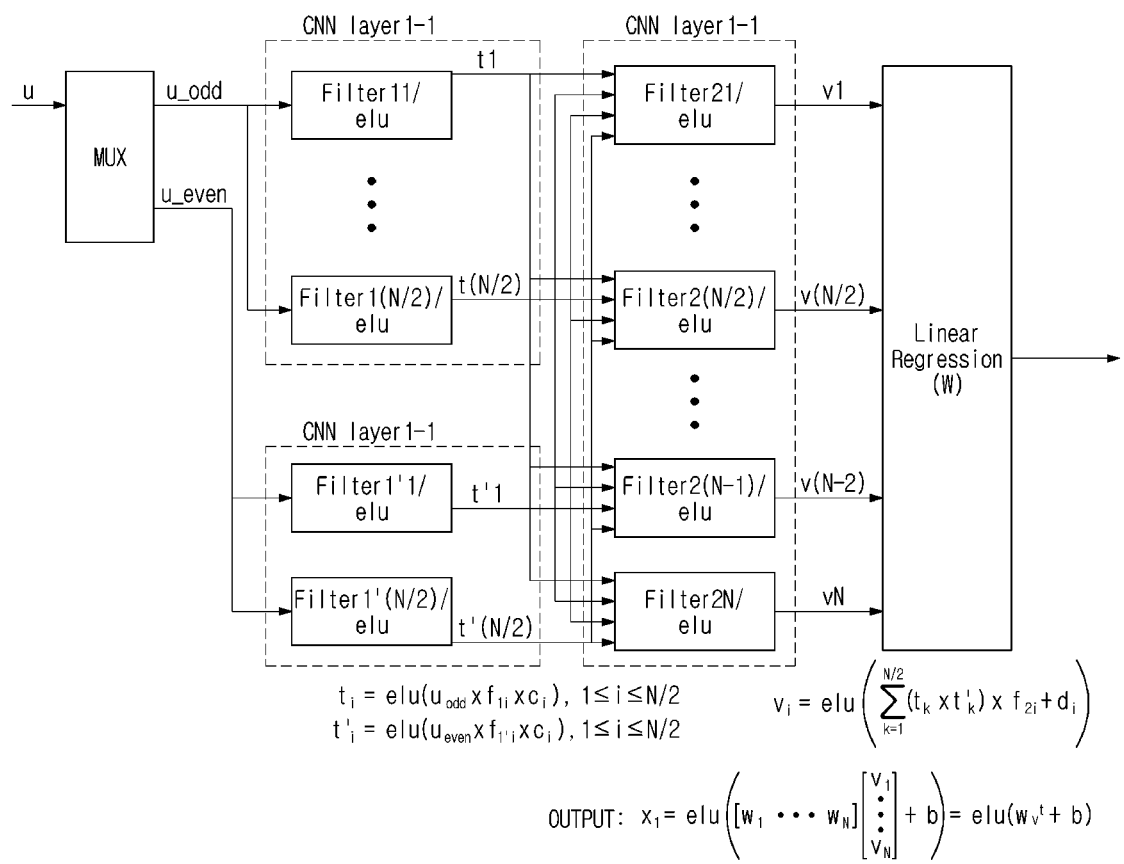
FIG. 32 is a diagram illustrating a filter configuration applicable to the present disclosure.

For example, a plurality of bits may be input as evenly as possible to N filters. That is, N filters may be divided into k groups and 1-bit input may be provided for each group. As a specific example, FIG. 32 is a diagram illustrating a filter configuration applicable to the present disclosure. Referring to FIG. 32, when k=2 and N=100, filters may be divided into groups G1 and G2 by 50. At this time, data corresponding to odd indices of input data u=[u1, . . . , uK] may be allocated to G1, and data corresponding to even indices may be allocated to G2.

As another example, data may be input to mk<N (m being a natural number) filters among N filters. As a specific example, when k=2, m=4, and N=100, filters may be divided into two groups G1 and G2 by four. At this time, data corresponding to odd indices of input data u=[u1, . . . , uK] may be input to G1, and data corresponding to even indices may be input to G2. For example, known bits (e.g., all zero) may be input to the remaining filters.

As another example, when k=3, the filter may be divided into three groups G1, G2 and G3. At this time, data corresponding to 2n−1 (n=1, 2, . . . ) indices among input data u=[u1, . . . , uK] is input to G1 and data corresponding to 2n indices is input to G2, and data corresponding to 2n+1 (n=1, 2, . . . ) indices may be input to G3. In addition, as an example, the same may be applied even when the k value increases, and is not limited to the above-described embodiment.

As another example, when an input channel is allocated to a CNN layer, the input channel may be set to a number greater than 1. That is, since the input channels of the CNN layer are set to a number greater than 1, an input bit string corresponding to the number of channels may be simultaneously input, and a plurality of bits may be mapped through this.

As another example, as described above, a case in which the neural network is composed of a real neural network and a case in which the neural network is composed of a complex neural network may be distinguished. In addition, when the neural network is composed of a complex neural network, the complex neural network includes two real neural networks and may respectively process the real part and the imaginary part of the input data, as described above. Also, for example, when the neural network is composed of a complex neural network, the complex neural network may process input data by mapping it to a complex plane, as described above.

At this time, as an example, when the neural network is a complex neural network, the size of the neural network may increase more than when the neural network is a real neural network, and thus the complexity of the terminal may increase. Considering the above points, the base station may signal a method of increasing spectral efficiency to the terminal.

For example, the base station and the terminal may design a channel quality indicator (CQI) table and a modulation coding scheme (MCS) table in consideration of frequency efficiency and perform communication. Here, when the above-described neural network is applied, since there are other methods capable of obtaining the same frequency efficiency, the method of expressing the CQI table and the MCS table may also be different. Considering the above points, the CQI table and the MCS table may be designed in a manner based on a real neural network. As another example, the CQI table and the MCS table may be designed in a manner based on a complex neural network. Here, the CQI table and the MCS table may be designed in a manner based on two real neural networks as a method based on a complex neural network. Also, as an example, the CQI table and the MCS table may be designed based on a case in which input data is expressed on a complex plane as a method based on a complex neural network.

As another example, the CQI table and the MCS table may be designed differently for each entity. In addition, as an example, the base station may design the CQI table and the MCS table based on at least one of the above-described methods, and set information on this to the terminal through higher layer signaling, but is not limited to the above-described examples.

As another example, terminals may have different capabilities regarding whether to perform encoding based on the above-described neural network. For example, when the terminal has the above-described neural network based on artificial intelligence, the terminal may encode input data through the above-described neural network. On the other hand, a legacy UE may not have the above-described neural network based on artificial intelligence. In this case, the terminal may perform encoding using a neural network on input data based on an existing method and transmit data. That is, an encoding scheme using a neural network for input data may vary depending on UE capability.

Considering the above points, the terminal may transmit UE capability information to the base station. For example, the terminal may establish an RRC connection with the base station. At this time, the terminal may exchange a message for RRC connection with the base station. For example, the terminal may transmit capability information of an encoding scheme using a neural network to the base station through any one of messages exchanged to establish an RRC connection. As another example, the terminal may perform RRC connection reestablishment with the base station. At this time, the terminal may exchange messages with the base station for RRC connection reestablishment. For example, the terminal may transmit capability information of an encoding method using a neural network to the base station through one of messages exchanged for RRC connection reestablishment.

Also, as an example, the terminal may report UE capability information to the base station in a different manner, and is not limited to the above-described embodiment.

As another example, the terminal may configure only a neural network based on any one of the above-described real neural network and complex neural network. At this time, as an example, the terminal may report information on the neural network scheme configured in the terminal to the base station as UE capability information. At this time, the base station may check the encoding method using the neural network of the input data based on the neural network configuration method of the terminal, and can transmit the data to the terminal based on this.

As another example, the terminal may be a terminal in which both the real neural network and the complex neural network are implemented. At this time, the terminal may exchange a message for RRC connection with the base station. For example, the terminal may transmit information on the neural network to the base station through any one of the messages exchanged to establish RRC connection. As another example, the terminal may perform RRC connection reestablishment with the base station. At this time, the terminal may exchange messages with the base station for RRC connection reestablishment. For example, the terminal may transmit information on the neural network to the base station through one of messages exchanged for RRC connection reestablishment. In this case, the base station may perform data transmission by performing encoding using a neural network in a manner selected based on information on the neural network. As another example, the base station may receive feedback information of data transmission based on the above-described scheme, change an encoding scheme using a neural network, and perform transmission, but is not limited to the above-described embodiment.

Figure 33:
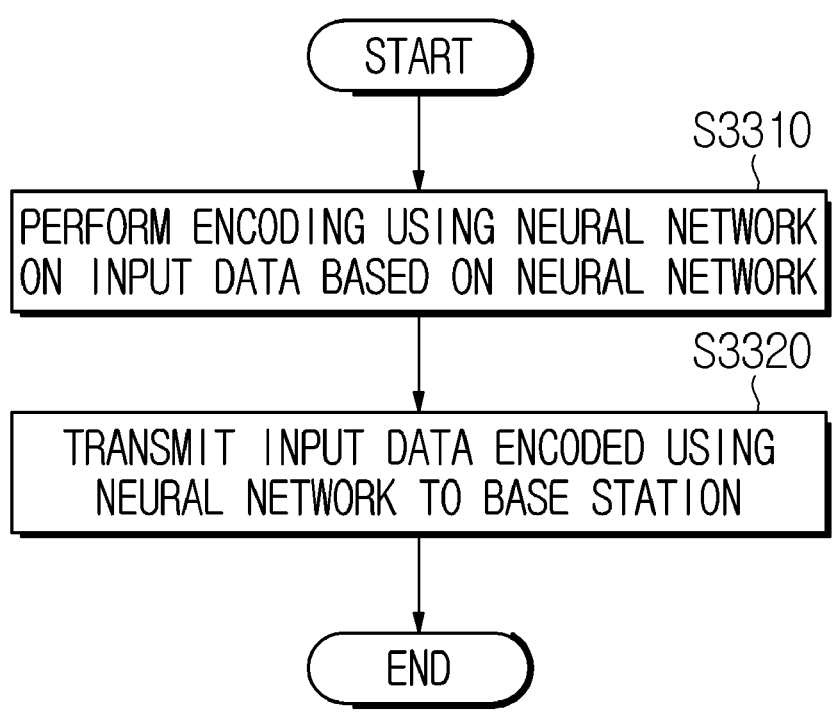
FIG. 33 is a diagram illustrating terminal operation applicable to the present disclosure.

FIG. 33 is a diagram illustrating terminal operation applicable to the present disclosure.

Referring to FIG. 33, terminal operation may be shown in a wireless communication system. As an example, FIG. 33 may show terminal operation, but may not be limited thereto. For example, the same may be applied to a base station and other devices, but for convenience of explanation, the terminal will be focused upon.

Referring to FIG. 33, the terminal may perform encoding using a neural network on input data based on the neural network (S3310). In addition, the terminal may transmit the input data encoded using the neural network to the base station. (S3320) At this time, as described above with reference to FIGS. 1 to 32, the terminal may perform encoding using the neural network on the input data based on the neural network. In this case, the neural network may include a neural encoder. Here, as described above, encoding using a neural network on the input data may be performed through a neural encoder. At this time, the terminal may determine an input value of the neural encoder. As described above, since an output value of the neural encoder may affect the neural network, there may be limitations in performing an operation such as higher order modulation. Accordingly, the terminal may determine an input value of the neural encoder and perform an operation such as higher order modulation based on the determined value. At this time, the terminal may perform grouping of the input data based on input bits of the input data. After that, the terminal may map the grouped input bits to a plurality of input levels based on real values. The terminal may determine the plurality of mapped input levels as input values of the above-described neural encoder. In this case, among the plurality of input levels, input levels adjacent to each other may have a uniform spacing as a real value as described above. As another example, input levels adjacent to each other among a plurality of input levels may have a non-uniform spacing, but are not limited to the above-described embodiment.

As another example, the terminal may perform encoding based on a complex neural network. At this time, the complex neural network may be composed of two real neural networks. At this time, each real neural network may process the real part and the imaginary part of the input signal, respectively. That is, the terminal may perform encoding by grouping bits (n/2) of the real part of the input data, mapping them to a plurality of input levels, and using them as input values of the real neural network in the complex neural network. In addition, the terminal may perform encoding by grouping bits (n/2) of the imaginary part of input data, mapping them to a plurality of input levels, and using them as input values of a real neural network within a complex neural network. That is, the terminal may process the real part and the imaginary part of the input signal through the real neural network, as described above.

Also, as an example, the terminal may use a neural network having a complex value as an input value as a complex neural network, as described above.

As another example, when encoding of input data is performed based on a real value through a neural network, the terminal may map two symbols in the encoded input data into one complex symbol. Then, the terminal transmits one mapped complex symbol. The base station may perform decoding by dividing one received complex symbol into a real part and an imaginary part, and mapping it to each symbol. In this case, as an example, one of the two symbols may be mapped to the real part, and the other symbol of the two symbols may be mapped to the imaginary part, as described above.

Also, as an example, in the above case, odd-numbered symbols of the encoded input data may be mapped to the real part, and even-numbered symbols of the encoded input data may be mapped to the imaginary part. Through this, the terminal may map data derived based on the real value to a complex plane and transmit it, and frequency efficiency can be increased. Also, as an example, a neural encoder is composed of a plurality of filter layers, and the plurality of filter layers may be divided into a plurality of groups. In this case, input values of the neural encoder may be uniformly divided into a plurality of groups and input, as described above.

Figure 34:
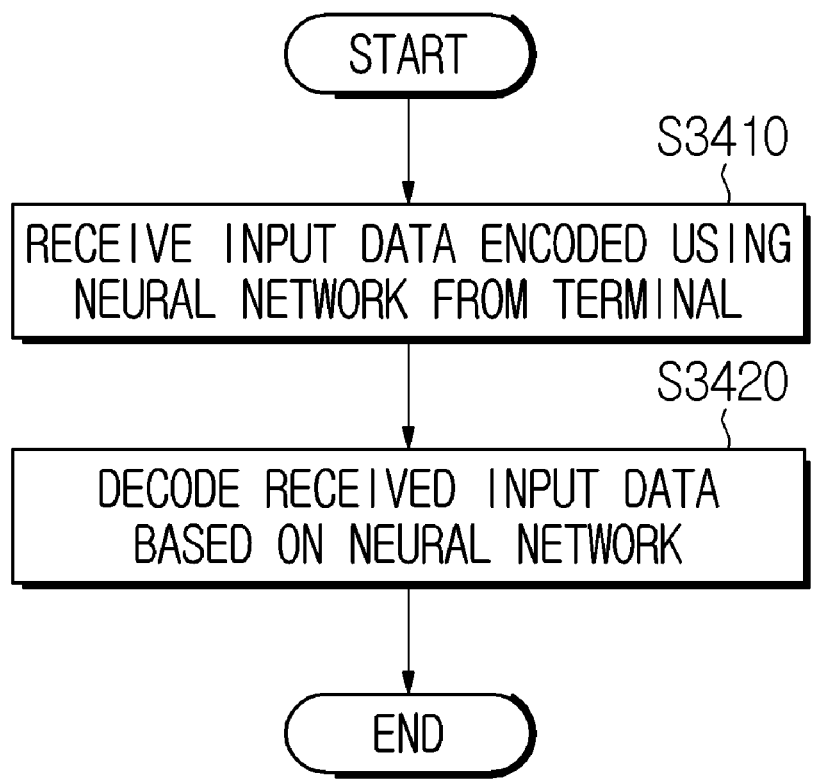
FIG. 34 is a diagram illustrating base station operation applicable to the present disclosure.

FIG. 34 is a diagram illustrating base station operation applicable to the present disclosure.

Referring to FIG. 34, base station operation may be shown in a wireless communication system. As an example, FIG. 34 may show base station operation, but may not be limited thereto. For example, the same may be applied to a terminal and other devices, but for convenience of description, the base station will be focused upon.

For example, the base station may receive input data encoded using a neural network from the terminal (S3410). At this time, the base station may decode the received input data based on the neural network (S3420). At this time, as described above with reference to FIGS. 1 to 32, the base station may decode the input data received from the terminal through the neural decoder. At this time, for example, when the n value for grouping input bits of the neural encoder changes, it may not be easy to perform combining for retransmission at the input terminal of the neural decoder. Considering the above, the neural decoder may extract an LLR value for each bit through output of the soft max activation function and perform combining on the retransmitted data based on this, as described above.

Examples of the above-described proposed methods may be included as one of the implementation methods of the present disclosure and thus may be regarded as kinds of proposed methods. In addition, the above-described proposed methods may be independently implemented or some of the proposed methods may be combined (or merged). The rule may be defined such that the base station informs the UE of information on whether to apply the proposed methods (or information on the rules of the proposed methods) through a predefined signal (e.g., a physical layer signal or a higher layer signal).

Those skilled in the art will appreciate that the present disclosure may be carried out in other specific ways than those set forth herein without departing from the spirit and essential characteristics of the present disclosure. The above exemplary embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein. Moreover, it will be apparent that some claims referring to specific claims may be combined with another claims referring to the other claims other than the specific claims to constitute the embodiment or add new claims by means of amendment after the application is filed.

INDUSTRIAL AVAILABILITY

The embodiments of the present disclosure are applicable to various radio access systems. Examples of the various radio access systems include a $3^{rd}$ generation partnership project (3GPP) or 3GPP2 system.

The embodiments of the present disclosure are applicable not only to the various radio access systems but also to all technical fields, to which the various radio access systems are applied. Further, the proposed methods are applicable to mmWave and THzWave communication systems using ultrahigh frequency bands.

Additionally, the embodiments of the present disclosure are applicable to various applications such as autonomous vehicles, drones and the like.

The invention claimed is:

1. A method of operating a user equipment (UE) in a wireless communication system, the method comprising:
encoding input data based on a neural network; and
generating at least one codeword based on the encoded input data;
generating modulation symbols based on the at least one codeword; and
transmitting a signal including the modulation symbols to a base station,
wherein the neural network includes a real neural network and a complex neural network,
wherein the input data is grouped based on input bits, and is mapped to a plurality of input levels, and
wherein the mapped plurality of input levels is determined as an input value of a neural encoder in the real neural network.

2. The method of claim 1, wherein input levels adjacent to each other among the plurality of input levels have a uniform spacing.

3. The method of claim 1, wherein input levels adjacent to each other among the plurality of input levels have a non-uniform spacing.

4. The method of claim 1, wherein an input value of a neural encoder in the complex neural network is determined,
wherein the complex neural network comprises a first real neural network and a second real neural network.

5. The method of claim 4,
wherein the input data is divided into a real part and an imaginary part,
wherein the real part of the input data is grouped based on input bits of the real part and mapped to a plurality of input levels based on a real value,
wherein the plurality of mapped input levels is determined as an input value of a neural encoder of the first real neural network,
wherein the imaginary part of the input data is grouped based on input bits of the imaginary part and mapped to a plurality of input levels based on a real value, and
wherein the plurality of mapped input levels is determined as an input value of a neural encoder of the second real neural network.

6. The method of claim 4,
wherein the input value of the neural encoder in the complex neural network is determined to be a complex value.

7. The method of claim 1,
wherein encoding of the input data is performed based on the real value through the neural network, wherein two symbols in the encoded input data are mapped to one complex symbol, wherein one of the two symbol is mapped to a real part, and wherein the other one of the two symbol is mapped to an imaginary part.

8. The method of claim 7, wherein an odd-numbered symbol of the encoded input data is mapped to the real part, and wherein an even-numbered symbol of the encoded input data is mapped to the imaginary part.

9. The method of claim 1, wherein the neural encoder is composed of a plurality of filter layers, wherein the plurality of filter layers is divided into a plurality of groups, and wherein an input value of the neural encoder is uniformly divided into the plurality of groups and input.

10. A user equipment (UE) operating in a wireless communication system, the UE comprising:

at least one transmitter;

at least one receiver;

at least one processor; and at least one memory operably connected to the at least one processor and configured to store instructions which, when executed, cause the at least one processor to perform a specific operation, wherein the specific operation comprises:

encoding input data based on a neural network;

generating at least one codeword based on the encoded input data;

generating modulation symbols based on the at least one codeword; and transmitting a signal including the modulation symbols to a base station, and wherein the neural network includes a real neural network and a complex neural network, wherein the input data is grouped based on input bits, and is mapped to a plurality of input levels, and wherein the mapped plurality of input levels is determined as an input value of a neural encoder in the real neural network.

11. The UE of claim 10, wherein the UE communicates with at least one of a mobile terminal, a network or an autonomous vehicle other than a vehicle including the UE.

12. A base station operating in a wireless communication system, the base station comprising:

at least one transmitter;

at least one receiver;

at least one processor; and at least one memory operably connected to the at least one processor and configured to store instructions which, when executed, cause the at least one processor to perform a specific operation, wherein the specific operation comprises:

receiving a signal including modulation symbols from a user equipment (UE); and decoding the signal based on a neural network, wherein the modulation symbols are generated based on the at least one codeword, and the at least one codeword is generated based on an encoded input data, and wherein the neural network includes a real neural network and a complex neural network, wherein the encoded input data is grouped based on input bits, and is mapped to a plurality of input levels, and wherein the mapped plurality of input levels is determined as an input value of a neural encoder in the real neural network.

* * * * *